(12) United States Patent
Tabuchi et al.

(10) Patent No.: US 6,877,428 B2
(45) Date of Patent: Apr. 12, 2005

(54) REGENERATIVE PLATE MAKING AND PRINTING PROCESS, AND PLATE MAKING AND PRINTING APPARATUS

(75) Inventors: Mitsuru Tabuchi, Hiroshima-ken (JP); Masahiro Matsubara, Hiroshima-ken (JP); Hiroaki Ikeda, Hiroshima-ken (JP); Toshiyuki Urano, Kanagawa-ken (JP); Takuya Uematsu, Kanagawa-ken (JP); Yuji Mizuho, Kanagawa-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/323,852

(22) Filed: Dec. 20, 2002

(65) Prior Publication Data
US 2003/0172828 A1 Sep. 18, 2003

Related U.S. Application Data

(63) Continuation of application No. PCT/JP02/04144, filed on Apr. 25, 2002.

(30) Foreign Application Priority Data

Apr. 26, 2001 (JP) ........................................ 2001-129968
May 11, 2001 (JP) ........................................ 2001-141342
Jun. 6, 2001 (JP) ........................................ 2001-170705
Jun. 21, 2001 (JP) ........................................ 2001-187564

(51) Int. Cl.[7] .............................. B41C 1/10; G03F 7/30
(52) U.S. Cl. ........................ 101/467; 101/478; 430/309
(58) Field of Search ............................... 101/456, 457, 101/459, 463.1, 465, 466, 467, 478, 395, 401.1; 430/302, 309, 310

(56) References Cited

U.S. PATENT DOCUMENTS

| 4,428,659 A | * | 1/1984 | Howard ...................... 396/611 |
| 5,713,287 A | | 2/1998 | Gelbart |
| 5,816,161 A | | 10/1998 | Nussel et al. |

(Continued)

FOREIGN PATENT DOCUMENTS

| EP | 0 802 457 A1 | 10/1997 |
| JP | 60-122948 | 7/1985 |
| JP | 61-061165 | 3/1986 |

(Continued)

OTHER PUBLICATIONS

U.S. Provisional Appl. 60/252,550.*
U.S. Provisional Appl. 60/252,540.*

*Primary Examiner*—Stephen R. Funk
(74) *Attorney, Agent, or Firm*—Nixon & Vanderhye P.C.

(57) ABSTRACT

The regenerative plate making and printing process, and plate making and printing apparatus of the present invention are applied to a printing system requiring a separate developing step independent of a printing step. In accordance with the present invention, by repeatedly conducting (A) a photosensitive layer-coating step of coating a photosensitive plate material onto a substrate to prepare a photosensitive lithographic plate having a photosensitive layer thereon; (B) an exposure step of exposing the photosensitive layer to image light; (C) a development step of supplying a plate-treating agent to the photosensitive layer to form developed images thereon; (D) a printing step of supplying a printing ink and dampening water to surfaces of the thus obtained images to conduct printing; and (E) a substrate regeneration step of removing the image portions from the substrate to regenerate the substrate, on the same rotary drum or conveyer, it is possible to considerably improve the working efficiency and stably provide high-quality images.

16 Claims, 2 Drawing Sheets

U.S. PATENT DOCUMENTS

| | | | | |
|---|---|---|---|---|
| 6,024,020 A | * | 2/2000 | Romano et al. | 101/484 |
| 6,110,646 A | * | 8/2000 | Urano et al. | 430/302 |
| 6,153,356 A | * | 11/2000 | Urano et al. | 430/281.1 |
| 6,387,595 B1 | * | 5/2002 | Teng | 430/302 |
| 6,427,596 B1 | * | 8/2002 | Bhambra et al. | 101/465 |
| 2002/0056390 A1 | * | 5/2002 | Verschueren et al. | 101/463.1 |
| 2002/0056391 A1 | * | 5/2002 | Verschueren et al. | 101/463.1 |
| 2002/0196473 A1 | * | 12/2002 | Patten et al. | 358/3.29 |

FOREIGN PATENT DOCUMENTS

| | | |
|---|---|---|
| JP | 62-017749 | 1/1987 |
| JP | 01-283931 | 11/1989 |
| JP | 11-216835 | 8/1999 |
| JP | 2000-039711 | 2/2000 |
| JP | 2000-292939 | 10/2000 |
| JP | 2001-253038 | 9/2001 |
| JP | 2002-192848 | 7/2002 |

* cited by examiner

REGENERATIVE PLATE MAKING AND PRINTING PROCESS, AND PLATE MAKING AND PRINTING APPARATUS

CROSS REFERENCE TO RELATED APPLICATION

This application is a continuation of PCT/JP02/04144 filed Apr. 25, 2002 which claims the priority of each of the following: Japanese 2001-129968 filed 26 Apr. 2001; Japanese 2001-141342 filed 11 May 2001; Japanese 2001-170705 filed 6 Jun. 2001; and Japanese 2001-187564 filed 21 Jun. 2001.

TECHNICAL FIELD

The present invention relates to a regenerative plate making and printing process, and a plate making and printing apparatus. More particularly, the present invention relates to a regenerative plate making and printing process, and a plate making and printing apparatus which is considerably improved in working efficiency and provides stable high-quality printed images while suppressing the generation of stains upon printing.

BACKGROUND ART

Hitherto, there are known plate making processes using lithographic printing machines, namely on-printing machine plate making processes. For example, in Japanese Patent Application Laid-Open (KOKAI) No. 11-216835(1999) as filed by the present applicant, there is described an improved on-printing machine plate making process. In this on-printing machine plate making process, a photosensitive lithographic printing plate is produced using a lithographic printing machine having a printing section including a plate cylinder, a blanket cylinder and an impression cylinder, by (A) supplying a plate-treating agent to a photosensitive lithographic printing plate fixed on the plate cylinder and exposed to image light, from a plate-treating agent feeding roller disposed in contact with the photosensitive lithographic printing plate; and then (B) rotating the plate cylinder and the blanket cylinder while keeping both the cylinders in contact with each other, so as to apply physical stimulus to the photosensitive lithographic printing plate, thereby forming images thereon.

The above process is characterized in that the step (B) is conducted after causing the blanket cylinder and the impression cylinder to be spaced apart from each other, and further stopping delivery of papers to the impression cylinder. In such a process, after the printing plate is produced by fixing the photosensitive lithographic printing plate exposed to image light, on the plate cylinder, printing procedure is successively conducted using the thus produced printing plate. This process is intended to reduce loss of papers and to prevent dirt or dusts from mixing in the plate-treating agent (printing ink, dampening water, etc.).

However, in Japanese Patent Application Laid-Open (KOKAI) No. 11-216835(1999), there is described only the developing method using dampening water on the printing machine. Also, Japanese Patent Application Laid-Open (KOKAI) No. 11-216835(1999) neither describes nor suggests at all the regeneration of the printing plate after printing.

In Japanese Patent No. 3122717 (equivalent to EP802457A1), there is described the process in which a hydrophilic emulsion capable of being converted into hydrophobic one upon irradiating light thereto, is used as a photosensitive composition, and the photosensitive composition is subjected to light exposure and image development on a printing machine by a melting method. However, the thus produced printing plate must be further improved in wear resistance upon printing. In Japanese Patent No. 3122717, there is described only the developing method using dampening water on a printing machine. Also, although it is described that the printing plate may be regenerated after printing, the Japanese Patent No. 3122717 does not describe at all a concrete method for regeneration of the printing plate.

In Japanese Patent Application Laid-Open (KOKAI) No. 9-99535(1997) (equivalent to U.S. Pat. No. 5,713,287), there is described the on-printing machine image forming method using as a photosensitive composition, a switching polymer whose hydrophilic property is changeable to a hydrophobic property by irradiating a laser thereto. However, the printing plate obtained by this method must be further improved in wear resistance upon printing. Also, in the above method, no development step is provided independent of the printing step. Further, in Japanese Patent Application Laid-Open (KOKAI) No. 8-52949(1997) (equivalent to U.S. Pat. No. 5,816,161 and EP 693371A1), there is described the method of repeatedly erasing and reproducing images on a printing plate within a printing machine without removal of a plate cylinder or the printing plate. However, Japanese Patent Application Laid-Open (KOKAI) No. 8-52949(1997) fails to specify the developing and printing methods at all.

An object of the present invention is to provide a regenerative plate making and printing process as well as a plate making and printing apparatus by further improving the conventional on-printing machine plate making methods, which are considerably improved in working efficiency, and are capable of suppressing the generation of the stains upon printing, thereby producing stable high-quality images.

DISCLOSURE OF THE INVENTION

As a result of the present inventors' earnest studies for solving the above-mentioned problems, it has been found that in the printing system including as an essential step, a separate developing step independent of a printing step, the above problems can be overcome by using the process based on such a novel concept that respective exposure, development, printing and regeneration steps are repeatedly conducted on a rotary drum or conveyer. The present invention has been attained on the basis of the above finding.

That is, in a first aspect of the present invention, there is provided a regenerative plate making and printing process comprising:

(A) a photosensitive layer-coating step of coating a photosensitive plate material fed from a photosensitive plate material-feeding mechanism onto a substrate to prepare a photosensitive lithographic plate having a photosensitive layer thereon;

(B) an exposure step of exposing the photosensitive layer of the photosensitive lithographic plate to image light by an exposure mechanism;

(C) a development step of supplying a plate-treating agent to the image-exposed photosensitive layer from a plate-treating agent-feeding mechanism to form images thereon;

(D) a printing step of supplying a printing ink and dampening water to surfaces of the images obtained in the step (C), from an inking device and a dampening device, respectively, to conduct printing; and (E) a substrate regeneration step of removing the image portions from the substrate by a plate material-removing mechanism to regenerate the substrate, the development step (C) being conducted independent of the printing step (D), and the steps (A) to (E) being repeated on the same rotary drum or conveyer.

In a second aspect of the present invention, there is provided a regenerative on-printing machine plate making and printing apparatus comprising:

a lithographic printing machine including a plate cylinder, a blanket cylinder, an impression cylinder, an inking device and a dampening device;

a substrate-fixing means for fixing a substrate on the plate cylinder;

a plate material-feeding mechanism for supplying a photosensitive plate material onto the substrate;

an exposure mechanism for exposing a photosensitive lithographic plate thus formed by supplying and coating the photosensitive plate material onto the substrate, to image light;

a plate material-removing mechanism comprising a plate material-dissolving solution-feeding mechanism, and optionally a plate material-stripping roller, a wash water-feeding mechanism, a waste solution suction mechanism and an air-drying mechanism;

a casing having a slidable and openable front for accommodating all of the components therein; and a dust filter disposed on a ceiling portion of the casing, the plate cylinder, the blanket cylinder and the impression cylinder being adjustably disposed to be spaced apart from each other, delivery of papers to the impression cylinder being controllably stopped, and the inking device and the dampening device being adjustably disposed to be spaced apart from the plate cylinder.

BEST MODE FOR CARRYING OUT THE INVENTION

Figure 1:
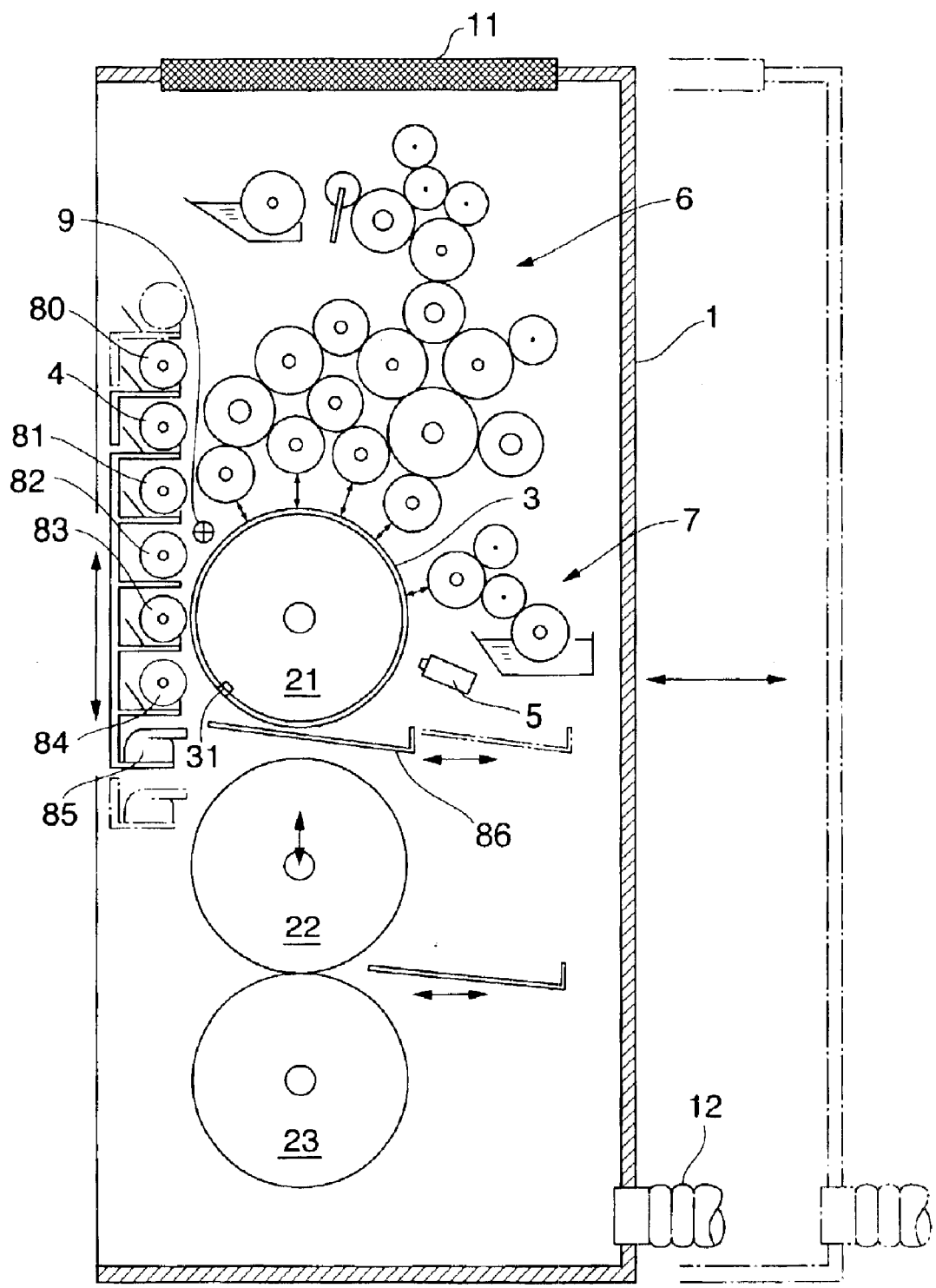
FIG. 1 is a conceptual view showing an embodiment of an apparatus for carrying out the regenerative on-printing machine plate making and printing process of the present invention.

The preferred embodiments of the present invention are described in detail below by referring to the accompanying drawings. In the figures, reference numeral (1) denotes a casing; (11) is a dust filter; (12) is an exhaust duct; (21) is a plate cylinder; (22) is a blanket cylinder; (23) is an impression cylinder; (3) is a substrate (lithographic plate); (31) is a substrate-fixing means; (4) is a plate material-feeding mechanism; (5) is an exposure mechanism; (6) is an inking device; (7) is a dampening device; (9) is a light-heating type drying mechanism; (80) is a plate-treating agent-feeding mechanism; (81) is a plate material-dissolving solution-feeding mechanism; (82) is a plate material-stripping roller; (83) is a wash water-feeding mechanism; (84) is a waste solution suction mechanism; (85) is an air-drying mechanism; and (86) is an anti-staining tray.

In the process according to the first aspect of the present invention, the respective exposure, development, printing and regeneration steps are conducted on a rotary drum or conveyer in sequential and independent manners. That is, the present invention is characterized in that the development step is conducted independent of the printing step.

More specifically, the following steps (A) to (E) are sequentially repeated on the rotary drum or conveyer:

(A) a photosensitive layer-coating step of coating a photosensitive plate material fed from a plate material-feeding mechanism onto a substrate to prepare a photosensitive lithographic plate having a photosensitive layer thereon;

(B) an exposure step of exposing the photosensitive layer of the photosensitive lithographic plate to image light by an exposure mechanism;

(C) a development step of supplying a plate-treating agent to the image-exposed photosensitive layer from a plate-treating agent-feeding mechanism to form images thereon;

(D) a printing step of supplying a printing ink and dampening water to surfaces of the images obtained in the step (C), from an inking device and a dampening device, respectively, to conduct printing; and (E) a substrate regeneration step of removing the image portions from the substrate by a plate material-removing mechanism to regenerate the substrate.

By adopting the above plate making and printing process, the substrate for the lithographic plate is repeatedly usable many times. Therefore, it is possible to not only considerably reduce printing costs, but also considerably improve the working efficiency and suppress the generation of the stains upon printing, thereby stably producing high-quality images.

The process and apparatus of the present invention are not particularly restricted as long as the above steps (A) to (E) are sequentially repeated. Among them, the steps (A) to (E) are preferably conducted on the plate cylinder (on-printing machine) from the standpoint of compactness of the apparatus used.

FIG. 1 shows an apparatus for carrying out the regenerative on-printing machine plate making and printing process of the present invention. As the apparatus shown in FIG. 1, there may be used modified conventional lithographic printing machines including a plate cylinder (21), a blanket cylinder (22), an impression cylinder (23), an inking device (6) and a dampening device (7).

That is, the apparatus shown in FIG. 1 has the same structure as conventional lithographic printing machines except that the apparatus comprises a substrate-fixing means (31) for fixing a substrate (3) on the plate cylinder (21); a plate material-feeding mechanism (4) for supplying a photosensitive plate material onto the substrate (3); a plate material-removing mechanism comprising a light-heating type drying mechanism (9), a plate-treating agent-feeding mechanism (80), a plate material-dissolving solution-feeding mechanism (81), and optionally a plate material-stripping roller (82), a wash water-feeding mechanism (83), a waste solution suction mechanism (84) and an air-drying mechanism (85); a casing (1) having a slidable and openable front for accommodating all of these components therein; and auxiliary equipment such as a dust filter (11) disposed on a ceiling portion of the casing (1), wherein the plate cylinder (21), the blanket cylinder (22) and the impression cylinder (23) are adjustably disposed to be spaced apart from each other; delivery of papers to the impression cylinder (23) is controllably stopped; and the inking device (6) and the dampening device (7) are adjustably disposed to be spaced apart from the plate cylinder (21). In one preferred embodiment of the apparatus according to the present invention as shown in FIG. 1, the casing (1) is provided at a ceiling portion thereof with the dust filter (11).

The substrate-fixing means (31) has, for example, such a structure that the opposite ends of the substrate (3) are inserted into grooves formed on the plate cylinder (21) to wedge the substrate. The plate material-feeding mechanism (4), the plate-treating agent-feeding mechanism (80), the plate material-dissolving solution-feeding mechanism (81) and the wash water-feeding mechanism (83) are each constituted by a liquid-receiving bucket and a roller partially incorporated in the liquid-receiving bucket. The waste solution suction mechanism (84) is constituted by a liquid-receiving bucket and a suction roller (having substantially the same length as that of the substrate (3)) partially incorporated in the liquid-receiving bucket. The air-drying mechanism (85) is constituted by a blowing fan or an infrared lamp. The plate material-feeding mechanism (4), the plate-treating agent-feeding mechanism (80), the plate material-dissolving solution-feeding mechanism (81) and the wash water-feeding in addition to the above roller mechanisms. Also, the plate material-stripping roller (82) is constituted by rollers having, for example, a suitable adhesive surface.

The plate material-feeding mechanism (4), the plate-treating agent-feeding mechanism (80), the plate material-dissolving solution-feeding mechanism (81), the plate material-stripping mechanism (82), the wash water-feeding mechanism (83), the waste solution suction mechanism (84) and the air-drying mechanism (85) are disposed, for example, on a rack-shaped stand opposed to the plate cylinder (21), and are vertically movable by a suitable rack and pinion gear mechanism. This arrangement allows the mechanisms required for the respective plate making step, printing step and regeneration step to be disposed near the plate cylinder at each time.

The exposure mechanism (5) is constituted by an optical equipment capable of irradiating light having a wavelength suited to the reaction of a composition constituting the photosensitive plate material on the basis of the image digital data. Meanwhile, an anti-staining tray (86) is slidably disposed between the plate cylinder (21) and the blanket cylinder (22). Alternatively, the anti-staining tray (86) may be disposed between the blanket cylinder (22) and the impression cylinder (23). The sliding mechanism of the anti-staining tray (86) may be constituted, for example, by a suitable rack and pinion gear mechanism.

The sliding motion of the openable front of the casing (1) is readily conducted, for example, by guide rails (not shown) disposed on a floor. As the dust filter disposed on the ceiling portion of the casing (1), there may be used commercially available products. In FIG. 1, reference numeral (12) denotes an exhaust duct provided, if required, at the bottom portion of the casing (1).

The plate cylinder (21), the blanket cylinder (22) and the impression cylinder (23) are movable so as to be spaced apart from each other, for example, by a suitable mechanical means such as eccentric bushings fitted in the blanket cylinder (22) and the impression cylinder (23). Also, an inking roller of the inking device (6) and a dampening roller of the dampening device (7) are movable so as to be spaced apart from the plate cylinder (21) by a suitable mechanical means such as the cam provided on the plate cylinder (21) and links provided on the respective rollers.

The above described means and mechanisms for modification of lithographic printing machines will be readily constituted by one having an ordinary skill in the art, from known and customary techniques by referring to the teachings of the present invention.

In the process of the present invention, after keeping the plate cylinder (21), the blanket cylinder (22) and the impression cylinder (23) apart from each other, and stopping delivery of papers to the impression cylinder, at the step (A), a photosensitive plate material composed of a photosensitive composition is supplied from the plate material-feeding mechanism (4) and coated onto the substrate (3) fixed on the plate cylinder (21) to prepare a photosensitive lithographic plate; then, at the step (B), the thus prepared photosensitive lithographic plate is exposed to image light by the exposure mechanism (5); at the step (C), a plate-treating agent is fed onto the thus image-exposed photosensitive lithographic plate from the plate-treating agent-feeding mechanism, followed by optionally applying physical stimulus thereto, to form images thereon; then, at the step (D), a printing ink and dampening water are supplied onto surfaces of the images formed on the photosensitive lithographic plate, from the inking device (6) and the dampening device (7), respectively, and the plate cylinder (21), the blanket cylinder (22) and the impression cylinder (23) are rotated while being kept in contact with each other and supplying a printing paper between the blanket cylinder (22) and the impression cylinder (23) to conduct printing; and successively, after keeping the respective cylinders apart from each other and stopping delivery of papers to the impression cylinder (23) again, at the step (E), image portions formed on the substrate (3) are removed by the plate material-removing mechanism, thereby regenerating the substrate (3).

In the followings, the respective plate making, printing and regeneration steps that are repeatedly conducted using the lithographic printing machine having a printing section including the plate cylinder (21), the blanket cylinder (22) and the impression cylinder (23) are illustratively described.

<Plate Making Steps (A) to (C)>

As the substrate (3), there may be used, for example, grain-treated aluminum plates. The photosensitive plate material composition is not particularly restricted, and any compositions conventionally known as photosensitive plate materials may be used without particular limitations. Among them, the following photopolymerizable compositions proposed by the present inventors are preferred:

(1) Photopolymerizable compositions containing an urethane-based compound as an ethylenic monomer having 4 or more urethane bonds and 4 or more addition-polymerizable double bonds in one molecule, and a photopolymerization initiator;

(2) photopolymerizable compositions for near-infrared laser exposure, containing (a) an ethylenic compound, (b) cyanine-based sensitizing dye cation and/or phthalocyanine-based sensitizing dye having heterocyclic rings bonded to each other through a polymethine chain, and (c) organoboron anion and/or halomethyl-containing compound; and (3) photopolymerizable compositions for blue violet laser exposure, containing an ethylenically unsaturated compound, and a hexaarylbiimidazole-based compound or a titanocene compound, and a dialkylaminobenzene-based compound as a photopolymerization initiator.

First, after keeping the plate cylinder (21), the blanket cylinder (22) and the impression cylinder (23) spaced apart from each other and stopping delivery of papers to the impression cylinder (23), at the step (A), the photosensitive plate material composed of a photosensitive composition is supplied from the plate material-feeding mechanism (4) and applied onto the substrate (3) fixed on the plate cylinder (21) to prepare a photosensitive lithographic plate (photosensitive layer-coating step).

In the present invention, when the photosensitive layer is formed on the substrate (3) to prepare a photosensitive image-forming material, the obtained photosensitive image-forming material is preferably heat-dried by irradiating a near-infrared light having a specific wavelength using the light-heating type drying mechanism (9) or the like.

As a preferred light source for the light-heating type drying mechanism (9), there may be used various types of light sources having an emission wavelength of 700 to 1,300 nm, and a light intensity density of not more than 100 $Wcm^{-2}$, preferably not more than 50 $Wcm^{-2}$, more preferably not more than 10 $Wcm^{-2}$. The irradiating time is not less than 0.1 second, preferably not less than 1 second. Examples of the preferred light sources may include lamp light sources such as halogen lamp, xenon lamp, high-pressure mercury lamp, low-pressure mercury lamp, extra high-pressure mercury lamp and tungsten lamp, laser sources such as semiconductor laser and YAG laser, or the like. Of these light sources, the halogen lamps exhibiting an excellent near-infrared emission effect are preferred, and the halogen lamps having an emission peak at 1,200 nm are more preferred. Light emitted from these light sources may be passed, if required, through a filter to shield UV-visible regions of the emitted light.

The reason why the light sources having the above-specified emission wavelength and light intensity density are used as the light source of the light-heating type drying mechanism (9), is as follows. That is, the image-forming material (e.g., lithographic plate) tends to readily undergo deterioration of the photosensitive layer when the light intensity density is too high during the heat treatment thereof. When the light-irradiating time is too short, it may be difficult to obtain a sufficient heating effect. Further, in the case where light having a higher light intensity density is irradiated for a short period of time, the photosensitive layer exhibits an excessive image forming effect. As a result, the photosensitive layer of positive type tends to suffer from lack of photosensitive image portions, or the photosensitive layer of negative type tends to suffer from residual of non-image portions of the photosensitive layer.

By using the above heating method, only the photosensitive layer is heated, so that it is possible to prevent large temperature rise of the drum substrate for the image-forming material, and obtain the same heating effect as achieved by ordinary heating dryers.

The laser plate making process of the present invention may be suitably conducted on the above lithographic printing machine as a laser plate making apparatus which has a printing section including the plate cylinder (21), the blanket cylinder (22) and the impression cylinder (23), and in which the plate making, printing and regeneration steps are repeatedly conducted. The respective steps conducted on the above lithographic printing machine as well as the laser plate making process according to the present invention are explained below.

After preparing the above photosensitive lithographic plate, at the step (B), the thus prepared photosensitive lithographic plate is exposed to image light by the exposure mechanism (5) (exposure step). Then, at the step (C), a plate-treating agent is supplied onto the image-exposed photosensitive lithographic plate from the plate-treating agent-feeding mechanism, followed by, if required, applying physical stimulus thereto, to form images thereon (development step).

As the plate-treating agent used in the present invention, there may be used hydrophilizing agents (penetrating agents) capable of penetrating into non-exposed portions to lower the bonding strength between the substrate and the photosensitive layer at the non-exposed portions without a printing ink or dampening water as used in conventional processes. Examples of the plate-treating agents may include surfactants, organic solvents, alkali agents or the like.

In the present invention, in order to attain a constant reproducibility of developed images in the development step (C), it is preferred that the conditions of images formed on the photosensitive layer are detected to control the developing conditions on the basis of the detected data.

As the means for detecting the conditions of the images formed on the photosensitive layer, there may be suitably used non-contact detection means such as CCD cameras. The data detected in the development step (C) and used for controlling the developing conditions may include reflection absorbance values of image portions and non-image portions at a detection wavelength in the range of 400 to 1,300 nm.

More specifically, the data detected in the development step (C) and used for controlling the developing conditions are those satisfying such a condition that the value obtained by dividing a reflection absorbance A by a reflection absorbance B is not less than 0.5, preferably not less than 3, wherein A represents a reflection absorbance obtained by subtracting a reflection absorbance of the substrate from the reflection absorbance of the image portions; and B represents a reflection absorbance obtained by subtracting the reflection absorbance of the substrate from the reflection absorbance of the non-image portions. By using such data, it is possible to detect the image conditions formed on the photosensitive layer at a high accuracy. Incidentally, the upper limit of the value obtained by dividing the reflection absorbance A by the reflection absorbance B is not theoretically determined, but is practically not more than 100 in the consideration of a time lag between the actual detection and the control of the developing conditions.

Thus, in the development step (C), the conditions of the images formed on the photosensitive layer are detected, and the developing conditions are controlled on the basis of the detected data. In this case, the developing conditions to be controlled may include at least one selected from the group consisting of a temperature of a developing solution, a developing time, a feed amount of the developing solution, a frequency of feed of the developing solution, and a contact (rubbing) pressure, a contact density and a contact frequency of the image-forming material.

In accordance with the plate making process of the present invention, since the conditions of the images formed on the photosensitive layer of the image-forming material are detected, and the developing conditions are controlled on the basis of the detected data, it is possible to always attain a constant reproducibility of developed images in the development step (C) independent of the change in composition of the developing solution due to absorption of carbon dioxide gas in air.

The present invention is characterized in that the development step (C) is provided separately from the printing step, and in that the plate-treating agent-feeding mechanism is disposed.

<Printing step (D)>

After completion of the plate making step, at the step (D), the surfaces of the images formed on the photosensitive lithographic plate are supplied with a printing ink and dampening water from the inking device (6) and the dampening device (7), respectively. Then, the plate cylinder (21), the blanket cylinder (22) and the impression cylinder (23) are rotated in contact with each other, and at the same time a printing paper is delivered between the blanket cylinder (22) and the impression cylinder (23) to conduct printing thereon. Such procedures may be conducted according to the conventionally known methods.

<Regeneration step (E)>

After completion of the printing step, the respective cylinders are kept to be spaced apart from each other, and the delivery of papers to the impression cylinder (23) is stopped again. Thereafter, at the step (E), the image portions on the substrate (3) are removed by the plate material-removing mechanism to regenerate the substrate. In the apparatus shown in FIG. 1, the plate material-removing mechanism includes the plate material-dissolving solution-feeding mechanism (81), the plate material-stripping roller (82) which may be optionally provided, the wash water-feeding mechanism (83), the waste solution suction mechanism (84) and the air-drying mechanism (85).

First, after the anti-staining tray (86) is disposed between the blanket cylinder (22) and the impression cylinder (23), the plate material-dissolving solution (for example, an aqueous alkali solution) is supplied to the surfaces of the images formed on the photosensitive lithographic plate fitted on the plate cylinder (21) from the plate material-dissolving solution-feeding mechanism (81) while rotating the plate cylinder (21). This procedure allows the images to be dissolved in the solution, thereby regenerating the substrate (3). If the images are not dissolved but swelled, the swelled images are removed by means of the plate material-stripping roller (82) by allowing the images to adhere thereto.

Then, a wash water is supplied onto the surface of the regenerated substrate (3) from the wash water-feeding mechanism (83). This procedure allows the plate making dissolving solution to be removed from the surface of the substrate (3). Successively, the residual solution still remaining on the substrate (3) is removed by the waste solution suction mechanism (84), and then the surface of the substrate (3) is dried by the air-drying mechanism (85).

In the present invention, after the regeneration step, the process is returned to the plate making steps (A) to (C), which are then repeated in the same manner. Accordingly, since the respective plate making, printing and regeneration steps are conducted on the printing machine, the working efficiency is considerably enhanced. Besides, in this case, since the plate making is effected on the substrate (3) fixed on the plate cylinder (21), a large modification of the plate cylinder (21) is not particularly needed, and the substrate (3) can be readily replaced with a new one at low costs, resulting in economical advantage.

In the present invention, by conducting the plate making and regeneration steps, and the printing step on the separate machines, the respective steps can be effectively conducted, and the printing machine is completely prevented from being stained with the liquids used in the plate making and regeneration steps. Further, since the plate making is effected on the substrate fixed on the plate fixing drum, the substrate can be readily replaced with a new one at low costs.

Figure 2:
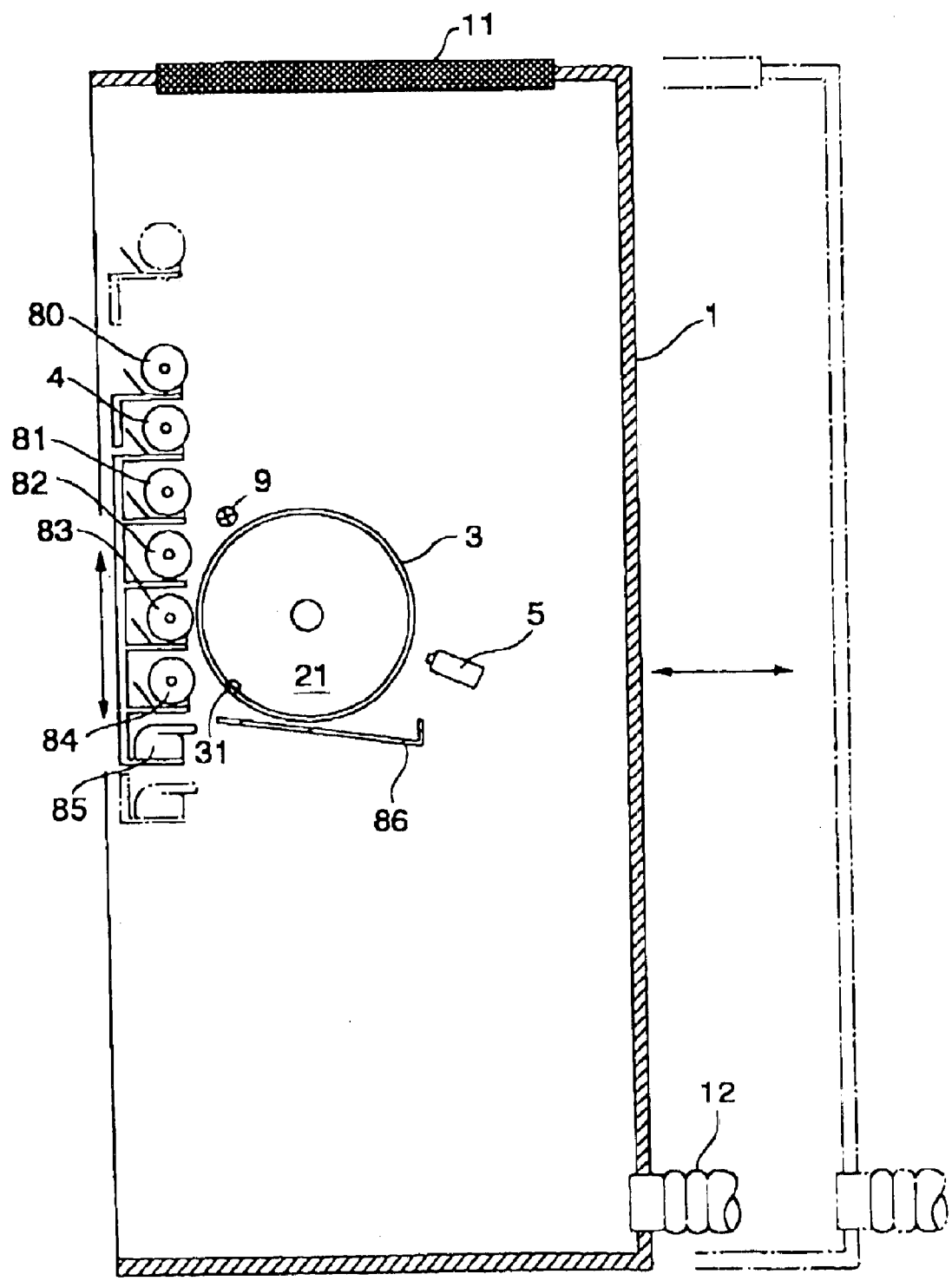
FIG. 2 is a conceptual view showing an embodiment of an apparatus for carrying out the regenerative plate making process of the present invention.

The process of the present invention can be conducted using the laser plate making and regeneration apparatus (I) as shown in FIG. 2, and the printing machine (II). As the printing machine (II), there may be used conventionally known lithographic printing machines having a printing section including a plate cylinder, a blanket cylinder and an impression cylinder. In the laser plate making and regeneration apparatus (I), the plate making and regeneration steps are repeatedly conducted, whereas in the printing machine (II), the printing step is repeatedly conducted.

More specifically, the lithographic plate prepared in the plate making and regeneration apparatus (I) is removed from the plate fixing drum (21), fitted to the printing machine (II) (not shown), and then used for printing according to the above procedure. Then, the lithographic plate used for printing is removed from the printing machine (II), and fixed on the plate fixing drum (21), and then the image portions on the lithographic plate are removed by the plate material-removing mechanism to regenerate the substrate. After the regeneration step, the process is returned to the plate making steps (A to C), which are then repeated in the same manner as above.

In the preferred embodiment of the present invention, the respective steps are conducted under such a condition that the whole part of the plate making apparatus is accommodated within the casing (1) by sliding. In this embodiment of the present invention, the casing (1) is operated as follows. That is, the apparatus (lithographic printing machine) as shown in FIG. 1 is disposed within a printing chamber of the casing. In the present invention, as the photosensitive plate material, there may be used various photosensitive compositions as described above. The casing (1) has the effect of shielding an illuminating light that adversely affects photosensitive compositions or the like used therein.

Also, the dust filter (11) disposed at a ceiling portion of the casing (1) is operated as follows. That is, the above printing chamber can be usually ventilated by providing an air intake port near the ceiling thereof and an exhaust port near the floor. This arrangement allows ventilating air flow to pass through the dust filter (11) toward the opened front of the casing (1), so that mists generated in the respective plate making, printing and regenerating steps are efficiently removed therefrom. The removal of the mists can be conducted more efficiently by fitting an exhaust duct (12) to the above exhaust port.

Next, the photosensitive lithographic plate used in the present invention is explained in detail below.

As the substrate of the lithographic plate used in the process for production of positive-type or negative-type lithographic plate of the present invention, there may be used a regenerated aluminum substrate. The regenerated aluminum substrate is produced by forming a photosensitive layer composed of a positive-type or negative-type photosensitive composition on the surface of the aluminum substrate to prepare a photosensitive lithographic plate; subjecting the photosensitive layer to light exposure and development treatment to form images thereon; detachably fixing the photosensitive lithographic plate on the plate cylinder of the printing machine to print on a printing material with ink; and then removing the images formed on the surface of the aluminum substrate while keeping the printing plate fixed on the plate cylinder.

Examples of the aluminum plate may include those plates composed of aluminum, or aluminum alloys containing in addition to aluminum, silicon, copper, manganese, magnesium, chromium, zinc, lead, bismuth, nickel or the like. The aluminum plate used as the substrate in the present invention has a thickness of usually about 0.01 to 10 mm, preferably about 0.05 to 1 mm, and is usually subjected to defatting treatment, surface roughening treatment (graining treatment), death mat treatment, anodization treatment, sealing treatment, undercoating treatment or the like.

The defatting treatment may be conducted by ordinary methods such as a wiping, dipping or steam-washing method using a solvent; a method of dipping or spraying with an aqueous alkali solution and then neutralizing with an aqueous acid solution; and a dipping or spraying method using a surfactant.

The surface roughening treatment (graining treatment) may be conducted by ordinary methods including mechanical treatments such as ball polishing, brush polishing, blast polishing, honing polishing and buff polishing as well as electrolytic etching, chemical etching or the like. Of these methods, it is preferred to conduct the electrolytic etching treatment in an electrolyte solution such as hydrochloric acid and nitric acid using alternating or direct current. Further, it is more preferred to conduct, the electrolytic etching treatment at an acid concentration of 0.5 to 5% by weight, an applied voltage of 1 to 50 V, a current density of 10 to 200 A/dM$^2$ and a temperature of 10 to 50° C. In the present invention, the surface of the aluminum plate obtained after the surface roughening treatment is essentially required to exhibit an average roughness Ra of 0.3 to 1.0 μm, preferably 0.4 to 0.8 μm when measured according to JIS B0601. If the average roughness Ra is out of the above-specified range, when the image removal and regeneration of lithographic plate are conducted while keeping the lithographic plate fixed on the plate cylinder of the printing machine, the removal of images from the surface of the substrate tends to become insufficient, or the photosensitive layer formed on the regenerated substrate tends to be deteriorated in developing property. As a result, it may be difficult to stably form images on the substrate again, and there may arise problems such as deteriorated wear resistance upon printing.

The death mat-treatment may be conducted by ordinary methods such as dipping and spraying methods using an aqueous solution of acid such as sulfuric acid, nitric acid, hydrochloric acid, hydrofluoric acid, phosphoric acid and chromic acid, or alkali such as sodium hydroxide, potassium hydroxide, sodium metasilicate, sodium phosphate, sodium pyrophosphate, potassium phosphate and sodium aluminate according to the requirements.

The anodization treatment may be conducted by ordinary methods using an aqueous solution of sulfuric acid, oxalic acid, phosphoric acid, chromic acid, malonic acid or the like as an electrolyte solution, and the aluminum pate as an anode. Of these methods, preferred are anodization treatments using an aqueous solution of sulfuric acid and/or phosphoric acid as the electrolyte solution. More preferably, the anodization treatment may be conducted at an acid concentration of 10 to 50% by weight, an applied voltage of 1 to 150 V, a current density of 1 to 60 A/dm$^2$ and a temperature of 5 to 50° C. for an electrolysis time of 5 to 60 seconds. The amount of the oxide film formed by the anodization treatment is usually 1 to 100 mg/dm$^2$, preferably 10 to 50 mg/dm$^2$.

The sealing treatment may be conducted by ordinary methods such as dipping or spraying method using boiling water, steam, an aqueous sodium silicate solution, an aqueous dichromate solution or the like according to the requirements. Also, the undercoating treatment may be conducted by ordinary methods such as a dipping or spraying method using aqueous solutions of cationic quaternary ammonium salt-containing resins, water-soluble polymers such as polyvinylphosphonic acid, starch and cellulose, metal salts such as zirconates and titanates, or the like.

As the aluminum substrate for the negative-type lithographic plate, there may be suitably used those aluminum plates whose surface is coated with a thin film layer composed of the water-soluble polymer by the above undercoating treatment. Specific examples of the water-soluble polymers may include homopolymers or copolymers of hydrophilic monomers having a hydrophilic group such as hydroxyl group, carboxyl group or salts thereof, sulfonic acid group or salts thereof, phosphoric acid group or salts thereof, amido group, amino group and ether group, for example, (meth)acrylic acid ("(meth)acrylic" means "acrylic and/or methacrylic"; this definition is similarly applicable to the following descriptions) or derivatives thereof such as alkali salts and amine salts, itaconic acid or derivatives thereof such as alkali salts and amine salts, 3-vinylpropionic acid or derivatives thereof such as alkali salts and amine salts, vinylsulfonic acid or derivatives thereof such as alkali salts and amine salts, 2-hydroxyethyl (meth)acrylate, 2-sulfoethyl (meth)acrylate, polyoxyethylene glycol mono(meth)acrylate, acid phosphoxy polyoxyethylene glycol mono(meth)acrylate, (meth)acrylamide, N-methylol (meth)acrylamide, N,N-dimethylol (meth) acrylamide, 2-acrylamido-2-methylpropanesulfonic acid, allylamine or halogenated hydroxides thereof, vinyl alcohol or the like.

The above thin film layer composed of the water-soluble polymer may be formed by coating or spraying an aqueous solution of the above water-soluble polymer onto the surface of the surface-treated aluminum substrate, or dipping the aluminum substrate in the aqueous solution, followed by drying. The thin film layer has a thickness of usually not more than 10 μm.

The aluminum substrate used for production of the negative-type photosensitive lithographic plate in the present invention preferably has such a property that a gummed tape adhered onto the surface of the aluminum substrate has a peel strength of not more than 500 g/cm. Here, the peel strength of the gummed tape from the aluminum substrate is measured by the following 180° peel test. That is, after adhering a gummed tape ("SLION TAPE3" produced by SILIONTEC CO., LTD.) onto the surface of the substrate at 25° C., 5 kg/cm$^2$ and 50 cm/min, the substrate adhered with the gummed tape is fixed onto a table, and the gummed tape adhered thereto is peeled off in the 180° direction at a pulling speed of 30 cm/min. The peel strength is expressed by a linear tension (g/cm) obtained by dividing a maximum stress measured in the above peel test by a width of the gummed tape. In the present invention, the peel strength is preferably not more than 500 g/cm. Also, the peel strength is preferably not less than 1 g/cm, more preferably not less than 10 g/cm. When the peel strength of the gummed tape from the surface of the aluminum substrate is more than the above-specified range, it tends to be difficult to remove the negative images in the below-mentioned regeneration step of the aluminum substrate. On the other hand, when the peel strength is less than the above-specified range, the obtained negative-type lithographic plate tends to be deteriorated in wear resistance upon printing.

In the present invention, the photosensitive layer formed on the surface of the above aluminum substrate may be constituted from any of positive-type photosensitive compositions and negative-type photosensitive compositions.

First, the positive-type photosensitive composition constituting the photosensitive layer is explained.

Among the positive-type photosensitive compositions used in the present invention, preferred are those containing the following components (P-1) and (P-2).

(P-1): alkali-soluble resin;
(P-2): light-heat converting material capable of converting light absorbed from a light source for image exposure into heat.

As the alkali-soluble resin as the component (P-1) constituting the positive-type photosensitive composition, there may be used resins having phenolic hydroxyl group. Specific examples of the resins having phenolic hydroxyl group may include phenol resins such as novolak resins and resole resins, polyvinyl phenol resins, copolymers of acrylic acid derivatives having phenolic hydroxyl group, or the like. Of these resins, preferred are phenol resins such as novolak resins and resole resins as well as polyvinyl phenol resins, and more preferred are phenol resins, and still more preferred are novolak resins.

The novolak resins are those resins produced by polycondensing at least one of phenols such as, for example, phenol, o-cresol, m-cresol, p-cresol, 2,5-xylenol, 3,5-xylenol, o-ethyl phenol, m-ethyl phenol, p-ethyl phenol, propyl phenol, n-butyl phenol, t-butyl phenol, 1-naphthol, 2-naphthol, 4,4'-biphenyl diol, bisphenol A, pyrocatechol, resorcinol, hydroquinone, pyrogallol, 1,2,4-benzene triol and phloroglucinol with at least one of aldehydes such as, for example, formaldehyde, acetaldehyde, propionaldehyde, benzaldehyde and furfural (para-formaldehyde and paraldehyde may be used instead of formaldehyde and acetaldehyde, respectively), or ketones such as, for example, acetone, methyl ethyl ketone and methyl isobutyl ketone, in the presence of an acid catalyst. In the present invention, among these novolak resins, preferred are those resins produced by polycondensing the phenol selected from phenol, o-cresol, m-cresol, p-cresol, 2,5-xylenol, 3,5-xylenol and resorcinol with the aldehyde or ketone selected from formaldehyde, acetaldehyde and propionaldehyde.

In particular, there are preferably used resins produced by.polycondensing mixed phenols containing m-cresol, p-cresol, 2,5-xylenol, 3,5-xylenol and resorcinol at a mixing molar ratio of 40 to 100:0 to 50:0 to 20:0 to 20:0 to 20, or mixed phenols containing phenol, m-cresol and p-cresol at a mixing molar ratio of 1 to 100:0 to 70:0 to 60, with formaldehyde. Also, as described hereinafter, the photosensitive composition of the present invention may contain an anti-dissolving agent. In this case, there are preferably used resins produced by polycondensing mixed phenols containing m-cresol, p-cresol, 2,5-xylenol, 3,5-xylenol and resorcinol at a mixing molar ratio of 70 to 100:0 to 30:0 to 20:0 to 20:0 to 20, or mixed phenols containing phenol, m-cresol and p-cresol at a mixing molar ratio of 10 to 100:0 to 60:0 to 40, with formaldehyde.

The above novolak resins have a weight-average molecular weight (MW) of preferably 1,000 to 15,000, more preferably 1,500 to 10,000 (calculated as polystyrene) as measured by a gel permeation chromatography.

The resole resins are those resins produced by the same polycondensation process as that for the production of the novolak resins except that an alkali catalyst is used instead of the acid catalyst. In the production of the resole resins, the phenols and mixing ratio thereof as well as aldehydes or ketones used therein are preferably similar to those for the production of the novolak resins, and the obtained resole resins have the similar weight-average molecular weight (MW) to that of the novolak resins.

The polyvinyl phenol resins are those resins produced by polymerizing either one kind or two or more kinds of hydroxystyrenes such as, for example, o-hydroxystyrene, m-hydroxystyrene, p-hydroxystyrene, dihydroxystyrene, trihydroxystyrene, tetrahydroxystyrene, pentahydroxystyrene, 2-(o-hydroxyphenyl)propylene, 2-(m-hydroxyphenyl)propylene and 2-(p-hydroxyphenyl)propylene (which may have a substituent group bonded to a benzene ring such as halogen, i.e., chlorine, bromine, iodine or fluorine, or $C_1$ to $C_4$ alkyl) in the presence of a radical polymerization initiator or cationic polymerization initiator. Of these polyvinyl phenol resins, preferred are polymers of hydroxystyrenes having a $C_1$ to $C_4$ alkyl substituent group bonded to the benzene ring, and more preferred are polymers of hydroxystyrenes having unsubstituted benzene ring. The polyvinyl phenol resins have a weight-average molecular weight (MW) of preferably 1,000 to 100,000, more preferably 1,500 to 50,000.

Among the above alkali-soluble resins, preferred are phenol resins containing a phenolic hydroxyl group, and more preferred are novolak resins.

The light-heat converting materials of the component (P-2) constituting the above positive-type photosensitive composition are not particularly restricted as long as they are compounds capable of converting light absorbed from a light source for image exposure into heat. Examples of the light-heat converting materials may include those compounds exhibiting an absorption maximum in a near-infrared region of 600 to 1,300 nm, such as organic or inorganic pigments, organic dyes, metals, metal oxides, metal carbides and metal borides. Of these light-heat converting materials, especially preferred are light-absorbing dyes.

The light-absorbing dyes have such a structure that heteroatoms such as nitrogen, oxygen and sulfur are bonded to each other through a polymethine chain ($—CH=$)$_n$ and, typically, are cyanine-based dyes in a broad sense having such a structure that the heteroatoms constitute respective heterocyclic rings, and the heterocyclic rings are bonded to each other through the polymethine chain. Specific examples of the light-absorbing dyes may include quinoline-based dyes (so-called cyanine-based dyes in a narrow sense), indole-based dyes (so-called indocyanine-based dyes), benzothiazole-based dyes (so-called thiocyanine-based dyes), pyrylium-based dyes, thiopyrylium-based dyes, squalyrium-based dyes, croconium-based dyes, azulenium-based dyes or the like as well as so-called polymethine-based dyes having such a structure that acyclic heteroatoms are bonded to each other through the polymethine chain. Of these light-absorbing dyes, preferred are the cyanine-based dyes such as quinoline-based, indole-based, benzothiazole-based, pyrylium-based and thiopyrylium-based dyes. Also, examples of the other light-absorbing dyes may include diiminium-based dyes, phthalocyanine-based dyes or the like. Of these other light-absorbing dyes, preferred are the diiminium-based dyes.

In the present invention, among the above cyanine-based dyes, the preferred quinoline-based dyes may include, in particular, those represented by the following general formulae (Ia), (Ib) and (Ic):

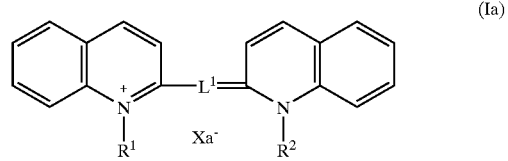

(Ia)

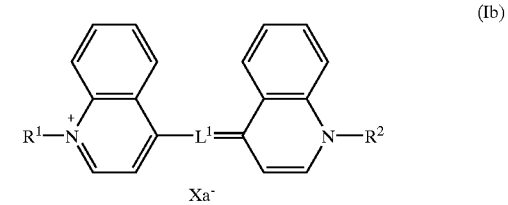

(Ib)

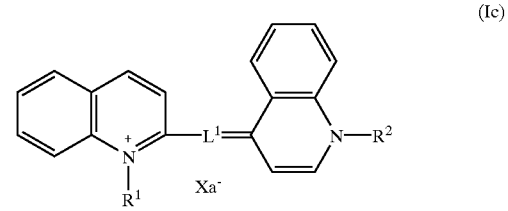

(Ic)

In the formulae (Ia), (Ib) and (Ic), $R^1$ and $R^2$ independently represent an alkyl group which may has a substituent group(s), an alkenyl group which may has a substituent group(s), an alkynyl group which may has a substituent group(s) or a phenyl group which may has a substituent group(s); $L^1$ represents a tri-, penta-, hepta- nona- or undecamethine group which may has a substituent group(s), in which two substituent groups on the penta-, hepta- nona- or undecamethine group may be bonded to each other to form a $C_5$ to $C_7$ cycloalkene ring; the quinoline ring may have substituent groups whose two adjacent groups may be bonded to each other to form a condensed benzene ring; and $Xa^-$ represents a counter anion.

When $R^1$ and $R^2$ in the formulae (Ia), (Ib) thereof therein is usually 1 to 15, preferably 1 to 10. When $R^1$ and $R^2$ in the formulae (Ia), (Ib) and (Ic) are an alkenyl group or an alkynyl group, the number of carbon atoms thereof is usually 2 to 15, preferably 2 to 10. Examples of the substituent groups of $R^1$ and $R^2$ (including phenyl group) may include usually $C_1$ to $C_{15}$, preferably a $C_1$ to $C_{10}$ alkoxy group, a phenoxy group, hydroxy group, a phenyl group or the like. Examples of the substituent groups of $L^1$ may include a alkyl group having the same number of carbon atoms as defined above, an amino group, a halogen atom or the like, in which the number of carbon atoms thereof is usually 1 to 15, preferably 1 to 10. Examples of the substituent groups on the quinoline ring may include an alkyl group having the same number of carbon atoms as defined above, an alkoxy group having the same number of carbon atoms as defined above, nitro group, a halogen atom or the like.

The preferred indole-based or benzothiazole-based dyes may include, in particular, those represented by the following general formula (II):

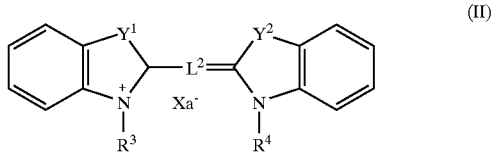

(II)

In the formula (II), $y^1$ and $y^2$ independently represent a dialkylmethylene group or sulfur atom; $R^3$ and $R^4$ independently represent an alkyl group which may has a substituent group(s) an alkenyl group which may has a substituent group(s), an alkynyl group which may has a substituent group(s) or a phenyl group which may has a substituent group(s); $L^2$ represents a tri-, penta-, hepta- nona- or undecamethine group which may has a substituent group(s), in which two substituent groups on the penta-, hepta- nona- or undecamethine group may be bonded to each other to form a $C_5$ to $C_7$ cycloalkene ring; the condensed benzene ring may have substituent groups whose two adjacent groups may be bonded to each other to form a condensed benzene ring; and $Xa^-$ represents a counter anion.

When $R^3$ and $R^4$ in the formula (II) are alkyl, the number of carbon atoms thereof is usually 1 to 15, preferably 1 to 10. When $R^3$ and $R^4$ in the formula (II) are an alkenyl group or an alkynyl group, the number of carbon atoms thereof is usually 2 to 15, preferably 2 to 10. Examples of the substituent groups of $R^1$ and $R^2$ (including phenyl group) may include usually $C_1$ to $C_{15}$, preferably a $C_1$ to $C_{10}$ alkoxy group, a phenoxy group, hydroxy group, a phenyl group or the like, in which the number of carbon atoms thereof is usually 1 to 15, preferably 1 to 10. Examples of the substituent groups of $L^2$ may include an alkyl group having the same number of carbon atoms as defined above, amino group, a halogen atom or the like. Examples of the substituent groups on the condensed benzene ring may include an alkyl group having the same number of carbon atoms as defined above, an alkoxy group having the same number of carbon atoms as defined above, nitro group, a halogen atom or the like.

The preferred pyrylium-based and thiopyrylium-based dyes may include, in particular, those represented by the following general formulae (IIIa), (IIIb) or (IIIc):

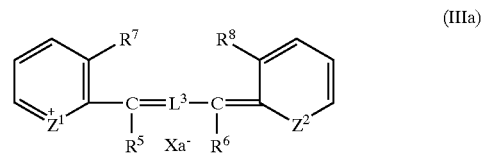

(IIIa)

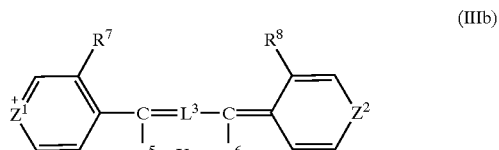

(IIIb)

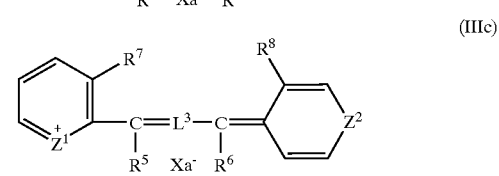

(IIIc)

In the formulae (IIIa), (IIIb) or (IIIc), $Z^1$ and $Z^2$ independently represent oxygen atom or sulfur atom; $R^5$, $R^6$, $R^7$ and $R^8$ independently represent hydrogen atom or an alkyl group, or $R^5$ and $R^6$, and $R^7$ and $R^8$ may be respectively bonded to each other to form a $C_5$ to $C_7$ cycloalkene ring; $L^3$ represents a mono-, tri-, penta- or heptamethine group which has a substituent group(s), in which two substituent groups on the penta- or heptamethine group may be bonded to each other to form a $C_5$ to $C_7$ cycloalkene ring; the pyrylium ring and the thiopyrylium ring may have substituent groups whose two adjacent groups may be bonded to each other to form a condensed benzene ring; and $Xa^-$ represents a counter anion.

When $R^5$, $R^6$, $R^7$ and $R^8$ in the formulae (IIIa), (IIIb) or (IIIc) are an alkyl group, the number of carbon atoms contained therein is usually 1 to 15, preferably 1 to 10. Examples of the substituent groups of $L^3$ may include an alkyl group having the same number of carbon atoms as defined above, amino group, a halogen atom or the like. Examples of the substituent groups on the pyrylium ring and the thiopyrylium ring may include an aryl group such as a phenyl group and a naphthyl group.

The preferred polymethine-based dyes may include, in particular, those represented by the following general formula (IV):

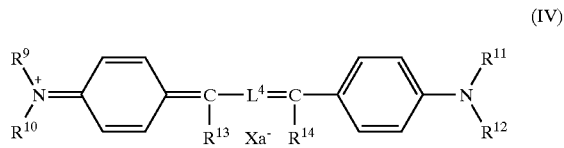

(IV)

In the formula (IV), $R^9$, $R^{10}$, $R^{11}$ and $R^{12}$ independently represent an alkyl group; $R^{13}$ and $R^{14}$ independently represent an aryl group which has a substituent group(s), a furyl group or thienyl; $L^4$ represents a mono-, tri-, penta- or heptamethine group which has a substituent group(s), in which two substituent groups on the penta- or heptamethine group may be bonded to each other to form a $C_5$ to $C_7$ cycloalkene ring; the quinone ring and the benzene ring may have substituent groups; and $Xa^-$ represents a counter anion.

The alkyl group as $R^9$, $R^{10}$, $R^{11}$ and $R^{12}$ in the formula (IV) has usually 1 to 15, preferably 1 to 10 carbon atoms. When $R^{13}$ and $R^{14}$ are an aryl group, the number of carbon atoms contained therein is usually 6 to 20, preferably 6 to 15. Specific examples of $R^{13}$ and $R^{14}$ may include a phenyl group, a 1-naphthyl group, a 2-naphthyl group, a 2-furyl group, a 3-furyl group, a 2-thienyl group, a 3-thienyl group or the like, and examples of the substituent groups thereof may include an alkyl group having the same number of carbon atoms as defined above, an alkoxy group having the same number of carbon atoms as defined above, a dialkylamino group, hydroxy group, a halogen atom or the like. Examples of the substituent groups of $L^4$ may include an alkyl group having the same number of carbon atoms as defined above, amino group, a halogen atom or the like. Examples of the substituent groups on the quinone ring and the benzene ring may include an alkyl group having the same number of carbon atoms as defined above, an alkoxy group having the same number of carbon atoms as defined above, nitro group, a halogen atom or the like.

The preferred diiminium-based dyes may include, in particular, those having at least one N,N-diaryliminium salt skeleton which are represented by the following general formulae (Va) or (Vb):

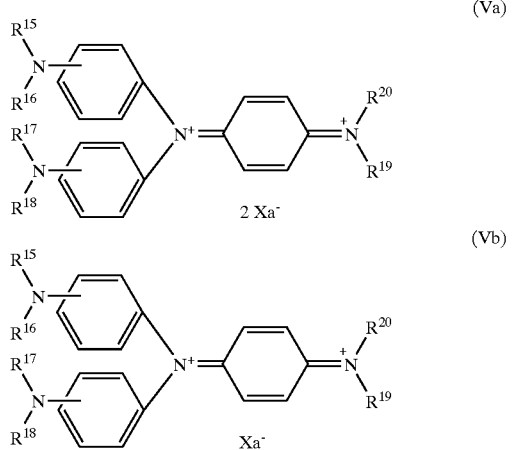

In the formulae (Va) and (Vb), $R^{15}$, $R^{16}$, $R^{17}$ and $R^{18}$ independently represent hydrogen atom, a halogen atom, an alkyl group which may has a substituent group(s), an alkenyl group which may has a substituent group(s), an alkynyl group which may has a substituent group(s) or an alkoxy group which may has a substituent group(s); $R^{19}$ and $R^{20}$ independently represent an alkyl group which may has a substituent group(s), an alkenyl group which may has a substituent group(s), an alkynyl group which may has a substituent group(s), an alkoxy group which may has a substituent group(s), an acyloxy group which may has a substituent group(s) or a phenyl group which may has a substituent group(s); the benzene ring and the iminoquinone ring may have substituent groups; and $Xa^-$ represents a counter anion. Meanwhile, in the formula (Vb), the electron bonds shown by a dotted line indicates the condition of resonance with other electron bonds.

When $R^{15}$, $R^{16}$, $R^{17}$, $R^{18}$, $R^{19}$ and $R^{20}$ in the formulae (Va) and (Vb) is an alkyl group or an alkoxy group, the number of carbon atoms thereof is usually 1 to 15, preferably 1 to 10. When $R^{15}$, $R^{16}$, $R^{17}$, $R^{18}$, $R^{19}$ and $R^{20}$ in the formulae (Va) and (Vb) are an alkenyl group or an alkynyl group, the number of carbon atoms thereof is usually 2 to 15, preferably 2 to 10. Examples of the substituent groups of $R^{15}$, $R^{16}$, $R^{17}$, $R^{18}$, $R^{19}$ and $R^{20}$ may include an alkyl group having the same number of carbon atoms as defined above, an alkoxy group having the same number of carbon atoms as defined above, a carboxyl group, an acyloxy group, an alkoxycarbonyl group, hydroxy group, amino group, an alkylamino group, a halogenated alkyl group, a halogen atom or the like. Examples of the substituent groups on the benzene ring and the iminoquinone ring may include alkyl having the same number of carbon atoms as defined above, alkoxy having the same number of carbon atoms as defined above, an acyl group, nitro group, a halogen atom or the like.

Among these diiminium-based dyes, especially preferred are those in which $R^{15}$, $R^{16}$, $R^{17}$, $R^{18}$, $R^{19}$ and $R^{20}$ in the general formulae (Va) and (Vb) are all an alkyl group, or $R^{15}$, $R^{16}$, $R^{17}$ and $R^{18}$ are an alkyl group and $R^{19}$ and $R^{20}$ are a phenyl group substituted with a dialkylamino group.

Examples of the counter anion $Xa^-$ in the general formulae (Ia to Ic), (II), (IIIa to IIIc), (IV) and (Va and Vb) may include inorganic acid anions such as $Cl^-$, $Br^-$, $I^-$, $CO_4^-$, $PF_6^-$, $SbF_6^-$, $AsF_6^-$, and inorganic boric acid anions such as $BF_4^-$ and $BCl_4^-$; and organic acid anions such as benzenesulfonic acid, toluenesulfonic acid, naphthalenesulfonic acid, acetic acid, and anions of organic boric acid having an organic group such as methyl group, ethyl group, propyl group, butyl group, phenyl group, methoxyphenyl group, naphthyl group, fluorophenyl group, difluorophenyl group, pentafluorophenyl group, thienyl group and pyrroryl group.

The polymethine chain represented by $L^1$, $L^2$, $L^3$ and $L^4$ in the general formulae (Ia to Ic), (II), (IIIa to IIIc) and (IV) may have as a substituent group bonded thereto, a barbituric acid anion or thiobarbituric acid anion represented by the following general formula (VI), or as a moiety inserted thereinto, a squaric acid anion or thiosquaric acid anion represented by the following general formula (VII), or a croconic acid anion or thiocroconic acid anion represented by the following general formula (VIII), to form an internal salt.

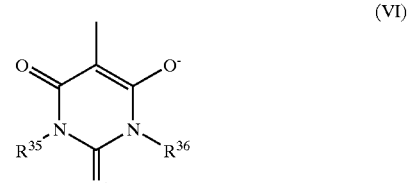

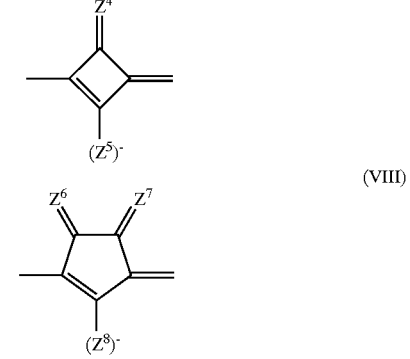

In the formulae (VI), (VII) and (VIII), $Z^3$, $Z^4$, $Z^5$, $Z^6$, $Z^7$ and $Z^8$ independently represent oxygen atom or sulfur atom; and $R^{35}$ and $R^{36}$ independently represent hydrogen atom, an alkyl group which may has a unsubstituent group(s), an alkenyl group which may has a unsubstituent group(s), an alkoxy group which may has a unsubstituent group(s) or a phenyl group which may has a unsubstituent group(s).

When $R^{35}$ and $R^{36}$ in the formula (VI) are an alkyl group or an alkoxy group, the number of carbon atoms thereof is usually 1 to 15, preferably 1 to 5. When $R^{35}$ and $R^{36}$ in the formula (VI) are an alkenyl group, the number of carbon atoms thereof is usually 2 to 15, preferably 2 to 5. $R^{35}$ and $R^{36}$ are preferably an alkyl group. Specific examples of the alkyl group may include methyl group, ethyl group, propyl group, butyl group or the like.

The phthalocyanine-based dyes have such a basic structure that heterocyclic rings are bonded to each other through an azapolymethine chain, and the preferred phthalocyanine-based dyes are those represented by the following general formula (IX):

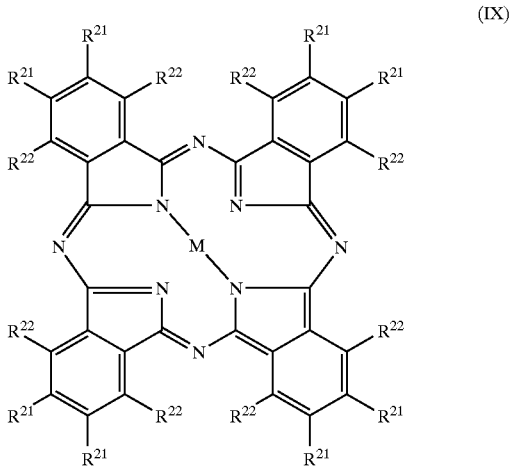

In the formula (IX), $R^{21}$ and $R^{22}$ independently represent an alkoxy group, a thioalkoxy group, an aryloxy group, a thioaryloxy group, an alkylamino group, an arylamino group, halogen atom or hydrogen; M represents Zn, Cu, Ni, $SnCl_2$, AlCl or hydrogen atom; and two adjacent substituent groups bonded to the benzene ring may be bonded to each other to form a condensed ring.

When $R^{21}$ and $R^{22}$ in the formula (IX) are an alkoxy group, a thioalkoxy group or an alkylamino group, the number of carbon atoms thereof is usually 1 to 10, preferably 1 to 4. Examples of the alkoxy group, a thioalkoxy group and an alkylamino group may include a phenoxy group, a thiophenoxy group, a phenylamino group or the like. Also, M is preferably Zn or $SnCl_2$.

Among the cyanine-based dyes such as quinoline-based dyes represented by the general formulae (Ia to Ic), indole-based or benzothiazole-based dyes represented by the general. formula (II) and pyrilium-based or thiopyrilium-based dyes represented by the general formulae (IIIa to IIIc), the polymethine-based dyes represented by the general formula (IV), the diiminium-based dyes represented by the general formulae (Va and Vb) and the phthalocyanine-based dyes represented by the general formula (IX), preferred are the cyanine-based dyes such as quinoline-based dyes represented by the general formulae (Ia to Ic), indole-based or benzothiazole-based dyes represented by the general formula (II), pyrilium-based or thiopyrilium-based dyes represented by the general formulae (IIIa to IIIc), the polymethine-based dyes represented by the general formula (IV) and the diiminium-based dyes represented by the general formulae (Va and Vb), and more preferred are the indole-based or benzothiazole-based cyanine dyes represented by the general formula (II).

Specific examples of the cyanine-based dyes such as quinoline-based dyes represented by the general formulae (Ia to Ic), indole-based or benzothiazole-based dyes represented by the general formula (II) and pyrilium-based or thiopyrilium-based dyes represented by the general formulae (IIIa to IIIc), the polymethine-based dyes represented by the general formula (IV) and the diiminium-based dyes represented by the general formulae (Va and Vb) may include those represented by the following formulae:

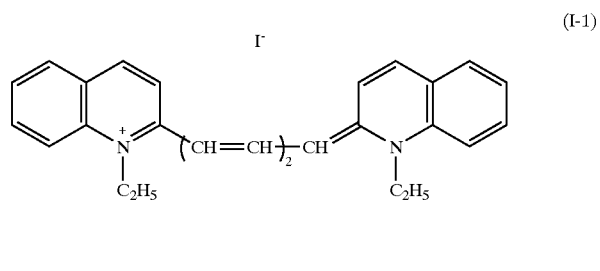

(I-1)

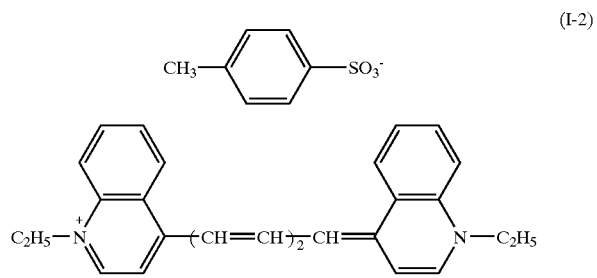

(I-2)

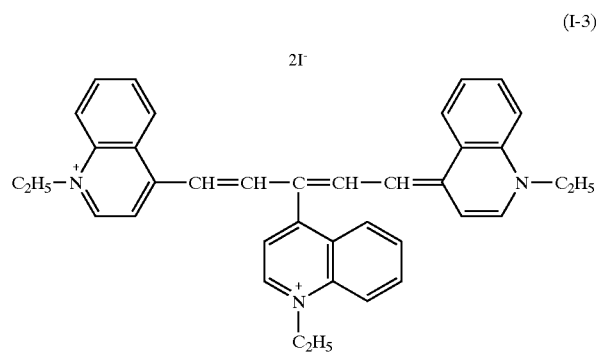

(I-3)

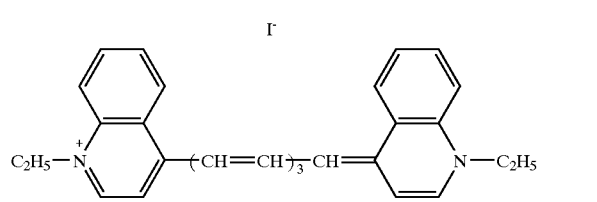

(I-4)

(II-1)
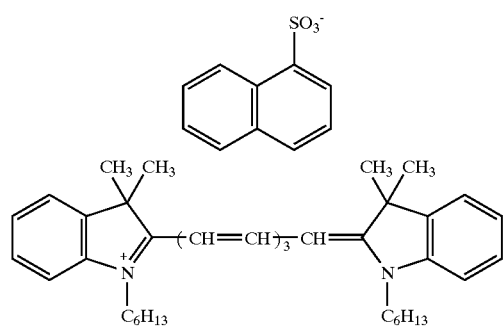
(II-2)
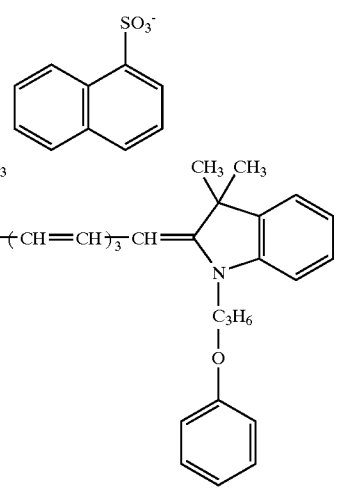
(II-3)
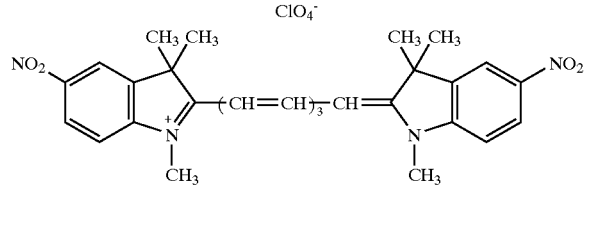
(II-4)
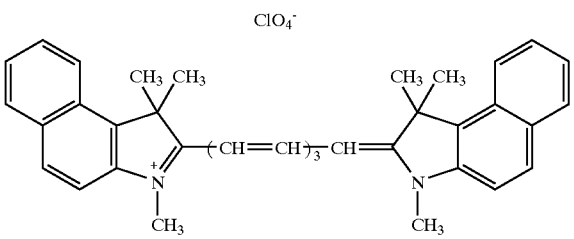
(II-5)
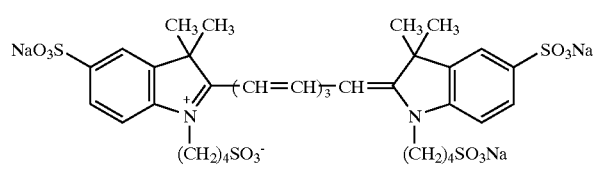
(II-6)
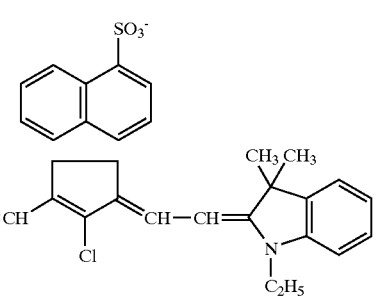
(II-7)
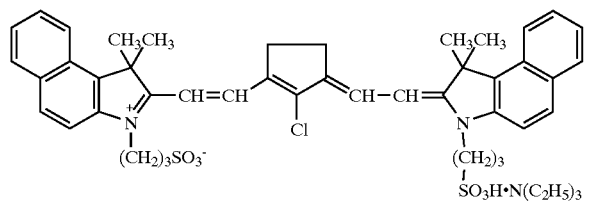
(II-8)
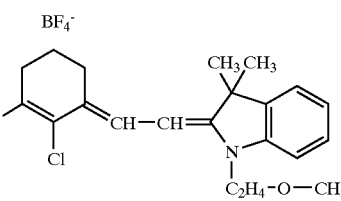
(II-9)
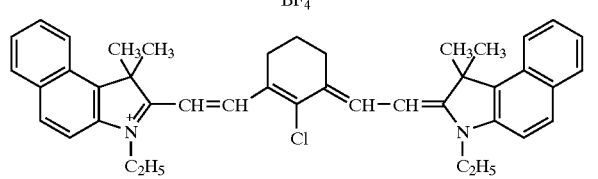
(II-10)
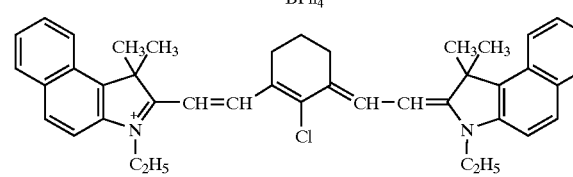

-continued
(II-11)
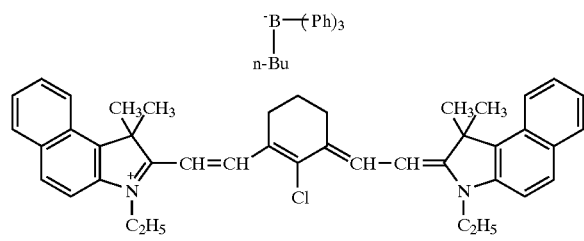
(II-12)
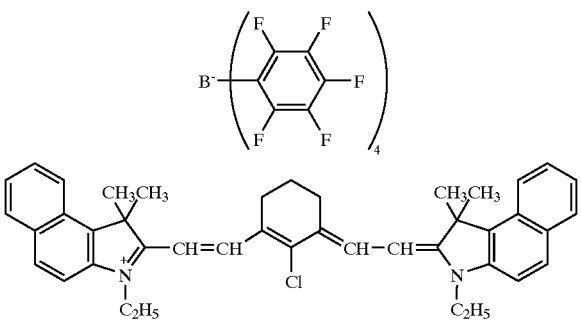
(II-13)
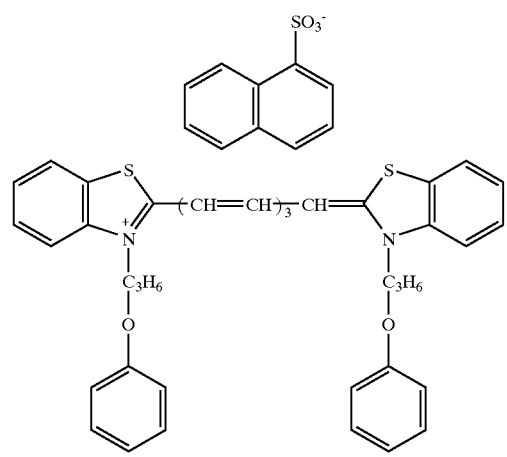
(II-14)
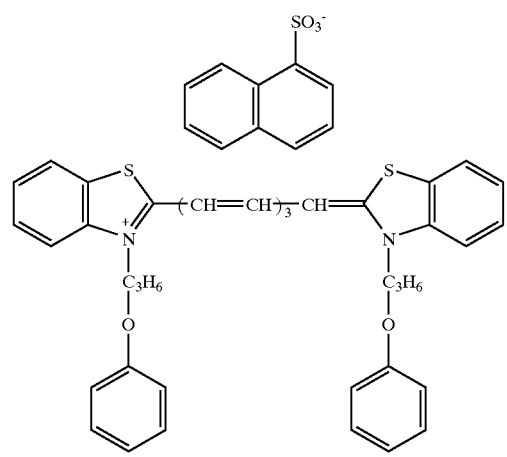
(II-15)
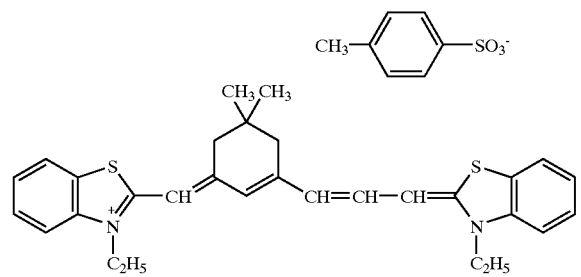
(II-16)
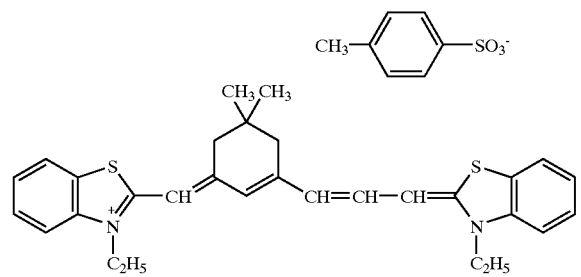
(II-17)
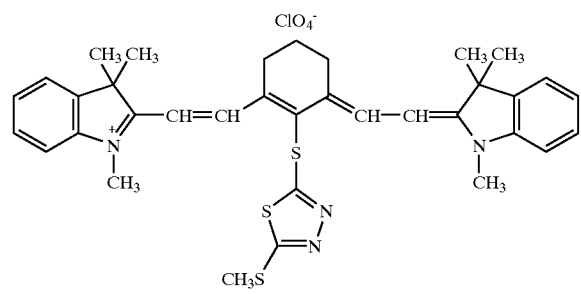
(III-1)
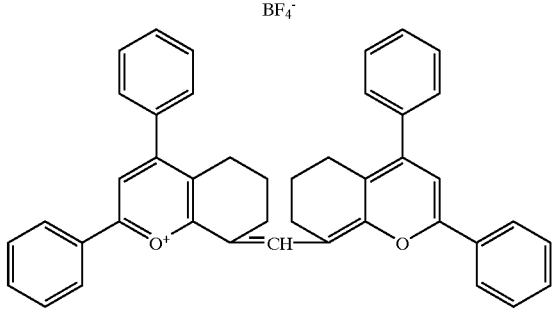

-continued
(III-2)
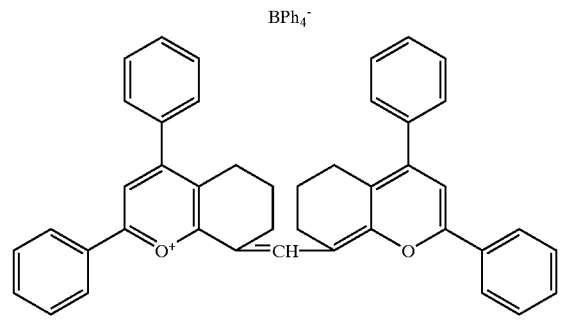
(III-3)
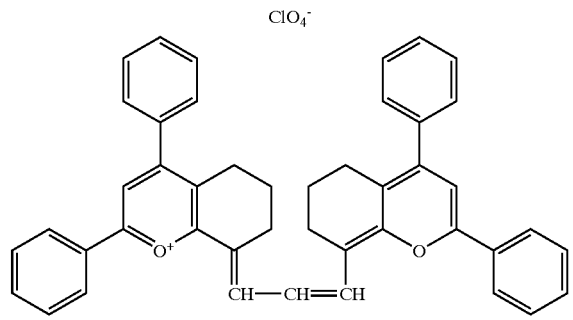
(III-4)
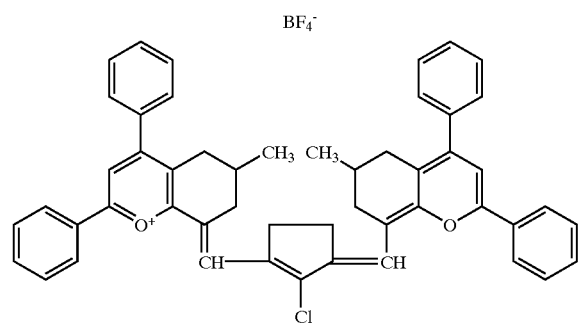
(III-5)
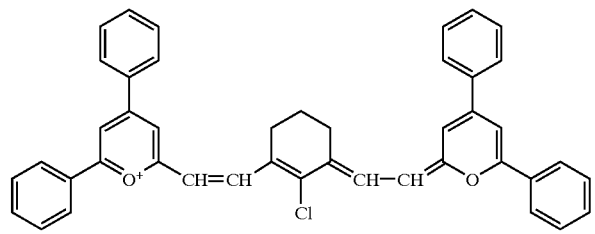
(III-6)
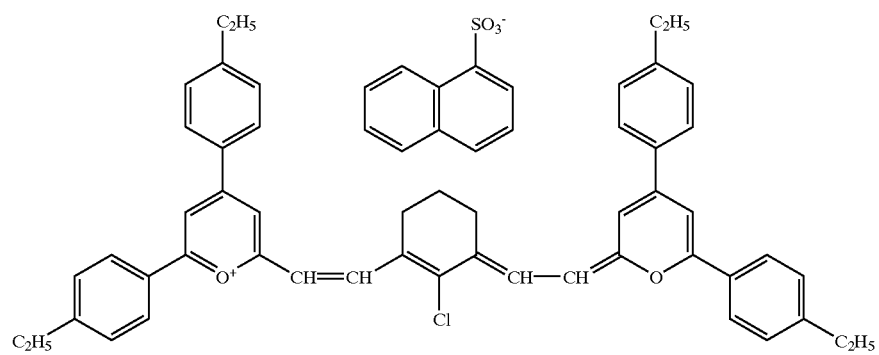
(III-7)
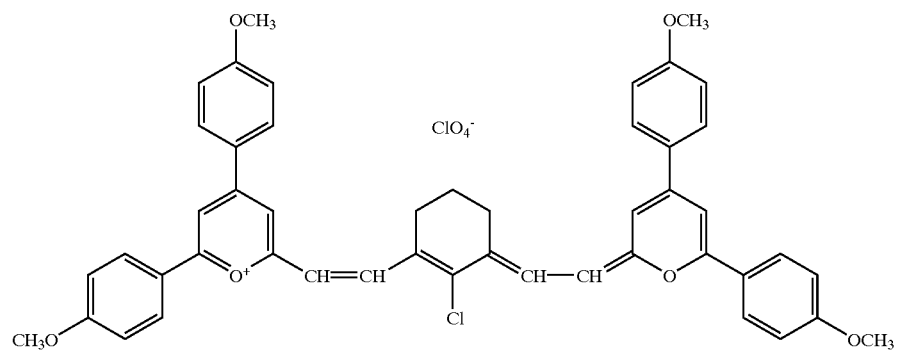

-continued
(III-8)
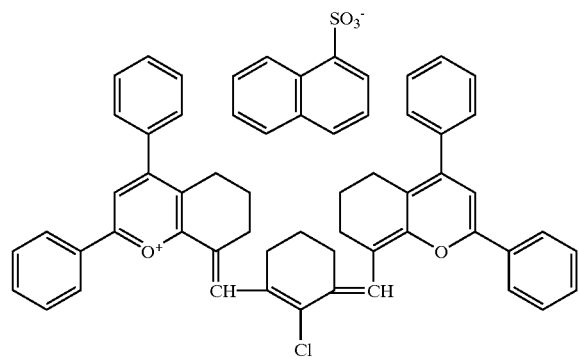
(III-9)
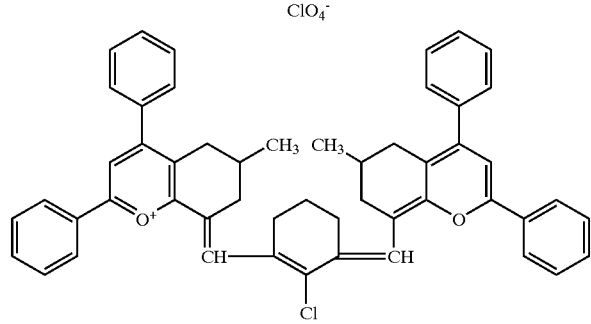
(III-10)
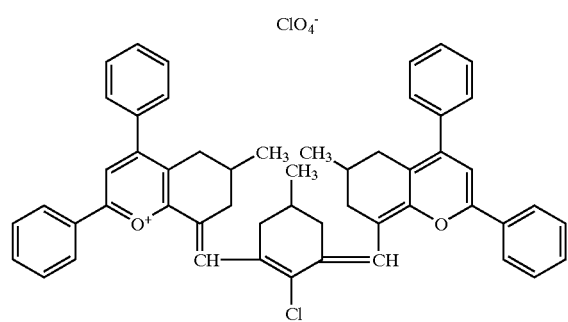
(III-11)
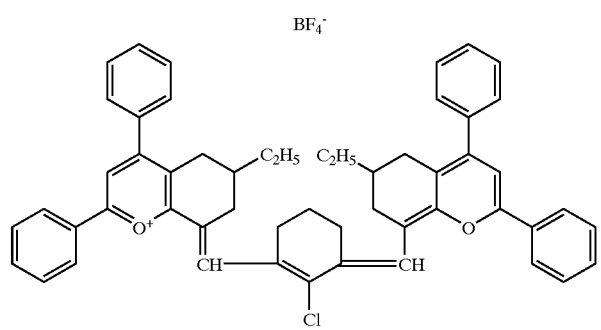
(III-12)
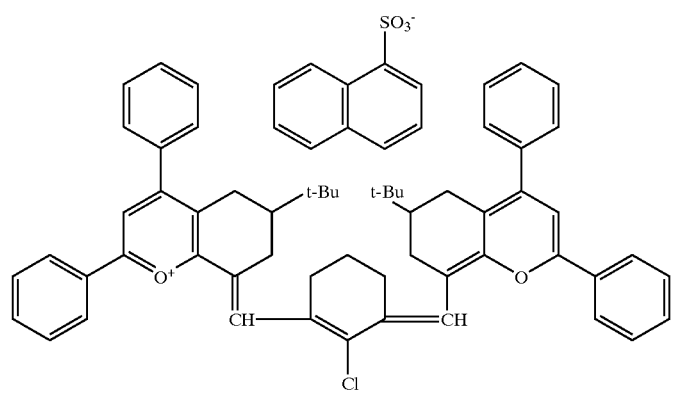
(III-13)
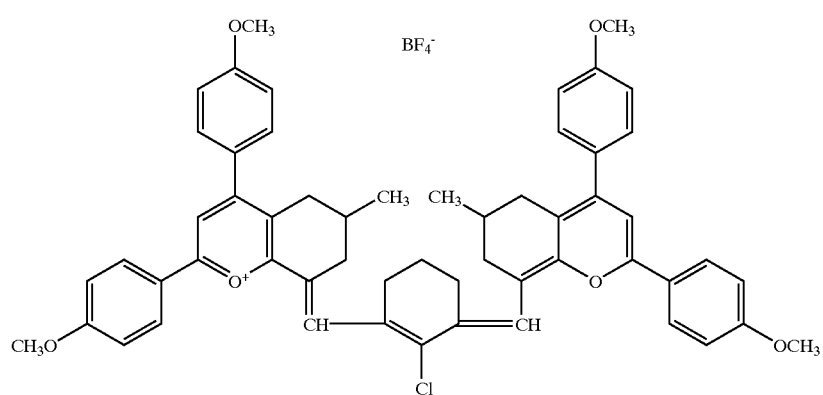

-continued
(III-14)
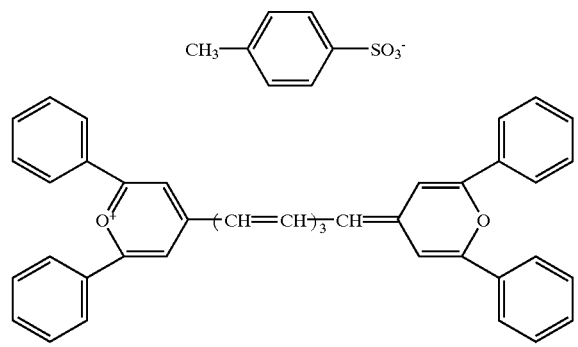
(III-15)
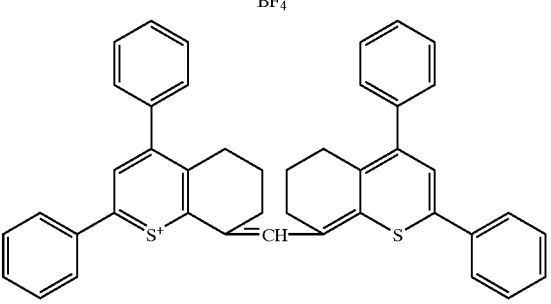
(III-16)
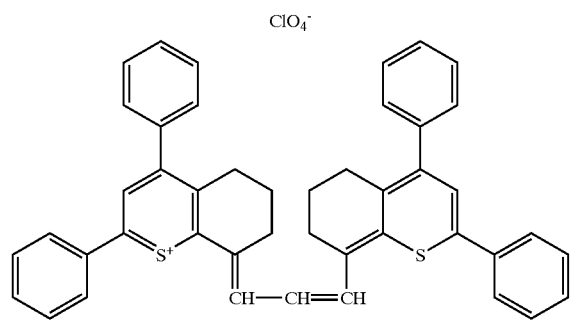
(III-17)
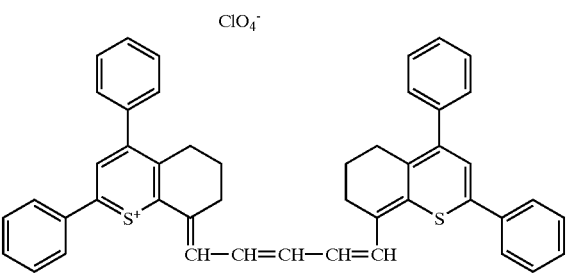
(III-18)
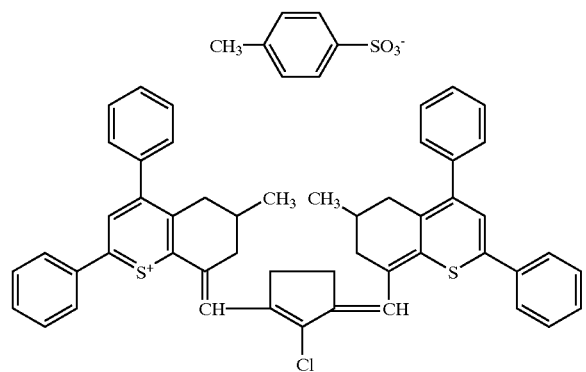
(III-19)
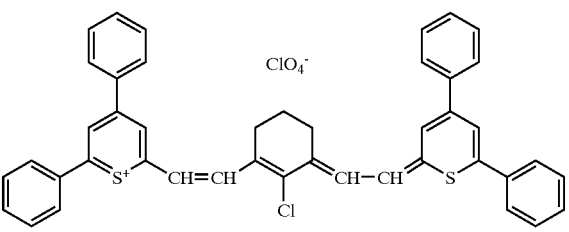
(III-20)
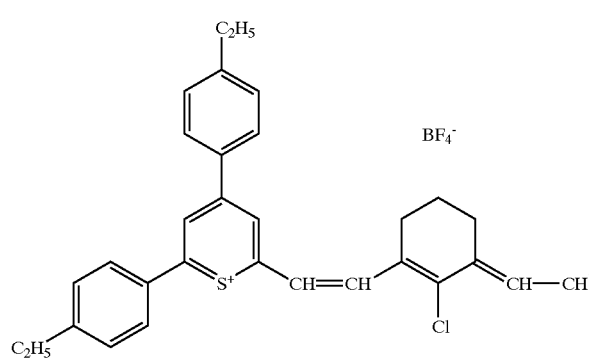

(III-21)
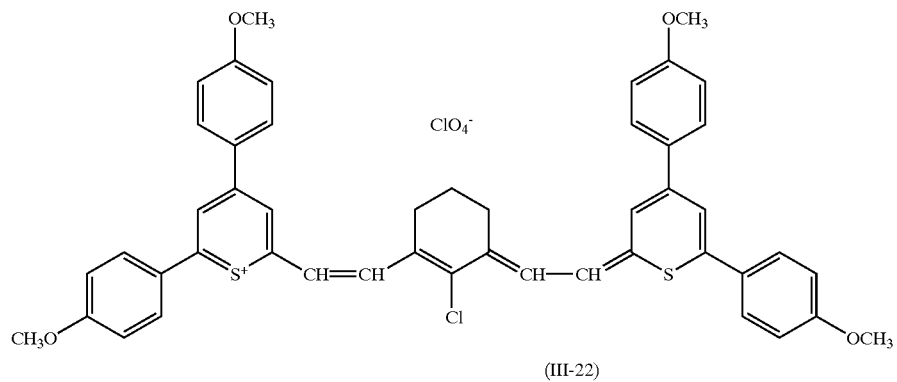
(III-22) (III-23)
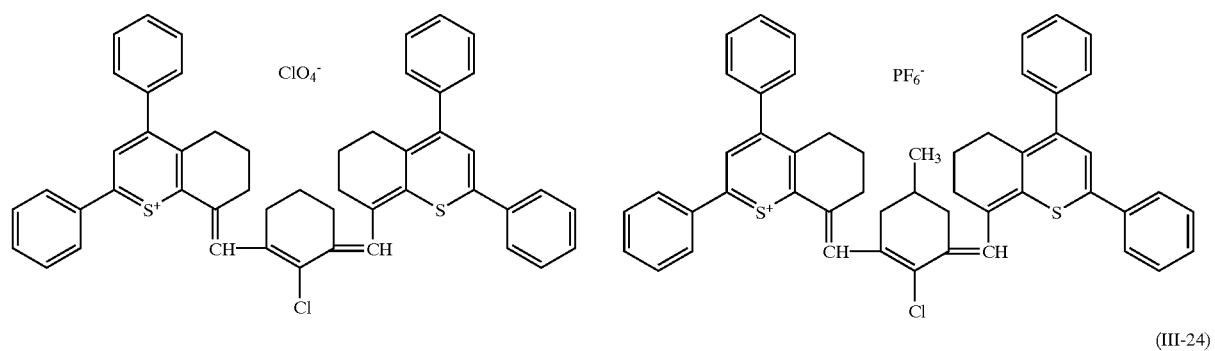
(III-24)
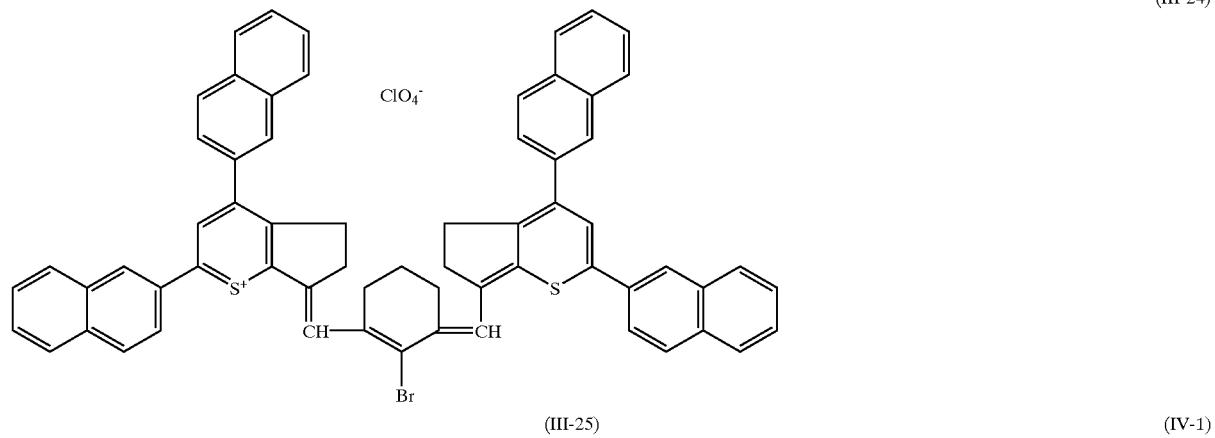
(III-25) (IV-1)
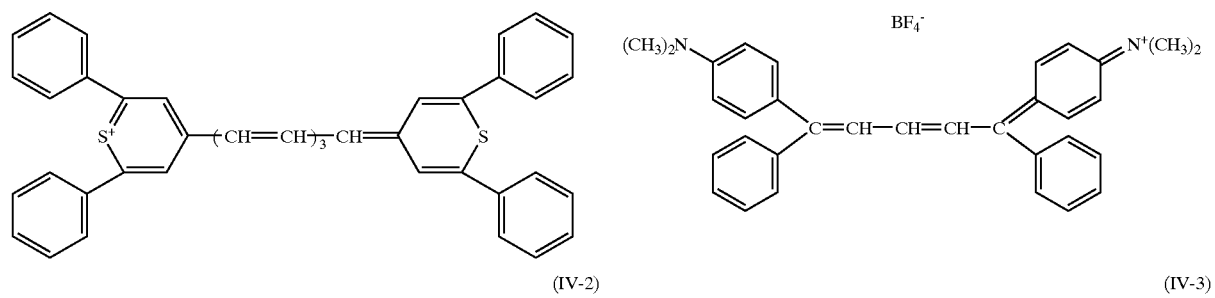
(IV-2) (IV-3)
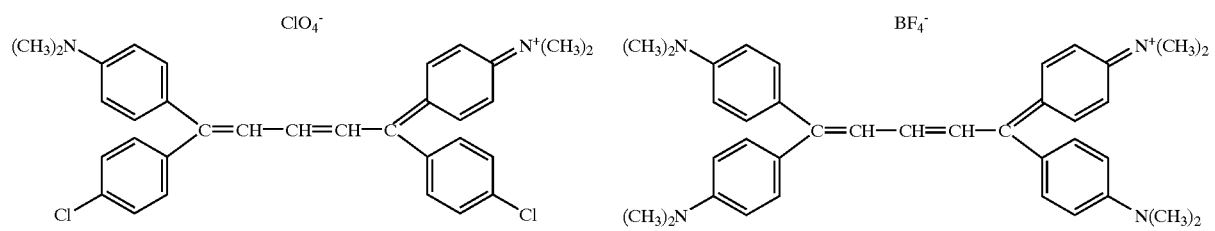

-continued
(IV-4) 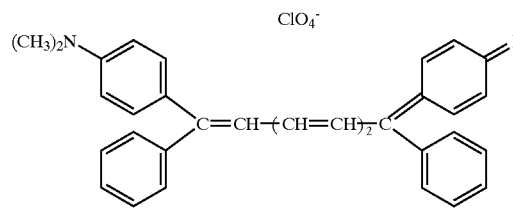
(IV-5) 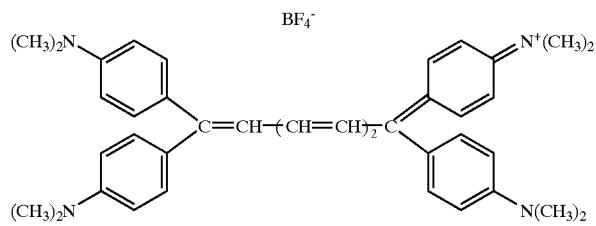
(IV-6) 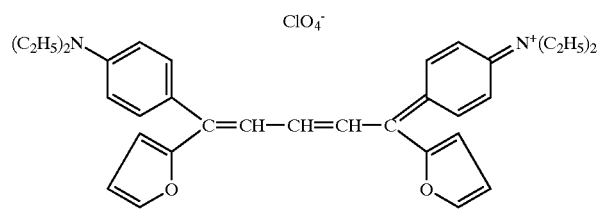
(V-1) 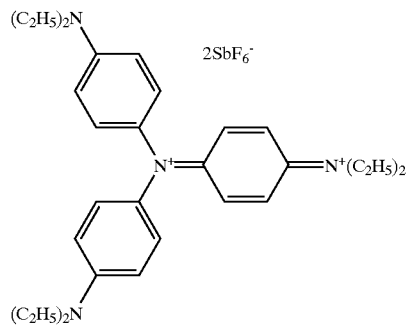
(V-2) (V-3) 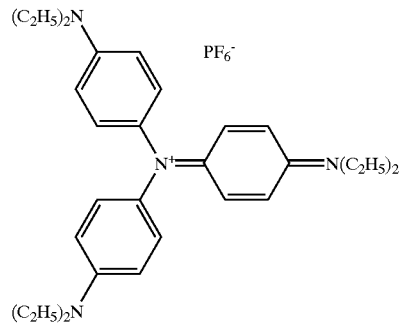
(V-4) (V-5) 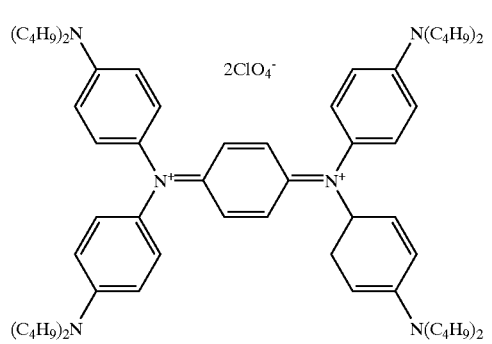
(V-6) 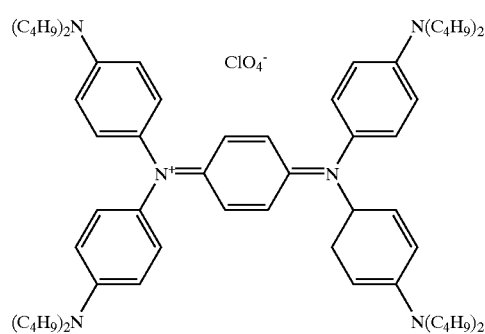

In the present invention, the content of the alkali-soluble resin as the component (P-1) of the positive-type photosensitive composition is preferably 50 to 99% by weight, more preferably 60 to 98% by weight, still more preferably 70 to 97% by weight. Also, the content of the light-heat converting material as the component (P-2) of the positive-type photosensitive composition is preferably 0.5 to 30% by weight, more preferably 1 to 20% by weight, still more preferably 2 to 10% by weight.

In addition, for the purpose of increasing the difference in dissolvability to the alkali developing solution between image portion and non-image portion, the above positive-type photosensitive composition may contain an anti-dissolving (solubility-suppressing) agent as the component (P-3) which is not decomposed by infrared light. Examples of the anti-dissolving agent may include sulfonic acid esters, phosphoric acid esters, aromatic carboxylic acid esters, aromatic disulfones, carboxylic anhydrides, aromatic ketones, aromatic aldehydes, aromatic amines, aromatic ethers and compounds having a triarylmethane skeleton as described in Japanese Patent Application Laid-Open (KOKAI) Nos. 10-268512(1998) and 11-288089(1999); acid-developable dyes having a lactone skeleton, N,N-diarylamido skeleton or diarylmethylimino skeleton as described in Japanese Patent Application Laid-Open (KOKAI) No. 11-190903(1999); base-developable dyes having a lactone skeleton, thiolactone skeleton or sulfolactone skeleton as described in Japanese Patent Application Laid-Open (KOKAI) No. 11-143076(1999); or the like.

In addition, as the anti-dissolving agent, there may also used nonionic surfactants such as polyethylene glycols, polyethylene glycol polypropylene glycol block copolymers, polyethylene glycol alkyl ethers, polyethylene glycol polypropylene glycol alkyl ethers, polyethylene glycol alkyl phenyl ethers, polyethylene glycol fatty acid esters, polyethylene glycol alkyl amines, polyethylene glycol alkylamino ethers, glycerin fatty acid esters and polyethylene oxide adducts thereof, sorbitan fatty acid esters and polyethylene oxide adducts thereof, sorbitol fatty acid esters and polyethylene oxide adducts thereof, pentaerythritol fatty acid esters and polyethylene oxide adducts thereof, and polyglycerin fatty acid esters.

In the present invention, the content of the anti-dissolving agent (P-3) in the above positive-type photosensitive composition is preferably not more than 50% by weight, more preferably 0.01 to 30% by weight, still more preferably 0.1 to 20% by weight.

Further, the above positive-type photosensitive composition may also contain as a component (P-4), an organic acid or an anhydride thereof having a pKa value of preferably not less than 2 for the purposes of improving developing properties such as under-developing property. As the organic acid or anhydride thereof, there may be used, for example, those described in Japanese Patent Application Laid-Open (KOKAI) Nos. 60-88942(1985), 63-276048(1988) and 2-96754(1990), etc. Specific examples of the organic acid or anhydride thereof may include aliphatic saturated carboxylic acids such as glyceric acid, methylmalonic acid, dimethylmalonic acid, propylmalonic acid, succinic acid, malic acid, mesotartaric acid, glutaric acid, β-methylglutaric acid, β,β-dimethylglutaric acid, β-ethylglutaric acid, β,β-diethylglutaric acid, β-propylglutaric acid, β,β-methylpropylglutaric acid, pimelic acid, suberic acid and sebacic acid; aliphatic unsaturated carboxylic acids such as maleic acid, fumaric acid and glutaconic acid; carbocyclic saturated carboxylic acids such as 1,1-cyclobutanedicarboxylic acid, 1,3-cyclobutanedicarboxylic acid, 1,1-cyclopentanedicarboxylic acid, 1,2-cyclopentanedicarboxylic acid, 1,1-cyclohexanedicarboxylic acid, 1,2-cyclohexanedicarboxylic acid, 1,3-cyclohexanedicarboxylic acid and 1,4-cyclohexanedicarboxylic acid; carbocyclic unsaturated carboxylic acids such as 1,2-cyclohexenedicarboxylic acid, 2,3-dihydroxybenzoic acid, 3,4-dimethylbenzoic acid, 3,4-dimethoxybenzoic acid, 3,5-dimethoxybenzoic acid, p-toluic acid, 2-hydroxy-p-toluic acid, 2-hydroxy-m-toluic acid, 2-hydroxy-o-toluic acid, mandelic acid, gallic acid, phthalic acid, isophthalic acid and terephthalic acid; merudoramic acid; ascorbic acid; and acid anhydrides such as succinic anhydride, glutaric anhydride, maleic anhydride, cyclohexenedicarboxylic anhydride, cyclohexanedicarboxylic anhydride and phthalic anhydride.

In the present invention, the content of the organic acid or anhydride thereof (P-4) in the above positive-type photosensitive composition is preferably not more than 30% by weight, more preferably not more than 20% by weight, still more preferably not more than 10% by weight.

In addition, the above positive-type photosensitive composition may also contain a colorant component (P-5) such as pigments and dyes. Examples of the colorant component (P-5) may include Victoria Pure Blue (42595), Crystal Violet (42555), Crystal Violet Lactone, Auramine O (41000), Cat-iron Brilliant Flavin (basic 13), Rhodamine 6GCP (45160), Rhodamine B (45170), Safranine OK 70:100 (50240), Erioglaucine X (42080), Fast Black HB (26150), No. 120/Lionol Yellow (21090), Lionol Yellow GRO (21090), Simular Fast Yellow 8GF (21105), Benzidine Yellow 4T-564D (21095), Simular Fast Red 4015 (12355), Lionol Red B4401 (15850), Fastgen Blue-TGR-L (74160), Lionol Blue SM (26150) or the like. Here, numerals in the parentheses indicate the color indices (C.I.).

The content of the colorant component (P-5) in the positive-type photosensitive composition of the present invention is preferably not more than 50% by weight, more preferably 0.5 to 30% by weight, still more preferably 2 to 20% by weight.

Further, when the above phenolic hydroxy-containing phenol resin is used as the alkali-soluble resin, the positive-type photosensitive composition may also contain a cross-linking agent as a component (P-6) having a function of cross-linking the phenol resin in order to impart a good chemical resistance and printing resistance (wear resistance upon printing) to the positive images by cross-linking the phenol resin by heating after exposure and development treatments. Typical examples of the cross-linking agent may include amino compounds having at least two functional groups selected from methylol group, alkoxymethyl group obtained by alcoholic condensation modification of the methylol group, and acetoxymethyl group. Specific examples of the cross-linking agent may include melamine derivatives such as methoxymethylated melamine (produced by Mitsui Sytec Co., Ltd.; Cymel 300 series (1), etc.); benzoguanamine derivatives such as methyl/ethyl mixed alkoxylated benzoguanamine resins (produced by Mitsui Sytec Co., Ltd.; Cymel 1100 series (2), etc.); glycol uril derivatives such as tetramethylol glycol uril resins (tetramethylol glycol uril resins produced by Mitsui Sytec Co., Ltd.; Cymel 1100 series (3), etc.); urea resin derivatives; resole resins; or the like.

In the present invention, the content of the cross-linking agent (P-6) in the positive-type photosensitive composition is preferably not more than 20% by weight, more preferably not more than 10% by weight, still more preferably not more than 5% by weight.

The above positive-type photosensitive composition may contain a nonionic, anionic or amphoteric surfactant as a component (P-7) for the purposes of enhancing the sensitivity or improving the developing property. Further, the positive-type photosensitive composition may also contain various additives ordinarily used in the photosensitive composition such as coating modifiers, adhesion modifiers, sensitivity modifiers, sensitizers, development modifiers or the like in an amount of not more than 20% by weight, preferably not more than 10% by weight.

Examples of the nonionic surfactants may include polyethylene glycols such as polyethylene glycol and polyethylene glycol polypropylene glycol block copolymers; polyethylene glycol alkyl ethers such as polyethylene glycol cetyl ether, polyethylene glycol stearyl ether, polyethylene glycol oleyl ether and polyethylene glycol behenyl ether; polyethylene glycol polypropylene glycol alkyl ethers such as polyethylene glycol polypropylene glycol cetyl ether and polyethylene glycol polypropylene glycol decyl tetradecyl ether; polyethylene glycol alkylphenyl ethers such as polyethylene glycol octylphenyl ether and polyethylene glycol nonylphenyl ether; polyethylene glycol fatty acid esters such as ethylene glycol monostearate, ethylene glycol distearate, diethylene glycol stearate, polyethylene glycol distearate, polyethylene glycol monolaurate, polyethylene glycol monostearate and polyethylene glycol monooleate; glycerin fatty acid esters and polyethylene oxide adducts thereof such as glyceryl monomyristate, glyceryl monostearate, glyceryl monoisostearate, glyceryl distearate, glyceryl monooleate and glyceryl dioleate; polyglycerin fatty acid esters; pentaerythritol fatty acid esters and polyethylene oxide adducts thereof such as pentaerythritol monostearate, pentaerythritol tristearate, pentaerythritol monooleate and pentaerythritol trioleate; sorbitan fatty acid esters and polyethylene oxide adducts thereof such as sorbitan monopalmitate, sorbitan monostearate, sorbitan tristearate, sorbitan monooleate and sorbitan trioleate; sorbitol fatty acid esters and polyethylene oxide adducts thereof such as sorbitol monolaurate, sorbitol tetrastearate, sorbitol hexastearate and sorbitol tetraoleate; polyethylene glycol alkyl amines; polyethylene glycol alkylaminoethers; polyethylene oxide adducts of castor oil; polyethylene oxide adducts of lanolin; or the like.

Examples of the anionic surfactants may include higher fatty acid salts such as sodium laurate, sodium stearate and sodium oleate; alkylsulfonic acid salts such as sodium laurylsulfonate; alkylbenzenesulfonic acid salts such as sodium dodecylbenzenesulfonate; alkylnaphthalenesulfonic acid salts such as sodium isopropylnaphthalenesulfonate; alkyldiphenylethersulfonic acid salts such as sodium alkyldiphenylethersulfonate; polyoxyethylenealkylethersulfonic acid salts such as sodium polyoxyethylenelaurylethersulfonate; salts of alkylsulfuric acid esters such as sodium laurylsulfate and sodium stearylsulfate; salts of higher alcohol sulfuric acid esters such as sodium octyl alcohol sulfate, sodium lauryl alcohol sulfate and ammonium lauryl alcohol sulfate; salts of aliphatic alcohol sulfuric acid esters such as sodium acetyl alcohol sulfate; polyoxyethylenealkylethersulfuric acid salts such as sodium polyoxyethylenelaurylethersulfate, ammonium polyoxyethylenelaurylethersulfate and triethanolamine polyoxyethylenelaurylethersulfate; polyoxyethylenealkylphenylethersulfuric acid salts such as sodium polyoxyethylenenonylphenylethersulfate; salts of alkylphosphoric acid esters such as sodium laurylphosphate and sodium stearylphosphate; polyoxyethylenealkyletherphosphoric acid salts such as sodium polyoxyethylenelaurylpheterphosphate and sodium polyoxyethylenestearylpherphosphate; polyoxyethylenealkylphenyletherphosphoric acid salts such as sodium polyoxyethylenenonylphenyletherphosphate; sulfosuccinic acids; unsaturated fatty acid sulfated oils; taurine salts; salts of castor oil sulfuric acid esters; or the like.

Examples of the amphoteric surfactants may include betaine-type compounds such as N-lauryl-N,N-dimethyl-N-carboxymethyl ammonium, N-stearyl-N,N-dimethyl-N-carboxymethyl ammonium, N-lauryl-N,N-dihydroxyethyl-N-carboxymethyl ammonium and N-lauryl-N,N,N-tris (carboxymethyl) ammonium; imidazolium salts such as 2-alkyl-N-carboxymethyl-N-hydroxyethyl imidazolium; imidazolines such as imidazoline-N-sodium ethyl sulfonate and imdazoline-N-sodium ethyl sulfate; aminocarboxylic acids; aminosulfuric acid esters; or the like.

The content of the above surfactant in the positive-type photosensitive composition of the present invention is preferably 0.001 to 5% by weight, more preferably 0.002 to 3% by weight, still more preferably 0.005 to 1% by weight.

Further, the positive-type photosensitive composition may,contain various additives ordinarily used in the photosensitive composition such as coating modifiers, adhesion modifiers, sensitivity modifiers, sensitizers, development modifiers or the like in an amount of not more than 20% by weight, preferably not more than 10% by weight.

Meanwhile, the above positive-type photosensitive composition contain no compounds exhibiting a sensitivity to ultraviolet light such as onium salts, diazonium salts and quinonediazido-containing compounds and, therefore, shows substantially no sensitivity to ultraviolet light. Here, the expression "substantially no sensitivity to ultraviolet light" means that the composition has substantially no significant difference in solubility to alkali developing solution between before and after irradiation with a light having a wavelength of 360 to 450 nm, namely the composition shows substantially no practical image forming property upon the irradiation of such light.

Next, the negative-type photosensitive composition constituting the photosensitive layer is explained.

Among the negative-type photosensitive compositions used in the present invention, preferred are photopolymerizable compositions containing the following components (N-1) to (N-4):

(N-1) a high-molecular binder;
(N-2) an ethylenically unsaturated compound;
(N-3) a sensitizer; and
(N-4) a photopolymerization initiator.

The high-molecular binder (N-1) constituting the photopolymerizable composition of the present invention has a function as a binder for the ethylenically unsaturated compound (N-2), the sensitizer (N-3), the photopolymerization initiator (N-4) and the like. Examples of the high-molecular binder may include homopolymers or copolymers of (meth) acrylic acid, (meth)acrylic acid esters, (meth)acrylonitrile, (meth)acrylamide, maleic acid, styrene, vinyl acetate, vinylidene chloride and maleimide, as well as polyimides, polyesters, polyethers, polyurethane, polyvinyl butyral, polyvinyl pyrrolidone, polyethylene oxide and acetyl cellulose. Of these high-molecular binders, carboxyl-containing polymers are preferred from the standpoint of alkali developing property. Specifically, among these carboxyl-containing polymers, more preferred are copolymers of (meth)acrylic acid and (meth)acrylic acid ($C_1$ to $C_{10}$) alkyl ester, or copolymers of these components with styrene as a comonomer thereof. Such carboxyl-containing polymers preferably have an acid number of 10 to 250 and a weight-average molecular weight of 5,000 to 1,000,000.

Further, the high-molecular binders are suitably compounds having an ethylenically unsaturated bond at a side chain thereof. The ethylenically unsaturated bond is preferably represented by the following general formula (XIIa), (XIIb) or (XIIc):

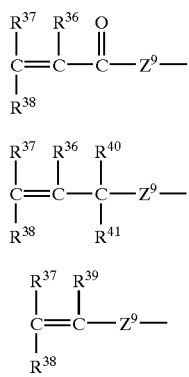

In the formulae (XIIa), (XIIb) and (XIIc), $R^{36}$ represents hydrogen atom or methyl group; $R^{37}$, $R^{38}$, $R^{39}$, $R^{40}$ and $R^{41}$ independently represent hydrogen atom, a halogen atom, amino group, a dialkylamino group, carboxyl group, an alkoxycarbonyl group, sulfo group, nitro group, cyano group, an alkyl group which may has a substituent group(s), an alkoxy group which may has a substituent group(s), an alkylmino group which may has a substituent group(s), an alkylsulfonyl group which may has a substituent group(s), an aryl group which may has a substituent group(s), an aryloxy group which may has a substituent group(s), an arylamino group which may has a substituent group(s) or an arylsulfonyl group which may has a substituent group(s); and $Z^9$ represents oxygen atom, sulfur atom, imino group or alkylimino group.

Examples of the substituent groups of the an alkyl group, an alkoxy group, an alkylamino group, an alkylsulfonyl group, aryl group, aryloxy group, arylamino group and an arylsulfonyl group as $R^{37}$ to $R^{41}$ may include an alkyl group, an alkoxy group, an alkylthio group, amino group, a dialkylamino group, nitro group, cyano group, phenyl group and a halogen atom.

The high-molecular binder having the ethylenically unsaturated bond represented by the above formula (XIIa) on a side chain thereof may be produced by reacting about 5 to 90 mol %, preferably about 30 to 70 mol % of carboxyl groups contained in the carboxyl-containing polymer, with an aliphatic epoxy-containing unsaturated compound such as allyl glycidyl ether, glycidyl (meth)acrylate, α-ethylglycidyl (meth)acrylate, glycidyl crotonate, glycidyl isocrotonate, crotonyl glycidyl ether, itaconic acid monoalkyl monoglycidyl ester, fumaric acid monoalkyl monoglycidyl ester and maleic acid monoalkyl monoglycidyl ester, or an alicyclic epoxy-containing unsaturated compound such as 3,4-epoxycyclohexylmethyl (meth) acrylate, 2,3-epoxycyclopentylmethyl (meth)acrylate, 7,8-epoxy[tricyclo[5.2.1.0]dec-2-yl] (meth)acrylate and 7,8-epoxy[tricyclo[5.2.1.0]dec-2-yl]oxymethyl (meth)acrylate, at a temperature of about 80 to 120° C. for a period of about 1 to 50 hours.

Also, the high-molecular binder having the ethylenically unsaturated bond represented by the above formula (XIIb) on a side chain thereof may be produced by copolymerizing a compound having at least two kinds of unsaturated groups, such as allyl (meth)acrylate, 3-allyloxy-2-hydroxypropyl (meth)acrylate, cinnamyl (meth)acrylate, crotonyl (meth) acrylate, methally (meth)acrylate and N,N-diallyl (meth) acrylamide, with an unsaturated carboxylic acid such as (meth)acrylic acid or with an unsaturated carboxylic acid ester, such that the content of the former compound having at least two kinds of unsaturated groups based on a total amount of the obtained copolymer is about 10 to 90 mol %, preferably about 30 to 80 mol %. In addition, the high-molecular binder having the ethylenically unsaturated bond represented by the above formula (XIIc) on a side chain thereof may be produced by copolymerizing a compound having at least two kinds of unsaturated groups, such as vinyl (meth)acrylate, 1-chlorovinyl (meth)acrylate, 2-phenylvinyl (meth)acrylate, 1-propenyl (meth)acrylate, vinyl crotonate and vinyl (meth)acrylamide, with an unsaturated carboxylic acid such as (meth)acrylic acid or with an unsaturated carboxylic acid ester, such that the content of the former compound having at least two kinds of unsaturated groups based on a total amount of the obtained copolymer is about 10 to 90 mol %, preferably about 30 to 80 mol %.

Of these high-molecular binders, preferred are alkali-soluble resins; more preferred are carboxyl-containing vinyl-based resins; and still more preferred are those resins having an ethylenically unsaturated bond on a side chain thereof.

The ethylenically unsaturated compounds as the component (N-2) of the negative-type photosensitive composition of the present invention are compounds containing at least one radical polymerizable ethylenically unsaturated bond in a molecule which are addition-polymerized, and in some cases cross-linked and cured, by the effect of a photopolymerization initiation system containing the below-mentioned photopolymerization initiator (N-4) when irradiating active rays to the composition.

As the ethylenically unsaturated compounds, there may be used those compounds having one ethylenically unsaturated bond in a molecule, for example, unsaturated carboxylic acids such as (meth)acrylic acid, crotonic acid, isocrotonic acid, maleic acid, itaconic acid and citraconic acid or alkyl esters thereof, as well as (meth)acrylonitrile, (meth)acrylamide, styrene or the like. However, from the standpoints of good polymerizability and cross-linking property as well as increased difference of solubility in developing solution between exposed and non-exposed portions, there are preferably used compounds having two or more ethylenically unsaturated bonds in a molecule. Of these compounds, more preferred are acrylate compounds having unsaturated bonds derived from (meth)acryloyloxy groups.

Typical examples of the compounds having two or more ethylenically unsaturated bonds in a molecule may include esters of unsaturated carboxylic acids and polyhydroxy compounds; (meth)acryloyloxy-containing phosphates; urethane (meth)acrylates of hydroxy (meth)acrylate compounds and polyisocyanate compounds; epoxy (meth)acrylates of (meth)acrylic acid or hydroxy (meth)acrylate compounds and polyepoxy compounds; or the like.

The esters of unsaturated carboxylic acids and polyhydroxy compounds may be reaction products obtained, for example, by reacting the above unsaturated carboxylic acid with an aliphatic polyhydroxy compound such as ethylene glycol, diethylene glycol, triethylene glycol, tetraethylene glycol, propylene glycol, tripropylene glycol, trimethylene glycol, tetramethylene glycol, neopentyl glycol, hexamethylene glycol, nonamethylene glycol, trimethylol ethane, tetramethylol ethane, trimethylol propane, glycerol, pentaerythritol, dipentaerythritol, sorbitol, ethylene oxide adducts thereof and propylene oxide adducts thereof as well as diethanol amine, triethanol amine, etc. Specific examples of the esters of unsaturated carboxylic acids and polyhydroxy compounds may include ethylene glycol di(meth)acrylate, diethylene glycol di(meth)acrylate, triethylene glycol di(meth)acrylate, tetraethylene glycol di(meth)acrylate, propylene glycol di(meth)acrylate, tripropylene glycol di(meth)acrylate, tetramethylene glycol di(meth)acrylate, neopentyl glycol di(meth)acrylate, hexamethylene glycol di(meth)acrylate, nonamethylene glycol di(meth)acrylate, trimethylolethane tri(meth)acrylate, tetramethylolethane tri(meth)acrylate, trimethylolpropane di(meth)acrylate, trimethylolpropane tri(meth)acrylate, trimethylolpropane ethylene oxide-added tri(meth)acrylate, glycerol di(meth)acrylate, glycerol tri(meth)acrylate, glycerol propylene oxide-added tri(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, sorbitol tri(meth)acrylate, sorbitol tetra(meth)acrylate, sorbitol penta(meth)acrylate, sorbitol hexa(meth)acrylate, and similar crotonates, isocrotonates, maleates, itaconates and citraconates, which are of the same sorts.

Examples of the further suitable esters may include reaction products obtained by reacting the above unsaturated carboxylic acid with an aromatic polyhydroxy compound such as hydroquinone, resorcin, pyrogallol, bisphenol F and bisphenol A, e.g., hydroquinone di(meth)acrylate, resorcin di(meth)acrylate, pyrogallol tri(meth)acrylate, etc.; reaction products obtained by reacting the above unsaturated carboxylic acid with a heterocyclic polyhydroxy compound such as tris(2-hydroxyethyl)isocyanurate, e.g., di(meth)acrylate or tri(meth)acrylate of tris(2-hydroxyethyl)isocyanurate; reaction products obtained by reacting an unsaturated carboxylic acid, a polycarboxylic acid and a polyhydroxy compound with each other, e.g., condensates of (meth)acrylic acid, phthalic acid and ethylene glycol, condensates of (meth)acrylic acid, maleic acid and diethylene glycol, condensates of (meth)acrylic acid, terephthalic acid and pentaerythritol, condensates of (meth)acrylic acid, adipic acid, butane diol and glycerin, or the like.

The (meth)acryloyloxy-containing phosphates are not particularly restricted as long as they are phosphate compounds having a (meth)acryloyloxy group. Of these phosphate compounds, preferred are those represented by the following general formula (Ia) or (Ib):

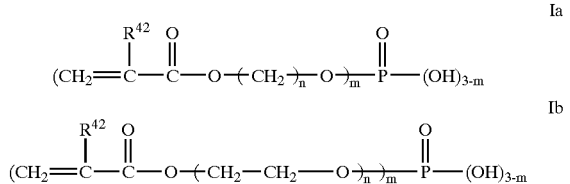

In the formulae (Ia) and (Ib), $R^{42}$ represents hydrogen atom or methyl group; n is an integer of 1 to 25; and m is 1, 2 or 3.

The n is preferably 1 to 10, more preferably 1 to 4. Specific examples of the phosphates represented by the formula (Ia) or (Ib) wherein n lies within the above-specified range, may include (meth)acryloyloxyethyl phosphate, bis[(meth)acryloyloxyethyl] phosphate, (meth)acryloyloxy ethylene glycol phosphate or the like. These phosphates may be used alone or in the form of a mixture of any two or more thereof.

Examples of the urethane (meth)acrylates may include reaction products obtained by reacting a hydroxy(meth)acrylate such as hydroxymethyl (meth)acrylate, hydroxyethyl (meth)acrylate, glycerol di(meth)acrylate, pentaerythritol tri(meth)acrylate and tetramethylolethane tri(meth)acrylate, with a polyisocyanate compound selected from aliphatic polyisocyanates such as hexamethylene diisocyanate, 2,4,4-trimethylhexamethylene diisocyanate, lysine methyl ester diisocyanate, lysine methyl ester triisocyanate, dimeric acid diisocyanate, 1,6,11-undecatriisocyanate, 1,3,6-hexamethylene triisocyanate and 1,8-diisocyanate-4-isocyanate methyl octane; alicyclic polyisocyanates such as cyclohexane diisocyanate, dimethylcyclohexane diisocyanate, 4,4'-methylenebis(cyclohexylisocyanate), isophorone diisocyanate and bicycloheptane triisocyanate; aromatic polyisocyanates such as p-phenylene diisocyanate, 2,4-tolylene diisocyanate, 2,6-tolylene diisocyanate, xylylene diisocyanate, tetramethylxylylene diisocyanate, 4,4'-diphenylmethane diisocyanate, tolidine diisocyanate, 1,5-naphthalene diisocyanate, tris(isocyanatephenylmethane) and tris(isocyanatephenyl)thiophosphate; heterocyclic polyisocyanates such as isocyanurate; or the like.

Of these urethane (meth)acrylates, preferred are those compounds having 4 or more urethane bonds [—NH—CO—O—] and 4 or more (meth)acryloyloxy groups in a molecule thereof. Such urethane (meth)acrylate compounds may be produced, for example, by reacting (i) a compound having 4 or more, preferably 6 or more isocyanate groups in a molecule, e.g., a compound (i-1) obtained by reacting a compound having 4 or more hydroxyl group in a molecule, such as pentaerythritol and polyglycerin, with a diisocyanate compound such as hexamethylene diisocyanate, trimethylhexamethylene diisocyanate, isophorone diisocyanate and tolylene diisocyanate; a compound (i-2) obtained by reacting a compound having 2 or more hydroxyl groups in a molecule, such as ethylene glycol, with a compound having 3 or more isocyanate groups in a molecule, such as buret-type compounds, e.g., "DURANETE 24A-100", "DURANETE 22A-75PX", "DURANETE 21S-75E" and "DURANETE 18H-70B" (all produced by Asahi Kasei Kogyo Co., Ltd.), and adduct-type compounds, e.g., "DURANETE P-301-75E", "DURANETE E-402-90T" and "DURANETE E-405-80T" (all produced by Asahi Kasei Kogyo Co., Ltd.); and a compound (i-3) obtained by polymerizing or copolymerizing isocyanate ethyl (meth)acrylate or the like (specific examples of the compound (i) may include "DURANETE ME20-100" produced by Asahi Kasei Kogyo Co., Ltd.), with (ii) a compound having one or more hydroxyl groups and 2 or more, preferably 3 or more (meth)acryloyloxy groups in a molecule, such as pentaerythritol di(meth)acrylate, pentaerythritol tri(meth)acrylate, dipentaerythritol di(meth)acrylate, dipentaerythritol tri(meth)acrylate, dipentaerythritol tetra(meth)acrylate and dipentaerythritol penta(meth)acrylate.

The compound (i) has a molecular weight of preferably 500 to 200,000, more preferably 1,000 to 150,000. The above urethane (meth)acrylates have a molecular weight of preferably 600 to 150,000, and contain preferably 6 or more, more preferably 8 or more urethane bonds, and preferably 6 or more, more preferably 8 or more (meth)acryloyloxy groups in a molecule.

Meanwhile, such urethane (meth)acrylates may be produced, for example, by reacting the above compounds (i) and (ii) with each other in an organic solvent such as toluene and ethyl acetate under such a condition the molar ratio of isocyanate group in the compound (i) to hydroxyl group in the compound (ii) is 1/10 to 10/1, if required in the presence of a catalyst composed of dilauric acid n-butyl tin, at a temperature of 10 to 150° C. for a period of about 5 minutes to 3 hours.

In the present invention, of these urethane (meth) acrylates, especially preferred are those represented by the following general formula (II):

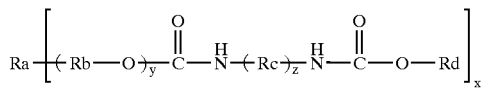

(II)

In the formula (II), Ra represents a group having a repeated structure of an alkyleneoxy group or an aryleneoxy group and 4 to 20 oxy group capable of bonding to Rb; Rb and Rc independently represent a $C_1$ to $C_{10}$ alkylene group; Rd represents an organic residue having a 1 to 10 (meth) acryloyloxy group; Ra, Rb, Rc and Rd may have a substituent group(s); x is an integer of 4 to 20; y is an integer of 0 to 15; and z is an integer of 1 to 15.

Examples of the repeated structure of alkyleneoxy groups of Ra in the formula (II) may include those derived from propylene triol, glycerin, pentaerythritol or the like. Also, examples of the repeated structure of aryleneoxy groups of Ra in the formula (II) may include those derived from pyrogallol, 1,3,5-benzene triol or the like. The alkylene groups of Rb and Rc respectively have preferably 1 to 5 carbon atoms; the (meth)acryloyloxy group of Rd has preferably 1 to 7 carbon atoms; and x is preferably 4 to 15, y is preferably 1 to 10, and z is preferably 1 to 10.

More preferably, Ra is represented by the following formula wherein k is an integer of 2 to 10; Rb and Rc independently represent dimethylene group, monomethyldimethylene group or trimethylene group; and Rd is represented by the following formula.

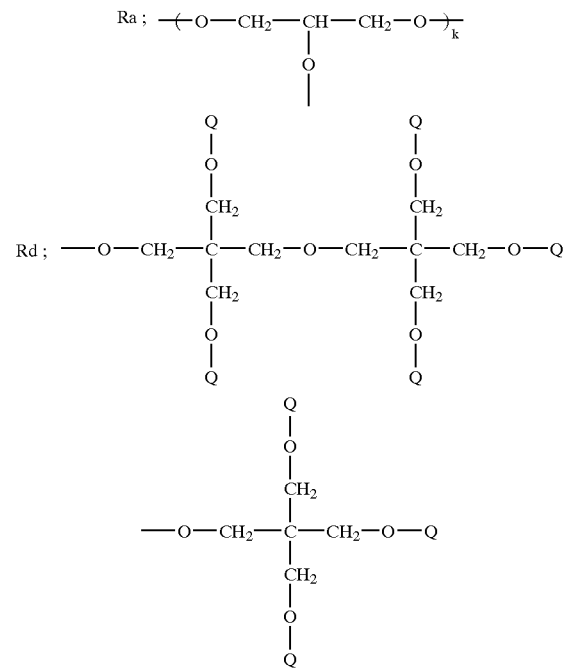

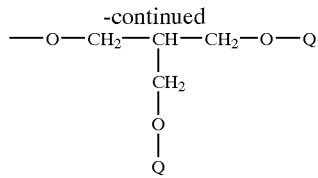

(wherein Q represents —C(=O)—CH=CH$_2$)

Also, specific examples of the epoxy(meth)acrylates may include reaction products obtained by reacting (meth)acrylic acid or the above hydroxy(meth)acrylate compound with a polyepoxy compound, e.g., aliphatic polyepoxy compounds such as (poly)ethylene glycol polyglycidyl ether, (poly) propylene glycol polyglycidyl ether, (poly)tetramethylene glycol polyglycidyl ether, (poly)pentamethylene glycol polyglycidyl ether, (poly)neopentyl glycol polyglycidyl ether, (poly)hexamethylene glycol polyglycidyl ether, (poly) trimethylolpropane polyglycidyl ether, (poly)glycerol polyglycidyl ether and (poly)sorbitol polyglycidyl ether; aromatic polyepoxy compounds such as phenol novolak polyepoxy compounds, brominated phenol novolak polyepoxy compounds, (o-, m- or p-)cresol novolak polyepoxy compounds, bisphenol A polyepoxy compounds and bisphenol F polyepoxy compounds; and heterocyclic polyepoxy compounds such as sorbitan polyglycidyl ether, triglycidyl isocyanurate and triglycidyl tris(2-hyroxyethyl) isocyanurate; or the like.

In addition to the above compounds, as the other ethylenically unsaturated compounds, there may be used, for example, (meth)acrylamides such as ethylenebis(meth) acrylamide; allyl esters such as diallyl phthalate; vinyl-containing compounds such as divinyl phthalate; or the like. These ethylenically unsaturated compounds may be used alone or in the form of a mixture of any two or more thereof.

Of the above-mentioned ethylenically unsaturated compounds (N-2), preferred are ester (meth)acrylates, (meth) acryloyloxy-containing phosphates and urethane (meth) acrylates, and more preferred are (meth)acryloyloxy-containing phosphates and urethane (meth)acrylates. The content of the (meth)acryloyloxy-containing phosphates is preferably 1 to 60% by weight, more preferably 2 to 40% by weight based on the total weight of the ethylenically unsaturated compounds (N-2). Also, the content of the urethane (meth)acrylates is preferably 0.5 to 50% by weight, more preferably 2 to 40% by weight based on the total weight of the ethylenically unsaturated compounds (N-2).

The sensitizer as the component (N-3) of the negative-type photosensitive composition are preferably light-absorbing dyes which are capable of efficiently absorbing blue ultraviolet light with a wavelength region of 350 to 1,300 nm, especially 350 to 420 nm as well as near-infrared light with a wavelength region of 600 to 1,300 nm, and have a sensitizing function for transmitting the light excitation energy to the below-mentioned photopolymerization initiator (N-4) to decompose the photopolymerization initiator, and generating active radicals inducing the polymerization of the above ethylenically unsaturated compound (N-2).

Of the above light absorbing dyes, as dyes capable of absorbing near-infrared light with a wavelength region of 600 to 1,300 nm, there may be used the same light-absorbing dyes as exemplified as to the light-heat converting material (P-2) of the positive-type photosensitive composition. Of these light-absorbing dyes, preferred are the cyanine-based dyes such as quinoline-based dyes represented by the general formulae (Ia) to (Ic), indole-based or benzothiazole-based dyes represented by the general formula (II) and pyrylium-based or thiopyrylium-based dyes represented by the general formulae (IIIa) to (IIIc), the polymethine-based dyes represented by the general formula (IV), and the phthalocyanine-based dyes represented by the general formula (IX), and more preferred are the indole-based or benzothiazole-based cyanine dyes represented by the general formula (II).

As the light absorbing dyes capable of absorbing blue-ultraviolet light with a wavelength region of 350 to 420 nm, there may be preferably used dialkylaminobenzene-based compounds. Of these compounds, preferred are dialkylaminobenzophenone-based compounds as well as such dialkylaminobenzene-based compounds having a heterocyclic substituent group which is bonded to the p-position carbon atom of the benzene ring relative to the amino group bonded thereto.

The dialkylaminobenzophenone-based compounds are preferably those compounds represented by the following general formula (Xa):

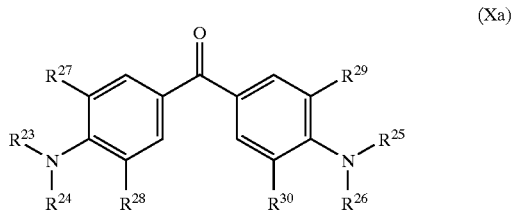

In the formula (Xa), $R^{23}$, $R^{24}$, $R^{25}$ and $R^{26}$ independently represent an alkyl group; and $R^{27}$, $R^{28}$, $R^{29}$ and $R^{30}$ independently represent an alkyl group or hydrogen atom wherein $R^{23}$ and $R^{24}$, $R^{25}$ and $R^{26}$, $R^{23}$ and $R^{27}$, $R^{24}$ and $R^{28}$, $R^{25}$ and $R^{29}$, and $R^{26}$ and $R^{30}$ may respectively form a nitrogen-containing heterocyclic ring.

The alkyl group as $R^{23}$, $R^{24}$, $R^{25}$ and $R^{26}$ as well as $R^{27}$, $R^{28}$, $R^{29}$ and $R^{30}$ in the formula (Xa) preferably has 1 to 6 carbon atoms. Also, The nitrogen-containing heterocyclic ring formed by these groups is preferably a 5- or 6-membered ring, more preferably a 6-membered ring.

Specific examples of the compounds represented by the general formula (Xa) may include 4,4'-bis(dimethylamino) benzophenone, 4,4'-bis(diethylamino) benzophenone, and compounds having the following structural formulae:

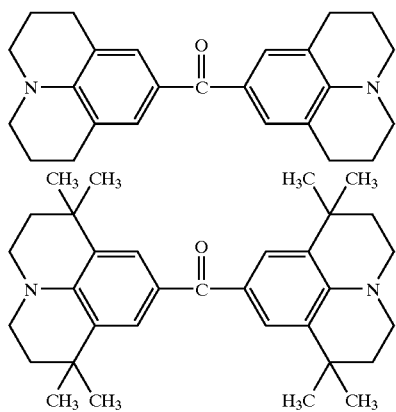

-continued

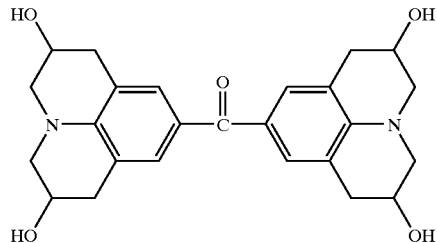

Further, in the dialkylaminobenzene-based compounds, the heterocyclic substituent group bonded to the p-position carbon atom of the benzene ring relative to the amino group bonded thereto is preferably a 5- or 6-membered ring containing nitrogen atom, oxygen atom or sulfur atom, more preferably a 5-membered ring having a condensed benzene ring. The more preferred dialkylaminobenzene-based compounds may include those compounds represented by the following general formula (Xb):

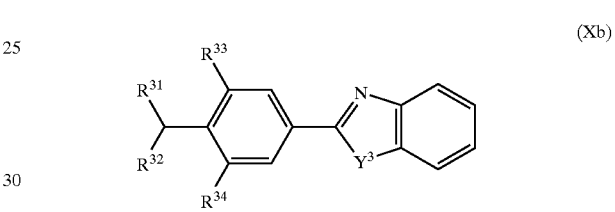

In the formula (Xb), $R^{31}$ and $R^{32}$ independently represent alkyl; $R^{33}$ and $R^{34}$ independently represent an alkyl group or hydrogen atom; $R^{31}$ and $R^{32}$, $R^{31}$ and $R^{33}$, and $R^{32}$ and $R^{34}$ may respectively form a nitrogen-containing heterocyclic ring; and $y^3$ represents oxygen atom, sulfur atom, a dialkylmethylene group, imino group or an alkylimino group; and the condensed benzene ring bonded to the heterocyclic ring containing $y^3$ may have a substituent group(s).

The alkyl group as $R^{31}$, $R^{32}$, $R^{33}$ and $R^{34}$ in the formula (xb) preferably has 1 to 6 carbon atoms. Also, The nitrogen-containing heterocyclic ring formed by these groups is preferably a 5- or 6-membered ring, more preferably a 6-membered ring. When $y^3$ is the dialkylmethylene group, each alkyl group thereof preferably has 1 to 6 carbon atoms, and when $y^3$ is an alkylimino group, the alkyl group thereof preferably has 1 to 6 carbon atoms.

Specific examples of the compounds represented by the general formula (Xb) may include 2-(p-dimethylaminophenyl)benzoxazole,
2-(p-diethylaminophenyl)benzoxazole,
2-(p-dimethylaminophenyl)benzo[4,5]benzoxazole,
2-(p-dimethylaminophenyl)benzo[6,7]benzoxazole,
2-(p-dimethylaminophenyl)benzothiazole,
2-(p-diethylaminophenyl)benzothiazole,
2-(p-dimethylaminophenyl)benzoimidazole,
2-(p-diethylaminophenyl)benzoimidazole,
2-(p-dimethylaminophenyl)-3,3-dimethyl-3H-indole,
2-(p-diethylaminophenyl)-3,3-dimethyl-3H-indole, and compounds having the following structural formula:

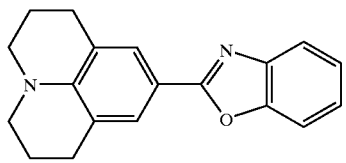

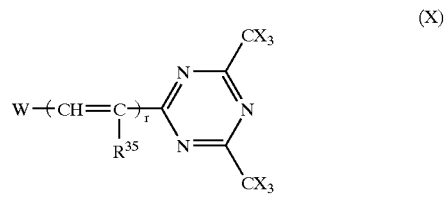

Examples of the dialkylaminobenzene-based compounds having a heterocyclic substituent group which is bonded to the p-position carbon atom of the benzene ring relative to the amino group bonded thereto, other than those represented by the general formula (Xb), may include
2-(p-dimethylaminophenyl)pyridine,
2-(p-diethylaminophenyl)pyridine,
2-(p-dimethylaminophenyl)quinoline,
2-(p-diethylaminophenyl)quinoline,
2-(p-dimethylaminophenyl)pyrimidine,
2-(p-diethylaminophenyl)pyrimidine,
2,5-bis(p-diethylaminophenyl)-1,3,4-oxadiazole,
2,5-bis(p-diethylaminophenyl)-1,3,4-thiadiazole or the like.

Further, as the sensitizers there may be used triphenylmethane-based leuco dyes as described in U.S. Pat. No. 3,479,185, such as leuco crystal violet and leuco malachite green; photoreducing dyes such as erythrosin and eosin Y; aminophenyl ketones described in U.S. Pat. Nos. 3,549, 367, and 3,652,275 such as Michler's ketone and aminostyryl ketone; β-diketones as described in U.S. Pat. No. 3,844,790; imidanones as described in U.S. Pat. No. 4,162, 162; coumarin-based dyes as described in Japanese Patent Application Laid-Open (KOKAI) Nos. 6-301208(1994), 8-129258(1994), 8-129259(1994), 8-146605(1994) and 8-211605(1994); ketocoumarin-based dyes as described in Japanese Patent Application Laid-Open (KOKAI) No. 52-112681(1977); aminostyrene derivatives or aminophenyl butadiene derivatives as described in Japanese Patent Application Laid-Open (KOKAI) No. 59-56403(1984); aminophenyl heterocyclic compounds as described in U.S. Pat. No. 4,594,310; durolysine heterocyclic compounds as described in U.S. Pat. No. 4,966,830; pyromethene-based dyes as described in Japanese Patent Application Laid-Open (KOKAI) Nos. 5-241338(1993), 7-5685(1995) and 10-144242(1998); or the like.

Also, the photopolymerization initiator as the component (N-4) of the negative-type photosensitive composition is a radical generator capable of generating active radicals when the composition is irradiated with light under the coexistence of the above sensitizer (N-3). Typical examples of the photopolymerization initiator may include halomethylated s-triazine derivatives, halomethylated 1,3,4-oxadiazole derivatives, hexaarylbiimidazole derivatives, titanocene derivatives, organoboric acid salts, diaryl iodium salts, carbonyl compounds, organic peroxides or the like. Of these photopolymerization initiators, preferred are halomethylated s-triazine derivatives, hexaarylbiimidazole derivatives and organoboric acid salts.

The halomethylated s-triazine derivatives are preferably those derivatives having at least one mono-, di-or tri-halogen-substituted methyl group bonded to the s-triazine ring, more preferably those compounds represented by the following general formula (X):

In the formula (x), $R^{35}$ represents hydrogen atom, a halogen atom, an alkyl group or an aryl group; W represents an aryl group which may has a substituent group(s) or a heterocyclic group; X is halogen atom; and r is an integer of 0 to 2.

Specific examples of the halomethylated s-triazine derivatives may include 2-methyl-4,6-bis(trichloromethyl)-s-triazine, 2-n-propyl-4,6-bis(trichloromethyl)-s-triazine, 2-(α, α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(p-methoxynaphthyl)-4,6-bis(trichloromethyl)-s-triazine, 2-(p-ethoxynaphthyl)-4,6-bis(trichloromethyl)-s-triazine, 2-(p-ethoxycarbonylnaphthyl)-4,6-bis(trichloromethyl)-s-triazine, 2-phthylthio-4,6-bis(trichloromethyl)-s-triazine, 2-benzylthio-4,6-bis(trichloromethyl)-s-triazine, 2-methyl-4,6-bis(tribromomethyl)-s-triazine, 2-methoxy-4,6-bis(tribromomethyl)-s-triazine or the like. Of these halomethylated s-triazine derivatives, preferred are 2-methyl-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine and the like.

Specific examples of the halomethylated 1,3,4-oxadiazole derivatives may include 2-(p-methoxyphenyl)-5-trichloromethyl-1,3,4-oxadiazole, 2-(p-methoxystyryl)-5-trichloromethyl-1,3,4-oxadiazole, 2-(o-benzofuryl)-5-trichloromethyl-1,3,4-oxadiazole, 2-[β-(o-benzofuryl)vinyl]-5-trichloromethyl-1,3,4-oxadiazole or the like.

Specific examples of the hexaarylbiimidazole derivatives may include 2,2'-bis(o-methoxyphenyl)-4,4',5,5'-tetraphenylbiimidazole, 2,2'-bis(p-methoxyphenyl)-4,4',5,5'-tetraphenylbiimidazole, 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-chlorophenyl)-4,4',5,5'-tetra(p-methylphenyl)biimidazole, 2,2'-bis(o-chlorophenyl)-4,4',5,5'-tetra(p-methoxyphenyl)biimidazole, 2,2'-bis(o-chlorophenyl)-4,4',5,5'-tetra(m,m-dimethoxyphenyl)biimidazole, 2,2'-bis(o-chlorophenyl)-4,4',5,5'-tetra(p-ethoxycarbonylphenyl)biimidazole, 2,2'-bis(o-bromophenyl)-4,4',5,5'-tetra(p-chloro-p-methoxyphenyl)biimidazole, 2,2'-bis(o-chlorophenyl)-4,4',5,5'-tetra(p-chlorophenyl)biimidazole, 2,2'-bis(o-chlorophenyl)-4,4',5,5'-tetra(o-, p-dichlorophenyl)biimidazole, 2,2'-bis(o-chlorophenyl)-4,4',5,5'-tetra(p-tluorophenyl)biimidazole, 2,2'-bis(o-chlorophenyl)-4,4',5,5'-tetra(o,p-dibromophenyl)biimidazole, 2,2'-bis(o, p-dichlorophenyl)-4,4',5,5'-tetra(o, p-dichlorophenyl)biimidazole, 2,2'-bis(o-bromophenyl)-4, 4',5,5'-tetra(o, p-dichlorophenyl)biimidazole, 2,2'-bis(o-bromophenyl)-4,4',5,5'-tetra(p-iodophenyl)biimidazole, 2,2'-bis(o-bromophenyl)-4,4',5,5'-tetra(o-chloro-p-methoxyphenyl)biimidazole, 2,2'-bis(o-chlorophenyl)-4,4', 5,5'-tetra(p-chloronaphthyl)biimidazole or the like. of these hexaarylbiimidazole derivatives, preferred are hexaphenylbiimidazole derivatives; more preferred are those in which the hydrogen atom of the o-position of each benzene ring bonded to the 2- and 2'-positions of the imidazole rings is substituted with halogen; still more preferred are those in which the benzene rings bonded to the 4, 4', 5 and 5'-positions of the imidazole rings are unsubstituted, or hydrogen atoms of the benzene rings bonded to the 4, 4', 5 and 5'-positions of the imidazole rings are substituted with a halogen atom or an alkoxycarbonyl group.

Specific examples of the titanocene derivatives may include dicyclopentadienyl titanium dichloride, dicyclopentadienyl titanium biphenyl, dicyclopentadienyl titanium bis (2,4-difluorophenyl), dicyclopentadienyl titanium bis(2,6-difluorophenyl), dicyclopentadienyl titanium bis(2,4,6-trifluorophenyl), dicyclopentadienyl titanium bis(2,3,5,6-tetrafluorophenyl), dicyclopentadienyl titanium bis(2,3,4,5, 6-pentafluorophenyl), di(methylcyclopentadienyl) titanium bis(2,4-difluorophenyl), di(methylcyclopentadienyl) titanium bis(2,6-difluorophenyl), di(methylcyclopentadienyl) titanium bis(2,4;6-trifluorophenyl), di(methylcyclopentadienyl) titanium bis(2,3,5,6-tetrafluorophenyl), di(methylcyclopentadienyl) titanium bis (2,3,4,5,6-pentafluorophenyl), dicyclopentadienyl titanium bis[2,6-difluoro-3-(1-pyrroryl)phenyl] or the like. Of these titanocene derivatives, preferred are those derivatives having a dicyclopentadienyl structure and a biphenyl structure; and more preferred are those derivatives having a biphenyl ring whose o-position is substituted with halogen.

Further, the above organoboric acid salts are preferably represented by the following general formula (XI):

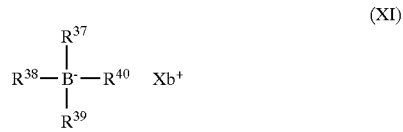

(XI)

In the formula (XI), $R^{37}$, $R^{38}$, $R^{39}$ and $R^{40}$ independently represent an alkyl group which may has a substituent group(s), an alkenyl group which may has a substituent group(s), an alkynyl group which may has a substituent group(s), an aryl group which may has a substituent group(s) or a heterocyclic group, wherein these groups may be bonded to each other to form a ring structure and at least one of these groups is an alkyl group which may has a substituent group(s); and Xb+is a counter cation.

The alkyl groups as $R^{37}$, $R^{38}$, $R^{39}$ and R40 in the formula (XI) have usually 1 to 15, preferably 1 to 5 carbon atoms. The alkenyl group or alkynyl group as $R^{37}$, $R^{38}$, $R^{39}$ and $R^{40}$ in the formula (XI) have usually 2 to 15, preferably 2 to 5 carbon atoms. The aryl group as $R^{37}$, $R^{38}$, $R^{39}$ and $R^{40}$ in the formula (XI) have usually 6 to 20, preferably 6 to 15 carbon atoms. The heterocyclic group as $R^{37}$, $R^38$, $R^{39}$ and $R^{40}$ in the formula (XI) have usually 4 to 20, preferably 4 to 15 carbon atoms. Examples of substituent groups of $R^{37}$, $R^{38}$, $R^{39}$ and $R^{40}$ in the formula (XI) may include a halogen atom, an alkyl group, an alkoxy group, a trifluoromethyl group, a trimethylsilyl group or the like.

Specific examples of organoboron anions of the organoboric acid salts represented by the formula (XI) may include n-butyl-methyl-diphenyl boron anion, n-butyl-triphenyl boron anion, n-butyl-tris(2,4,6-trimethylphenyl) boron anion, n-butyl-tris(p-methoxyphenyl) boron anion, n-butyl-tris(p-fluorophenyl) boron anion, n-butyl-tris(m-fluorophenyl) boron anion, n-butyl-tris(3-fluoro-4-methylphenyl) boron anion, n-butyl-tris(2,6-difluorophenyl) boron anion, n-butyl-tris(2,4,6-trifluorophenyl) boron anion, n-butyl-tris(2,3,4,5,6-pentafluorophenyl) boron anion, n-butyl-tris(p-chlorophenyl) boron anion, n-butyl-tris (trifluorophenyl) boron anion, n-butyl-tris(2,6-difluoro-3-pyrrorylphenyl) boron anion or the like.

Examples of the counter cation Xb+ may include alkali metal cations, onium cations such as ammonium cation, phosphonium cation, sulfonium cation and iodonium cation as well as pyrylium cation, thiapyrylium cation, indolium cation or the like. Of these, preferred are organoammonium cations such as tetraalkyl ammonium cation. Further, in the present invention, as the method of allowing the organoboric acid salts as the photopolymerization initiator (N-4) to exist in the photosensitive composition, there may be used the ordinary method of blending a salt of the organoboron cation of the organoboric acid salt and an appropriately selected counter cation therein as well as the method of blending a salt formed from organoboron cation of the organoboric acid salt and dye cation of the sensitizer (N-3) therein.

In the present invention, the contents of the alkali-soluble resin (N-1), the ethylenically unsaturated compound (N-2), the sensitizer (N-3) and the polymerization initiator (N-4) in the negative-type photosensitive composition are as follows. That is, the content of the alkali-soluble resin (N-1) is preferably 10 to 400 parts by weight, more preferably 20 to 200 parts by weight based on 100 parts by weight of the ethylenically unsaturated compound (N-2). The content of the sensitizer (N-3) is preferably 0.01 to 20 parts by weight, more preferably 0.05 to 10 parts by weight based on 100 parts by weight of the ethylenically unsaturated compound (N-2). The content of the photopolymerization initiator (N-4) is preferably 0. 1 to 80 parts by weight, more preferably 0. 5 to 60 parts by weight based on 100 parts by weight of the ethylenically unsaturated compound (N-2).

In addition, the negative-type photosensitive composition may contain a hydrogen-donating compound (N-5) for the purpose of improving a photopolymerization initiating capability thereof. Examples of the hydrogen-donating compound may include mercapto-containing compounds such as 2-mercaptobenzothiazole, 2-mercaptobenzoimidazole, 2-mercaptobenzoxazole, 3-mercapto-1,2,4-triazole, 2-mercapto-4(3H)-quinazoline, β-mercaptonaphthalene, ethylene glycol dithiopropionate, trimethylolpropane tristhiopropionate and pentaerythritol tetrakisthiopropionate; polyfunctional thiol compounds such as hexane dithiol, trimethylolpropane tristhioglyconate and pentaerythritol tetrakisthiopropionate; aromatic ring-containing amino acids or derivatives thereof such as N,N-dialkylaminobenzoic acid ester, N-phenyl glycin or its derivatives including its salts, e.g., ammonium salts and sodium salts, and its esters, and phenyl alanine or its derivatives including its salts, e.g., ammonium salts or sodium salts, and its esters; or the like. Of these hydrogen-donating compounds, preferred are mercapto-containing compounds, and N-phenyl glycin or its derivatives including its salts, e.g., ammonium salts and sodium salts, and its esters.

In the present invention, the content of the hydrogen-donating compound (N-5) in the negative-type photosensitive composition is preferably 0.1 to 50 parts by weight, more preferably 0.5 to 30 parts by weight based on 100 parts by weight of the ethylenically unsaturated compound (N-2).

Also, the negative-type photosensitive composition may contain an amine compound (N-6) in order to impart a good keeping stability thereto. As the amine compound, there may be used aliphatic, alicyclic or aromatic amines. The amine compounds may be in the form of not only monoamines but also polyamines such as diamines or triamines, and in the form of primary, secondary or tertiary amines. Of these amine compounds, preferred are those amine compounds having a pKb value of not more than 7.

Specific examples of the amine compounds may include aliphatic amines which may be substituted with hydroxyl or phenyl, such as butyl amine, dibutyl amine, tributyl amine, amyl amine, diamyl amine, triamyl amine, hexyl amine, dihexyl amine, trihexyl amine, allyl anine, diallyl amine, triallyl amine, triethanol amine, benzyl amine, dibenzyl amine and tribenzyl amine. Of these amine compounds, preferred are tribenzyl amine.

In the present invention, the content of the amine compound (N-6) in the negative-type photosensitive composition is preferably 0.1 to 20 parts by weight, more preferably 0.5 to 10 parts by weight based on 100 parts by weight of the ethylenically unsaturated compound (N-2).

Further, the negative-type photosensitive composition may contain various additives, for example, a thermal polymerization inhibitor such as hydroquinone, p-methoxy phenol and 2,6-di-t-butyl-p-cresol in an amount of not more than 2 parts by weight based on 100 parts by weight of the ethylenically unsaturated compound (N-2); a colorant composed of organic or inorganic dyes and pigments in an amount of not more than 20 parts by weight based on 100 parts by weight of the ethylenically unsaturated compound (N-2); a plasticizer such as dioctyl phthalate, didodecyl phthalate and tricresyl phosphate in an amount of not more than 40 parts by weight based on 100 parts by weight of the ethylenically unsaturated compound (N-2); a sensitivity modifier such as tertiary amines and thiols, a coating modifier such as fluorine-based surfactants and a development accelerator, respectively, in an amount of not more than 10 parts by weight based on 100 parts by weight of the ethylenically unsaturated compound (N-2); and a dye precursor in an amount of not more than 30 parts by weight based on 100 parts by weight of the ethylenically unsaturated compound (N-2).

In the present invention, the above photosensitive composition may be used in the form of a solution or a dispersion prepared by dissolving or dispersing the respective components in a suitable solvent. The thus obtained solution or dispersion is coated on the surface of the aluminum substrate, heated and then dried to form a photosensitive layer composed of the photosensitive composition on the surface of the aluminum substrate, thereby obtaining a photosensitive lithographic plate.

The solvent used above is not particularly restricted as long as it has a sufficient solubility in the components used in the photosensitive composition as well as a good coating property. Examples of the solvent may include cellosolve-based solvents such as methyl cellosolve, ethyl cellosolve, methyl cellosolve acetate and ethyl cellosolve acetate; propylene glycol-based solvents such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate and dipropylene glycol dimethyl ether; ester-based solvents such as butyl acetate, amyl acetate, ethyl butyrate, butyl butyrate, diethyl oxalate, ethyl pyruvate, ethyl-2-hydroxybutyrate, ethyl acetoacetate, methyl lactate, ethyl lactate and methyl 3-methoxypropionate; alcohol-based solvents such as heptanol, hexanol, diacetone alcohol and furfuryl alcohol; ketone-based solvents such as cyclohexanone and methyl amyl ketone; high-polar solvents such as dimethylformamide, dimethylacetamide and N-methyl pyrrolidone; mixed solvents thereof; the above solvents containing aromatic hydrocarbons; or the like. The weight ratio of the solvent used to the whole components of the photosensitive composition is usually in the range of about 1:1 to 20:1.

The coating of the photosensitive composition onto the aluminum substrate may be conducted by conventionally known methods such as, for example, rotation coating, wire bar coating, dip coating, air knife coating, roll coating, blade coating, curtain coating or the like. The coating amount of the photosensitive composition may vary depending upon applications or uses thereof, and the dry thickness of the obtained coating film is usually 0.3 to 7 $\mu$m, preferably 0.5 to 5 $\mu$m, more preferably 1 to 3 $\mu$m. The drying temperature used for forming the coating film is, for example, about 60 to 170° C., preferably about 70 to 150° C., and the drying time is, for example, about 5 seconds to 10 minutes, preferably about 10 seconds to 5 minutes.

Meanwhile, in the negative-type photosensitive lithographic plate of the present invention, an oxygen-shielding layer may be formed on the photosensitive layer composed of the photosensitive composition which is formed on the surface of the aluminum substrate, in order to prevent the photopolymerizable composition from undergoing a polymerization-inhibiting effect by oxygen.

The oxygen-shielding layer may be constituted from water-soluble polymers which are soluble in water, or a mixed solvent composed of water and alcohol such as methanol, ethanol, propanol and isononyl alcohol or a water-miscible organic solvent such as tetrahydrofuran. Specific examples of the water-soluble polymers may include polyvinyl alcohol and its derivatives including partially acetalated products, products modified with cations such as quaternary ammonium salts and products modified with anions such as sodium sulfonate, as well as polyvinyl pyrrolidone, polyethylene oxide, methyl cellulose, carboxymethyl cellulose, hydroxyethyl cellulose, hydroxypropyl cellulose or the like.

Among these water-soluble polymers used in the oxygen-shielding layer, polyvinyl alcohol and its derivatives are preferred from the standpoint of good oxygen-shielding property, and further such polyvinyl alcohol and its derivatives having a saponification degree of not less than 70 mol %, preferably not less than 80 mol % and a weight-average molecular weight of 2,000 to 500,000, preferably 4,000 to 100,000 are more preferred.

Also, the above oxygen-shielding layer may contain the polyvinyl alcohol or its derivatives in an amount of preferably not less than 30% by weight, more preferably 40 to 100% by weight. Further, in order to enhance adhesion to the photosensitive layer, the preferred oxygen-shielding layer may also contain vinyl pyrrolidone-based polymers such as polyvinyl pyrrolidone and vinyl pyrrolidone-vinyl acetate copolymer, acrylic polymer emulsions, diisocyanate compounds, p-toluenesulfonic acid, hydroxyacetic acid or the like. Of these compounds, preferred are vinyl pyrrolidone-based polymers. In this case, the oxygen-shielding layer of the present invention may contain the vinyl pyrrolidone-based polymers in an amount of preferably 0.1 to 70% by weight, more preferably 5 to 60% by weight.

Further, the oxygen-shielding layer may preferably contain organic acids such as succinic acid or organic acid salts such as ethylene diamine tetraacetic acid from the standpoint of good keeping property, as well as various additives, e.g., nonionic surfactants such as polyoxyethylene alkylphenyl ether, anionic surfactants such as sodium dodecylbenzenesulfonate, cationic surfactants such as alkyltrimethyl ammonium chloride, defoaming agents, dyes, plasticizers, pH controllers or the like. The total content of these organic acids, organic acid salts and additives is preferably not more than 10% by weight, more preferably not more than 5% by weight.

The above oxygen-shielding layer may be formed by coating its composition in the form of an aqueous solution or a solution in mixed solvent of water and water-miscible organic solvent by the same method as used for production of the above photosensitive layer. The coating amount of the oxygen-shielding layer is preferably 1 to 10 g/m$^2$, more preferably 1.5 to 7 g/m$^2$ (calculated as the dry basis weight).

The apparatus of the present invention may be suitably applied to methods using the above photosensitive plate material composed of the above positive-type or negative-type photosensitive composition, but may also be applied to methods using other photosensitive plate materials. The other photosensitive plate materials may include various conventionally known photosensitive plate materials (polymers) capable of forming image patterns having ink-receiving regions and ink-repelling regions (water-receiving regions) by irradiating multi-beam laser from the exposure mechanism (5). Such photosensitive plate materials (polymers) may be dissolved in suitable solvents upon use.

The photosensitive layer of the photosensitive lithographic plate which is formed by coating the above photosensitive composition on the surface of the substrate, is subjected to scanning exposure to light emitted from the laser source, and then developed with an alkali developing solution to obtain a lithographic plate having images thereon.

As the laser sources, there may be used, for example, HeNe laser, argon ion laser, YAG laser, HeCd laser, semiconductor laser, ruby laser or the like. Of these laser sources, preferred are laser sources capable of emitting laser light in blue ultraviolet region with a wavelength of 400 to 420 nm, and laser sources capable of emitting laser light in near-infrared region with a wavelength of 600 to 1,300 nm. Specific examples of these laser sources may include indium gallium nitride semiconductor laser emitting laser light with a wavelength of 410 nm as the former type laser, and the semiconductor laser emitting laser light with a wavelength of 1,064 nm and YAG laser emitting laser light with a wavelength of 830 nm as the latter type laser, though not particularly limited thereto.

Also, although the scanning exposure method is not particularly restricted, examples of the scanning exposure method may include plane scanning exposure method, outer surface drum scanning exposure method, inner surface drum scanning exposure method or the like. The output light intensity in the former wavelength range of 400 to 420 nm is usually 1 to 100 mW, preferably 3 to 70 mW, and the output light intensity in the latter wavelength range of 600 to 1,300 nm is usually 0.1 to 100 mW, preferably 0.5 to 70 mW; the beam spot diameter in both the former and latter wavelength ranges is usually 2 to 30 $\mu$m, preferably 4 to 20 $\mu$m; and the scanning speed in the former wavelength range is usually 50 to 500 m/sec, preferably 100 to 400 m/sec, and the scanning speed in the latter wavelength range is usually 0.1 to 500 m/sec, preferably 0.3 to 400 m/sec. In addition, the scanning exposure may be conducted such that the laser exposure amount on the photosensitive layer is usually 1 to 100 $\mu$J/cm$^2$, preferably 5 to 50 $\mu$J/cm$^2$ in the former wavelength range, and usually 1 to 200 mJ/cm$^2$, preferably 5 to 150 mJ/cm$^2$ in the latter wavelength range.

The development treatment after the above laser scanning exposure may be conducted using an alkali developing solution. As the alkali developing solution, there may used, for example, an aqueous solution containing about 0.1 to 5% by weight of an inorganic alkali salt such as sodium silicate, potassium silicate, lithium silicate, ammonium silicate, sodium metasilicate, potassium metasilicate, sodium hydroxide, potassium hydroxide, lithium hydroxide, sodium carbonate, sodium hydrogen carbonate, potassium carbonate, sodium secondary phosphate, sodium tertiary phosphate, ammonium secondary phosphate, ammonium tertiary phosphate, sodium borate, potassium borate and ammonium borate, or an organic amine compound such as monomethyl amine, dimethyl amine, trimethyl amine, monoethyl amine, diethyl amine, triethyl amine, monoisopropyl amine, diisopropyl amine, monobutyl amine, monoethanol amine, diethanol amine, triethanol amine, monoisopropanol amine and diisopropanol amine.

Among them, preferred alkali developing solutions usable for production of the positive-type lithographic plate are those containing an alkali metal silicate as an inorganic alkali salt such as sodium silicate and potassium silicate. Further, it is preferred that the alkali developing solution contains the alkali metal silicate in an amount of 0.1 to 5% by weight (calculated as silicon dioxide), and the molar ratio ($[SiO_2]/[M]$) of silicon dioxide ($[SiO_2]$) to alkali metal ($[M]$) is 0.1 to 1.5, and it is more preferred that the alkali developing solution contains the alkali metal silicate in an amount of 0.2 to 3% by weight (calculated as silicon dioxide), and the molar ratio ($[SiO_2]/[M]$) of silicon dioxide ($[SiO_2]$) to alkali metal ($[M]$) is 0.2 to 1.0.

Also, the alkali developing solution may preferably contain a nonionic, anionic, cationic or amphoteric surfactant in order to attain stable broader developing conditions.

Specific examples of the nonionic surfactant may include alcohols such as cetanol, stearyl alcohol, behenyl alcohol, ethylene glycol and glycerin; polyethylene glycols such as polyethylene glycol and polyethylene glycol polypropylene glycol block copolymer; polyethylene glycol alkyl ethers such as polyethylene glycol cetyl ether, polyethylene glycol stearyl ether, polyethylene glycol oleyl ether and polyethylene glycol behenyl ether; polyethylene glycol polypropylene glycol alkyl ethers such as polyethylene glycol polypropylene glycol cetyl ether and polyethylene glycol polypropylene glycol decyltetradecyl ether; polyethylene glycol alkylphenyl ethers such as polyethylene glycol octylphenyl ether and polyethylene glycol nonylphenyl ether; polyethylene glycol fatty acid esters such as ethylene glycol monostearate, ethylene glycol distearate, diethylene glycol stearate, polyethylene glycol distearate, polyethylene glycol monolaurate, polyethylene glycol monostearate and polyethylene glycol monooleate; glycerin fatty acid esters and polyethylene oxide adducts thereof such as glyceryl monomyristate, glyceryl monostearate, glyceryl monoisostearate, glyceryl distearate, glyceryl monooleate and glyceryl dioleate; pentaerythritol fatty acid esters and polyethylene oxide adducts thereof such as pentaerythritol monostearate, pentaerythritol tristearate, pentaerythritol monooleate and pentaerythritol trioleate; sorbitan fatty acid esters and polyethylene oxide adducts thereof such as sorbitan monopalmitate, sorbitan monostearate, sorbitan tristearate, sorbitan monooleate and sorbitan trioleate; sorbitol fatty acid esters and polyethylene oxide adducts thereof such as sorbitol monolaurate, sorbitol tetrastearate, sorbitol hexastearate and sorbitol tetraoleate; polyethylene glycol alkyl amines; polyethylene glycol alkylamino ethers; polyethylene oxide adducts of castor oil; polyethylene oxide adducts of lanolin; or the like. Of these nonionic surfactants, preferred are alcohols, polyethylene glycol polypropylene glycol alkyl ethers and polyethylene glycol alkylphenyl ethers.

Specific examples of the anionic surfactant may include higher fatty acid salts such as sodium laurate, sodium stearate and sodium oleate; alkylsulfonic acid salts such as sodium laurylsulfonate; alkylbenzenesulfonic acid salts such as sodium dodecylbenzenesulfonate; alkylnaphthalenesulofonic acid salts such as sodium isopropylnaphthalenesulfonate; alkyl diphenyl ether disulfonic acid salts such as sodium alkyl diphenyl ether disulfonate; polyoxyethylene alkyl ether sulfonic acid salts such as sodium polyoxyethylene lauryl ether sulfonate; salts of alkyl sulfuric acid esters such as sodium lauryl sulfate and sodium stearyl sulfate; salts of higher alcohol sulfuric acid esters such as sodium octyl alcohol sulfate, sodium lauryl alcohol sulfate and ammonium lauryl alcohol sulfate; salts of aliphatic alcohol sulfuric acid esters such as sodium acetyl alcohol sulfate; polyoxyethylene alkyl ether sulfuric acid salts such as sodium polyoxyethylene lauryl ether sulfate, ammonium polyoxyethylene lauryl ether sulfate and triethanolamine polyoxyethylene lauryl ether sulfate; polyoxyethylene alkylphenyl ether sulfuric acid salts such as sodium polyoxyethylene nonylphenyl ether sulfate; salts of alkyl phosphoric acid esters such as sodium lauryl phosphate and sodium stearyl phosphate; polyoxyethylene alkyl ether phosphoric acid salts such as sodium polyoxyethylene lauryl ether phosphate and sodium polyoxyethylene stearyl ether phosphate; polyoxyethylene alkylphenyl ether phosphoric acid salts such as sodium polyoxyethylene nonylphenyl ether phosphate; sulfosuccinic acids; unsaturated fatty acid sulfated oils; taurine salts; salts of castor oil sulfuric acid ester; or the like. Of these anionic surfactants, preferred are alkylbenzenesulfonic acid salts, alkylnaphthalenesulfonic acid salts and salts of alkyl phosphoric acid esters.

Specific examples of the cationic surfactant may include quaternary ammonium salts such as lauryltrimethylammonium chloride, cetyltrimethylammonium chloride, stearyltrimethylammonium chloride, behenyltrimethylammonium chloride, distearyldimethylammonium chloride and lanolin-derived quaternary ammonium salts; imidazoline derivatives such as 2-octadecyl-hydroxyethyl-2-imidazoline; amine salts such as N,N-diethylstearamide-methylamine hydrochloride and polyoxyethylene stearylamine; or the like. Of these cationic surfactants, preferred are quaternary ammonium salts.

Specific examples of the amphoteric surfactant may include betaine-type compounds such as N-lauryl-N,N-dimethyl-N-carboxymethyl ammonium, N-stearyl-N,N-dimethyl-N-carboxymethyl ammonium, N-lauryl-N,N-dihydroxyethyl-N-carboxymethyl ammonium and N-lauryl-N,N,N-tris(carboxymethyl) ammonium; imidazolium salts such as 2-alkyl-N-carboxymethyl-N-hydroxyethyl imidazolium; imidazolines such as imidazoline-N-sodium ethyl sulfonate and imidazoline-N-sodium ethyl sulfate; aminocarboxylic acids; aminosulfuric acid esters; or the like. Of these amphoteric surfactants, preferred are betaine-type compounds.

Among the above surfactants, preferred are nonionic surfactants, anionic surfactants and amphoteric surfactants, and more preferred are amphoteric surfactants, especially betaine-type compounds. The content of the above surfactant in the alkali developing solution is preferably 0.0001 to 20% by weight, more preferably 0.0005 to 10% by weight, still more preferably 0.001 to 5% by weight.

Further, the alkali developing solution may also contain, if required, various additives including water-soluble organic solvents such as polyhydric alcohols, aromatic alcohols and alicyclic alcohols; water softeners such as polyphosphates, aminopolycarboxylic acid salts and organosulfonic acid salts; reducing agents such as phenol compounds, amine compounds, sulfites, phosphites and thiophosphates; chelating agents such as organophosphonic acids, phosphonoalkanetricarboxylic acids and salts thereof; pH controllers such as alkali-soluble mercapto compounds or thioether compounds, inorganic acids, organic acids and salts thereof; defoaming agents such as organosilane compounds; or the like. The content of these additives in the alkali developing solution is preferably 0.001 to 5% by weight, more preferably 0.005 to 3% by weight. Also, the alkali developing solution preferably has a pH value of not less than 10.

Meanwhile, the development treatment may be usually conducted by conventionally known methods, e.g., by dipping the photosensitive lithographic plate in the developing solution or by spraying the developing solution onto the photosensitive lithographic plate. The development treatment may be usually conducted at a temperature of preferably about 10 to 50° C., more preferably about 15 to 45° C. for a period of about 5 seconds to 10 minutes. In this case, the oxygen-shielding layer may be previously removed with water, or may be removed upon the development treatment.

As the development method, there may be used a so-called penetration development method of impregnating a penetrant such as the above alkali developing solution, the above surfactant or water-soluble organic solvent added to the alkali developing solution as well as a solution containing these materials into the exposed photosensitive layer, followed by, if required, applying physical stimulus thereto, to swell and dissolve non-image portions, thereby removing the non-image portions from the surface of the substrate as described in Japanese Patent Application Laid-Open (KOAKI) No. 11-10827(1999), or a so-called printing development method of fitting a photosensitive lithographic plate onto a plate cylinder of a printing machine, supplying an printing ink to the photosensitive layer, and transferring the ink together with non-image portions to a blanket cylinder by using an adhesiveness of the ink to release the non-image portions from the surface of the substrate as described in Japanese Patent Application Laid-Open (KOAKI) No. 10-333321(1998).

After the lithographic plate on which images are formed by the above development treatment is used for printing, the image portions are removed to regenerate the printing plate. In such a regeneration procedure, the images are removed using a release agent to regenerate the aluminum substrate. In the present invention, it is important that an aqueous alkali solution having a pH value of not less than 10, preferably 11 to 14, is used as the release agent for removing the images. When the pH value of the release agent is less than 10, the photosensitive layer may fail to be sufficiently removed, resulting in residual photosensitive layer on the surface of the substrate. In addition, when a photosensitive layer is formed again on the surface of the substrate after the removal treatment, the difference in hydrophilic property between the image and non-image portions on the substrate becomes considerably large, thereby causing such a tendency that the obtained prints undergo uneven image concentration.

The above release agent is in the form of an aqueous solution containing at least an alkali agent, preferably an aqueous solution containing a nonionic, anionic or amphoteric surfactant in addition to the alkali agent, more preferably an aqueous solution containing a water-soluble organic solvent in addition to the alkali agent and the surfactant. The above alkali agent largely contributes to release of the photosensitive images, whereas the surfactant and the water-soluble organic solvent have a function for swelling the photosensitive layer and allowing the alkali agent to be penetrated thereinto.

As the alkali agent contained in the release agent, there may be used, for example, an alkali developing solution composed of an aqueous solution containing an inorganic alkali salt such as sodium silicate, potassium silicate, lithium silicate, ammonium silicate, sodium metasilicate, potassium metasilicate, sodium hydroxide, potassium hydroxide, lithium hydroxide, sodium carbonate, sodium hydrogen carbonate, potassium carbonate, sodium secondary phosphate, sodium tertiary phosphate, ammonium secondary phosphate, ammonium tertiary phosphate, sodium borate, potassium borate and ammonium borate, or an organoamine compound such as monomethyl amine, dimethyl amine, trimethyl amine, monoethyl amine, diethyl amine, triethyl amine, monoisopropyl amine, diisopropyl amine, monobutyl amine, monoethanol amine, diethanol amine, triethanol amine, monoisopropanol amine and diisopropanol amine in an amount of usually 0.01 to 20% by weight, preferably 0.1 to 10% by weight, more preferably 0.1 to 5% by weight. Of these alkali agents, preferred are organoamine compounds such as triethanol amine and diethanol amine.

As the surfactant contained in the release agent, there may be used various anionic, nonionic, cationic and amphoteric surfactants. Examples of the anionic surfactants may include fatty acid salts such as sodium laurylsulfate (Emal 0), sodium higher alcohol sulfate (Emal 40 Paste), triethanolamine laurylsulfate (Emal TD), ammonium laurylsulfate (Emal AD·25R), sodium dodecylbenzenesulfonate (Neoberex No. 25); alkylsulfuric acid ester salts; and alkylbenzenesulfonic acid salts.

Examples of the anionic surfactants may include alkylnaphthalenesulfonic acid salts such as sodium alkylnaphthalenesulfonate (Berex NB·L), sodium dialkylsulfosuccinate (Berex OT·P), sodium alkyl diphenyl ether disulfonate (Berex SS·L), potassium alkylphosphonate (Electrostripper F), sodium polyoxyethylene lauryl ether sulfate (Emal 20C), triethanolamine polyoxyethylene alkyl ether sulfate (Emal 20T) and polyoxyethylene alkyl aryl ether (Levenol WZ); alkylsulfosuccinic acid salts; and alkyl diphenyl ether disulfonic acid salts. Examples of the further anionic surfactants may include naphthalenesulfonic acid formalin condensates such as a sodium salt of β-naphthalenesulfonic acid formalin condensate (Demol N), a sodium salt of special aromatic sulfonic acid formalin condensate (Demol MS), special polycarboxylic acid type high molecular weight surfactant (Demol EP); other special polycarboxylic acid type high molecular weight surfactants; or the like.

Examples of the nonionic surfactants may include polyoxyethylene alkyl ethers and polyoxyethylene alkyl aryl ethers such as polyoxyethylene lauryl ether (Emalgen 104P), polyoxyethylene cetyl ether (Emalgen 210P), polyoxyethylene stearyl ether (Emalgen 306P), polyoxyethylene oleyl ether, polyoxyethylene higher alcohol ethers and polyoxyethylene nonylphenyl ether (Emalgen 903). As the nonionic surfactants, there may also be used polyoxyethylene derivatives such as polyoxyethylene derivatives (Emalgen A-60), sorbitan monolaurate (Reodol SP·L10), sorbitan monolaurate (Reodol Super SP·L10) and sorbitan disteabate (Emazole S·20); oxyethylene oxypropylene block copolymers; and sorbitan fatty acid esters.

Examples of the further nonionic surfactants may include polyoxyethylene sorbitan fatty acid esters such as polyoxyethylene sorbitan monolaurate (Reodol TW-L120), polyoxyethylene sorbitol tetraoleate (Reodol 430) and glycerol monostearate; polyoxyethylene sorbitol fatty acid esters; and glycerin fatty acid esters. Further, as the still other nonionic surfactants, there may also be used polyoxyethylene fatty acid esters such as polyethylene glycol monolaurate (Emanone 1112), polyoxyethylene alkylamine (Amito 105) and alkyl alkanol amide (Aminone PK·02S); polyoxyethylene alkyl amines; and alkyl alkanol amines.

Examples of the anionic surfactants and the amphoteric surfactants may include alkyl amines, quaternary ammonium salts, alkyl betaines and amine oxides such as stearyl amine acetate (Acetamine 86), lauryltrimethyl ammonium chloride (Coatamine 24P), cetyltrimethyl ammonium chloride (Coatamine 60W), distearyldimethyl ammonium chloride (Coatamine D86R), alkylbenzyldimethyl ammonium chloride (Samizole C), lauryl betaine (Anhitol 24B), lauryldimethyl amine oxide (Anhitol 20N) and laurylcarboxymethylhydroxyethyl imidazolium betaine (Anhitol 20Y). Meanwhile, the names in parentheses after the respective surfactants indicate tradenames of commercially available products all produced by Kao Co., Ltd.

Also, as the water-soluble organic solvent added to the release agent solution, there may be used water-soluble organic solvents such as isopropyl alcohol, benzyl alcohol, ethyl cellosolve, butyl cellosolve, phenyl cellosolve, propyl glycol and diacetone alcohol. The total amount of the surfactant and water-soluble organic solvent added to the release agent is usually 0.01 to 50% by weight, preferably 0.1 to 20% by weight, more preferably 0.1 to 10% by weight.

The release step may be usually conducted by conventionally known methods such as dipping the photosensitive lithographic plate in the above release agent solution or coating the release agent solution onto the photosensitive lithographic plate. Such procedures may be usually conducted at a temperature of preferably about 10 to 50° C., more preferably about 15 to 45° C. for a period of about 5 seconds to 10 minutes.

In an alternate release method, a penetrant such as the above alkali developing solution, the above surfactant and water-soluble organic solvent added to the alkali developing solution and a solution containing these materials is impregnated into the photosensitive layer after printing, followed by, if required, applying physical stimulus thereto.

In the present invention, after the aluminum substrate is regenerated by removing images therefrom by using the above release agent, a photosensitive layer is formed again on the surface of the regenerated aluminum substrate to reproduce a photosensitive lithographic plate. In accordance with the present invention, by using the above-mentioned compounds as the release agent for removing image portions of the lithographic plate after printing, it is possible to readily and surely remove the image portions, and prevent the residual printing ink remaining onto the image portions of the lithographic plate from adhering to non-image portions again upon the release treatment, thereby still maintaining a hydrophilic property of the non-image portions. As a result, the photosensitive lithographic plate can be further effectively prevented from being stained with the printing ink upon the regeneration treatment. Accordingly, when the regenerated photosensitive lithographic plate is subjected to printing, non-image portions thereof can be kept free from adhesion of ink, thereby obtaining high-quality prints.

EXAMPLES

The present invention is described in more detail by the following examples, but these examples are not intended to limit the scope of the present invention thereto.

Example 1

<Production of Substrate>

An aluminum plate having a thickness of 0.24 mm was degreased in a 5 wt. % sodium hydroxide aqueous solution at 60° C. for one minute, and then subjected to electrolytic etching treatment in a 0.5 mol/liter hydrochloric acid aqueous solution at a temperature of 25° C. and a current density of 60 A/dm$^2$ for 30 seconds. Successively, the thus treated aluminum plate was subjected to death mat treatment in a 5 wt. % sodium hydroxide aqueous solution at 60° C. for 10 seconds, and then anodized in a 20 wt. % sulfuric acid aqueous solution at a temperature of 20° C. and a current density of 3 A/dm$^2$ for one minute. Further, the aluminum plate was subjected to hot water sealing treatment using a 80° C. hot water for 20 seconds, thereby obtaining a substrate.

<Preparation of Photosensitive Plate Material Composed of Positive-type Photosensitive Composition>

A component (a) comprising 3 parts by weight of an indole-based dye represented by the following chemical formula (I), and a component (b) comprising 100 parts by weight of a novolak resin being obtained by polycondensing mixed phenols containing phenol, m-cresol and p-cresol at a molar mixing ratio of 50:30:20 with formaldehyde and having a weight-average molecular weight of 9,400 ("SK-188" produced by Sumitomo Dures Co., Ltd.), 3 parts by weight of Crystal Violet Lactone, and 10 parts by weight of an ester compound (weight-average molecular weight: 3,000) represented by the following chemical formula (II) were dissolved in 1,000 parts by weight of propylene glycol monomethyl ether to prepare a photosensitive plate material composed of a positive-type photosensitive composition.

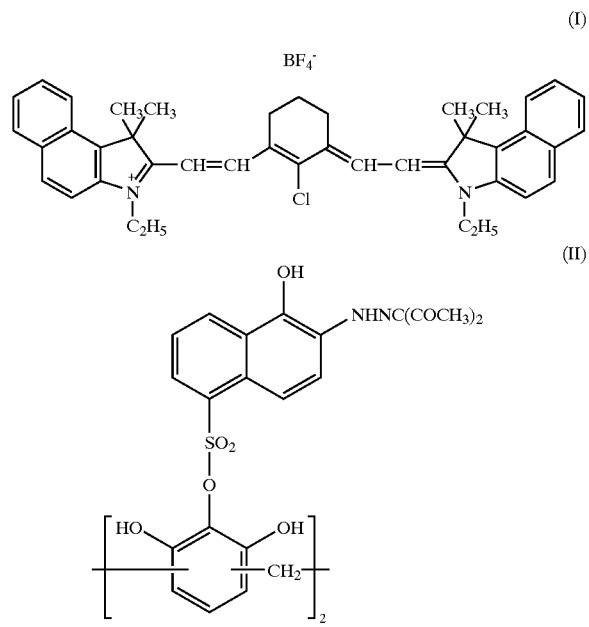

<On-printing Machine Plate Making Printing and Regeneration Steps>

The respective steps were conducted using an apparatus of the same type as shown in FIG. 1 which was arranged in a printing chamber. The casing (1) was slid and opened to accommodate a whole part of the plate making apparatus therein. The printing chamber was ventilated as follows. That is, an exhaust duct (12) was fitted to an exhaust port provided near floor so as to discharge air supplied from an air intake port provided near a ceiling portion of the casing and introduced through a dust filter (11) and an opened front wall of the casing (1) into an inside thereof, from the exhaust port to the exhaust duct (12). Then, the respective plate making, printing and regeneration steps were conducted by the following methods.

First, a plate cylinder (21), a blanket cylinder (22) and an impression cylinder (23) were kept apart from each other, and delivery of papers to the impression cylinder (23) was stopped. Thereafter, the photosensitive plate material composed of the positive-type photosensitive composition was supplied from a plate material-feeding mechanism (4) and coated onto the substrate (3) fixed on the plate cylinder (21), and then dried by hot air at 100° C. for 2 minutes, thereby preparing a positive-type photosensitive lithographic plate having thereon a positive-type photosensitive composition layer in a coating amount of 2.4 g/m$^2$ (step A).

Next, by using an exposure mechanism (5) having a semiconductor laser light source with an emission wavelength of 830 nm (manufactured by Applied Techno Co., Ltd.; 40 mW) capable of scanning exposure with a laser beam spot having a spot diameter of 20 µm at a scanning speed of 40 m/min, the thus obtained photosensitive lithographic plate was subjected to various exposure energies for 200 lines of 1 to 99% halftone dot images (step B). Thereafter, a plate-treating agent composed of an alkali developing solution (8 times-diluted solution of "DP-4" produced by Fuji Photo Film Co., Ltd.) was supplied from a plate-treating agent-feeding mechanism (80) onto the image-exposed photosensitive lithographic plate, and contacted therewith at 28° C. for 30 seconds, and then the photosensitive lithographic plate was washed with water to form images thereon (step C). The alkali developing solution and the wash water were supplied by temporarily keeping an inking roller of an inking device (6) and a dampening roller of a dampening device (7) away from the plate cylinder and temporarily using a plate material-dissolving solution-feeding mechanism (81) of the below-mentioned plate material-removing mechanism and a wash water-feeding mechanism (83). Namely, the below-mentioned plate material-dissolving solution-feeding mechanism (81) was temporarily used as an alkali-developing solution-feeding mechanism. As a result of such procedures, there was obtained a printing plate on which 1 to 99% halftone dot images were reproduced. It was confirmed that the sensitivity of the printing plate was 150 mJcm$^{-2}$ when calculated as exposure energy for reproducing 3% halftone dot images.

After completion of the plate making steps (A) to (C), the printing ink and the dampening water were supplied onto the surface of the images formed on the photosensitive lithographic plate from the inking device (6) and the dampening device (7), respectively. Successively, while rotating the plate cylinder (21), the blanket cylinder (22) and the impression cylinder (23) while keeping in contact with each other and delivering printing papers between the blanket cylinder (22) and the impression cylinder (23), 10,000 copies of prints were produced (step D). As the printing ink and the dampening water, there were used a process ink "HIGH ECHO MAGENTA" produced by Toyo Ink Co., Ltd., and "ASTRON NO. 1 MARK II" produced by Nikken Kagaku Co., Ltd., respectively.

After completion of the printing step (step D), the respective cylinders were kept apart from each other and the delivery of papers to the impression cylinder (23) was stopped again. Then, the image portions formed on the substrate (3) were removed by the plate material-removing mechanism according to the following procedure to regenerate the substrate (step E).

First, after disposing an anti-staining tray (86) between the blanket cylinder (22) and the impression cylinder (23), while rotating the plate cylinder (21), a plate material-dissolving solution composed of propylene glycol monomethyl ether was supplied from the plate material-dissolving solution-feeding mechanism (81) onto the surface of the images formed on the photosensitive lithographic plate fixed on the plate cylinder (21). This procedure allowed the images to be dissolved, thereby regenerating the substrate (3).

Then, the wash water was supplied from the wash water-feeding mechanism (83) onto the surface of the thus regenerated substrate (3). As a result of this procedure, the plate material-dissolving solution remaining on the surface of the substrate (3) was removed. Further, after residual liquid still remaining on the surface of the substrate (3) was removed by a waste solution suction mechanism (84), the surface of the substrate (3) was dried by an air-drying mechanism (85).

After completion of the regeneration step (step E), the process was returned to the above plate making and printing steps (A) to (D), and these steps were repeatedly conducted. As a result, it was confirmed that the sensitivity of the regenerated printing plate was the same as that before regeneration, i.e., 150 mJcm$^{-2}$, and, therefore, the same high-quality prints as those obtained using the printing plate before regeneration were produced.

Meanwhile, when the thus obtained positive-type photosensitive lithographic plate was allowed to stand for 10 hours under the condition of irradiating with light having a light intensity of 400 lux from a while fluorescent lamp (36W white fluorescent lamp "NEOLUMISUPER FLR40S-W/M/36" manufactured by Mitsubishi Denki Co., Ltd.), and then subjected to the same development treatment as above, it was confirmed that substantially no lack of coating film was caused, and the photosensitive lithographic plate showed a good handling property under the white fluorescent lamp.

Example 2

<Production of Substrate>

An aluminum plate having a thickness of 0.24 mm was degreased in a 5 wt. % sodium hydroxide aqueous solution at 60° C. for one minute, and then subjected to electrolytic etching treatment in a 0.5 mol/liter hydrochloric acid aqueous solution at a temperature of 25° C. and a current density of 60 A/dm$^2$ for 30 seconds. Successively, the thus treated aluminum plate was subjected to death mat treatment in a 5 wt. % sodium hydroxide aqueous solution at 60° C. for 10 seconds, and then anodized in a 20 wt. % sulfuric acid aqueous solution at a temperature of 20° C. and a current density of 3 A/dm$^2$ for one minute. Further, the aluminum plate was subjected to hot water sealing treatment using a 80° C. hot water for 20 seconds, thereby obtaining an aluminum substrate for lithographic plate. The thus obtained aluminum substrate had an average roughness Ra of 0.60 $\mu$m when measured by a surface roughness meter ("SE-3DH" manufactured by Kosaka Kenkyusho Co., Ltd.).

<Preparation of Positive-type Photosensitive Plate Material>

3 parts by weight of the indole-based dye illustrated in (II-9) above as the light-heat converting material (A), 100 parts by weight of a novolak resin being obtained by polycondensing mixed phenols containing phenol, m-cresol and p-cresol at a molar mixing ratio of 50:30:20 with formaldehyde and having a weight-average molecular weight of 9,400 as the alkali-soluble resin (B), and 3 parts by weight of Crystal Violet Lactone were mixed in 1,000 parts by weight of methyl cellosolve under stirring at room temperature to prepare a coating solution. The thus prepared coating solution was coated onto the surface of the above-obtained aluminum substrate using a wire bar, and then dried at 100° C. for 2 minutes to produce a positive-type photosensitive lithographic plate having a photosensitive layer with a dry thickness of 2.4 $\mu$m thereon (step A).

<Plate Making, Printing and Regeneration Steps>

Next, by using an exposure apparatus having a semiconductor laser light source with an emission wavelength of 830 nm ("Trend Setter 3244T" manufactured by Creo Co., Ltd.), the thus obtained photosensitive lithographic plate was subjected to scanning exposure with various exposure energies for 200 lines of 1 to 99% halftone dot images (step B). Then, the photosensitive lithographic plate was immersed in an alkali developing solution (8 times-diluted solution of "DP-4" produced by Fuji Photo Film Co., Ltd.) at 28° C. for 30 seconds, and then washed with water to produce a positive-type lithographic plate on which 1 to 99% halftone dot images were reproduced (step C). It was confirmed that the sensitivity of the obtained printing plate was 150 mJ/cm$^2$ when calculated as exposure energy for reproducing 3% halftone dot images.

Successively, the positive-type lithographic plate thus subjected to exposure energy of 150 mJ/cm$^2$ and then to the development treatment was detachably fixed onto a plate cylinder of a lithographic printing machine having the substantially same structure as that shown in FIG. 1 ("DIA F-2" manufactured by Mitsubishi Heavy Industries, Co., Ltd.). Then, a dampening water ("ASTRON NO. 1 MARK II" produced by Nikken Kagaku Co., Ltd.) and a printing ink ("HIGH ECHO MAGENTA" produced by Toyo Ink Co., Ltd.) were supplied onto the surface of the positive-type lithographic plate from a dampening water feeding mechanism and an ink feeding mechanism, respectively, whereby 10,000 copies of prints were produced (step D).

After completion of the printing, the printing ink remaining on the lithographic plate was washed off while keeping the lithographic plate fixed on the plate cylinder of the lithographic printing machine. Then, propylene glycol monomethyl ether as an image removing agent was applied onto the surface of the lithographic plate by a roller of an image removing mechanism to dissolve the positive images, and the surface of the lithographic plate was wiped off with gauze to remove the positive images, and then washed with water to regenerate the aluminum substrate (step E). Thereafter, the coating solution composed of the same positive-type photosensitive composition as used above was coated again on the thus regenerated aluminum substrate by a roller of a photosensitive composition solution coating mechanism, and then heat-dried to form a photosensitive layer thereon, thereby producing a positive-type photosensitive lithographic plate (step A). Successively, using the exposure mechanism, the photosensitive layer was subjected to scanning exposure with a laser source (step B), and the same developing solution as used above was supplied onto the photlayer from the plate-treating agent-feeding mechanism (80) by a roller of a developing mechanism to subject the photosensitive layer to development treatment, thereby producing a positive-type lithographic plate having positive images thereon (step C).

As a result, it was confirmed that the sensitivity of the positive-type lithographic plate was the same as that before regeneration, i.e., 150 mJ/cm² when calculated as exposure energy for reproducing 3% halftone dot images. Further, the positive-type lithographic plate thus subjected to exposure energy of 150 mJ/cm² and then the development treatment was used to produce 10,000 copies of prints by the same method as above, thereby obtaining high-quality prints.

Meanwhile, when the thus obtained positive-type photosensitive lithographic plate produced using the regenerated aluminum substrate was allowed to stand for 10 hours under the condition of irradiating with light having a light intensity of 400 lux from a while fluorescent lamp (36W white fluorescent lamp "NEOLUMISUPER FLR40S-W/M/36" manufactured by Mitsubishi Denki Co., Ltd.), and then subjected to the same development treatment as above, it was confirmed that substantively no lack of coating film was caused, and the photosensitive lithographic plate showed a good safe light property under the white fluorescent lamp.

Example 3

<Preparation of Positive-type Photosensitive Lithographic Plate>

The coating solution as prepared in Example 2 was coated onto the surface of the same aluminum substrate as produced in Example 2 by the using a wire bar. While rotating the plate cylinder at a peripheral speed of 2 m/min, air at 25° C. was blown to the rotating aluminum substrate from a blower "MF930-BC" (manufactured by Oriental Motor Co., Ltd.) disposed at the position spaced by 25 cm apart therefrom for 5 minutes to form a photosensitive layer thereon. In this case, the photosensitive plate material layer coated on the aluminum substrate was heat-dried for 2 minutes by a light-heating-type drying mechanism including two halogen lamps (manufactured by Ushio Denki Co., Ltd.; output: 1,000W; emission efficiency: 85%; emitted light peak: 1,200 nm; irradiation area: 250 mm×60 mm) disposed at the position spaced by 3 cm from the surface of the plate cylinder. The halogen lamps were arranged such that the major axis (250 mm) of the rectangular irradiation plane was parallel with an axis of the plate cylinder, and the minor axis (60 mm) thereof extended in the circumferential direction of the plate cylinder. As a result of such a heat-drying procedure, there was obtained a positive-type photosensitive lithographic plate having a photosensitive layer with a dry thickness of 2.4 μm thereon. The irradiated light intensity density upon the heat-drying was 5.7 W/cm² when calculated from the specification of the lamp.

<Plate Making and Printing Steps>

Successively, the above positive-type photosensitive lithographic plate was subjected to image exposure and then development treatment by the same method as in Example 2. In the development treatment, the exposed positive-type photosensitive lithographic plate was fixed on an aluminum cylinder having a diameter of 10 cm at room temperature of 25° C. such that the photosensitive layer formed thereon faced outward. Also, an image detector (high-speed high-performance color image sensor manufactured by Kiehen Co., Ltd.; a sensor constituted by a CCD camera "CV-070" and a monitor built-in controller "CV-750") was disposed at the position spaced by 20 cm apart from the photosensitive layer. The image detector was set such that signals were generated when the value obtained by dividing a reflection absorbance (reflection absorbance A) obtained by subtracting a reflection absorbance on the aluminum substrate from that of image portions including 200 lines of 50% halftone dot images, by a reflection absorbance (reflection absorbance B) obtained by subtracting the reflection absorbance on the aluminum substrate from that of the non-image portions, reached 5 or more.

Next, while observing the exposed portion of the photosensitive layer by the image detector, the aluminum cylinder was rotated at 100 rpm. The rotating aluminum cylinder was contacted with a rubber roller with a diameter of 4 cm which was partially immersed in a developing solution composed of an aqueous solution containing 0.5% by weight of an anionic surfactant ("Perex NBL" produced by Kao Co., Ltd.) and 0.7% by weight of sodium carbonate, to allow the rubber roller to rotate together with the aluminum cylinder, thereby supplying the alkali developing solution at 25° C. After the elapse of 60 seconds from the initiation of feeding the alkali developing solution, the value of the reflection absorbance A/the reflection absorbance B of the developed halftone dot images exceeded 5, so that signals were generated from the image detector. After confirming the generation of signals, the rubber roller for feeding the developing solution was released from the aluminum cylinder, and then water was sprayed on the aluminum cylinder to wash off the alkali developing solution therefrom. As a result, extremely high-quality photosensitive layer images were formed on the substrate. Successively, using the above exposed printing plate, 1,000 copies of prints were produced by the same method as in Example 2, thereby obtaining high-quality prints.

<Regeneration, Plate Making and Printing Steps>

Next, after completion of the printing, an aqueous solution containing 10% by weight of 2-phenoxyethanol and 3% by weight of diethanol was applied onto the surface of the printing plate to dissolve the images formed thereon. The surface of the printing plate was wiped off with gauze to remove the images, and then washed with water to regenerate the aluminum substrate. Thereafter, the photosensitive composition coating solution as used above was coated again on the thus regenerated aluminum substrate by the same method as in Example 2, and then heated by lamps to produce a positive-type photosensitive lithographic plate. Successively, the thus produced positive-type photosensitive lithographic plate was subjected to laser exposure and then development treatment by the same method as above to form images thereon, thereby producing a positive-type printing plate. The thus obtained positive-type printing plate was used to produce 10,000 copies of prints, thereby obtaining high-quality prints.

Example 4

<Production of Substrate>

An aluminum plate having a thickness of 0.24 mm was degreased in a 5 wt. % sodium hydroxide aqueous solution at 60° C. for one minute, and then subjected to electrolytic etching treatment in a 0.5 mol/liter hydrochloric acid aqueous solution at a temperature of 25° C. and a current density of 60 A/dm² for 30 seconds. Next, the thus treated aluminum plate was subjected to death mat treatment in a 5 wt. % sodium hydroxide aqueous solution at 60° C. for 10 seconds, and then anodized in a 20 wt. % sulfuric acid aqueous solution at a temperature of 20° C. and a current density of 3 A/dm² for one minute. Further, the aluminum plate was subjected to hot water sealing treatment using a 80° C. hot water for 20 seconds, thereby obtaining an aluminum plate for a substrate of a lithographic plate. The thus obtained aluminum plate had an average roughness Ra of 0.60 μm when measured by a surface roughness meter ("SE-3DH" manufactured by Kosaka Kenkyusho Co., Ltd.).

<Preparation of Positive-type Photosensitive Plate Material>

The thus obtained aluminum substrate was detachably fixed onto a plate cylinder of a lithographic printing machine having the substantially same structure as that shown in FIG.

1 ("LITHOGRAPHIC PRINTING MACHINE DIA F-2" manufactured by Mitsubishi Heavy Industries, Co., Ltd.). Then, 100 parts by weight of a novolak resin (MW: 9,400) prepared by polycondensing mixed phenols containing phenol, m-cresol and p-cresol at a molar mixing ratio of 50:30:20 with formaldehyde as the alkali-soluble resin (P-1), 3 parts by weight of the indole-based dye illustrated in (II-9) above as the light-heat converting material (P-2), and 3 parts by weight of Crystal Violet Lactone as the colorant component (P-5) were mixed in 1,000 parts by weight of methyl cellosolve under stirring at room temperature to prepare a coating solution. The thus prepared coating solution was coated onto the surface of the above-obtained aluminum substrate using a wire bar, and then dried at 100° C. for 2 minutes to produce a positive-type photosensitive lithographic plate having a photosensitive layer with a dry thickness of 2.4 μm thereon (step A).

<Plate Making, Printing and Regeneration Steps>

Next, by using an exposure apparatus having a semiconductor laser light source with an emission wavelength of 830 nm (manufactured by Applied Techno Co., Ltd.; maximum output: 30 mW), the thus obtained positive-type photosensitive lithographic plate was subjected to scanning exposure for thin line images by irradiation of beam spot focussed to a diameter of 20 μm with various exposure energies (step B). Then, the photosensitive lithographic plate was immersed in the below-mentioned alkali developing solution (7) supplied from the plate-treating agent-feeding mechanism (80) at 28° C. for 30 seconds, and then washed with water to produce a positive-type lithographic plate on which thin line images were reproduced (step C). It was confirmed that the sensitivity of the positive-type lithographic plate was 150 mJ/cm$^2$ when calculated from minimum exposure energy for reproducing the thin line images.

Then, a dampening water ("ASTRON NO. 1 MARK II" produced by Nikken Kagaku Co., Ltd.) and a printing ink ("HIGH ECHO MAGENTA" produced by Toyo Ink Co., Ltd.) were supplied onto the surface of the positive-type lithographic plate from a dampening water feeding mechanism and an ink feeding mechanism, respectively, whereby 10,000 copies of prints were produced (step D).

After completion of the printing, the printing ink remaining on the lithographic plate was washed off while keeping the lithographic plate fixed on the plate cylinder of the lithographic printing machine. Then, propylene glycol monomethyl ether as an image removing agent was applied onto the surface of the lithographic plate by a roller of an image removing mechanism to dissolve the positive images, and the surface of the lithographic plate was wiped off with gauze to remove the positive images, and then washed with water to regenerate the aluminum substrate (step E). Thereafter, the coating solution composed of the same positive-type photosensitive composition as used above was coated again on the thus regenerated aluminum substrate by a roller of a photosensitive composition solution coating mechanism, and then heat-dried to form a photosensitive layer thereon, thereby producing a positive-type photosensitive lithographic plate (step A). Successively, using the exposure mechanism, the photosensitive layer was subjected to scanning exposure for thin line images different from those of the previous exposure by a laser source (step B), and the following alkali developing solutions (1) to (7) were respectively supplied on the photosensitive layer by a roller of a development mechanism (plate-treating agent-feeding mechanism) to subject the photosensitive layer to development treatment, thereby producing a positive-type lithographic plate having positive images thereon (step C).

Next, the thus obtained positive-type lithographic plate was used to conduct printing by the same method as above. When the 1,000th print was visually observed to examine the adhesion of ink onto non-image portions thereof, it was confirmed that no ink adhesion was caused on the non-image portions of the lithographic plate in the case where the alkali developing solutions (1) to (7) were used.

Successively, the lithographic plate was regenerated using the respective alkali developing solutions (1) to (7) by the same method as above except that different thin line images were formed thereon at each time, the number of copies of prints produced was reduced to just 1,000 for each printing, and the printing procedure was repeated 8 times. As a result, it was conformed that when the alkali developing solutions (1) and (2) were used, no ink adhesion onto the non-image portions was recognized even upon the 8th regeneration procedure, and when the alkali developing solutions (3) to (7) were used, only slight ink adhesion onto the non-image portions was observed at the 8th regeneration procedure.

The above treatments were conducted using the following alkali developing solutions (1) to (7) each having a pH value of not less than 11.

(1) Aqueous solution containing 1.0% by weight of sodium silicate ($SiO_2/Na_2O$=3/1; and so forth on), 1.0% by weight of sodium hydroxide and 0.01% by weight of betaine-type amphoteric surfactant ("Anhitol 24B" produced by Kao Co., Ltd.) ($[SiO_2]/[M]$=0.37)

(2) Aqueous solution containing 1.0% by weight of sodium silicate, 1.0% by weight of sodium hydroxide and 0.01% by weight of betaine-type amphoteric surfactant ("Anhitol 86B" produced by Kao Co., Ltd.) ($[SiO_2]/[M]$=0.37)

(3) Aqueous solution containing 1.0% by weight of sodium silicate, 1.0% by weight of sodium hydroxide and 0.01% by weight of polyoxyalkylene-type nonionic surfactant ("Emalgen A-60" produced by Kao Co., Ltd.) ($[SiO_2]/[M]$=0.37)

(4) Aqueous solution containing 1.0% by weight of sodium silicate, 1.0% by weight of sodium hydroxide and 0.01% by weight of polyoxyalkylene-type nonionic surfactant ("Emalgen PP-150" produced by Kao Co., Ltd.) ($[SiO_2]/[M]$=0.37)

(5) Aqueous solution containing 1.0% by weight of sodium silicate, 1.0% by weight of sodium hydroxide and 0.01% by weight of sodium sulfonate-type anionic surfactant ("Perex NBL" produced by Kao Co., Ltd.) ($[SiO_2]/[M]$=0.37)

(6) Aqueous solution containing 1.0% by weight of sodium silicate, 1.0% by weight of sodium hydroxide and 0.01% by weight of sodium sulfonate-type anionic surfactant ("Perex SS-H" produced by Kao Co., Ltd.) ($[SiO_2]/[M]$=0.37)

(7) Aqueous solution containing 1.0% by weight of sodium silicate, 1.0% by weight of sodium hydroxide and 0.01% by weight of quaternary ammonium salt-type cationic surfactant ("Coatamine 24P" produced by Kao Co., Ltd.) ($[SiO_2]/[M]$)=0.37)

Example 5

<Production of Substrate>

An aluminum plate having a thickness of 0.2 mm was degreased with a 3 wt. % sodium hydroxide aqueous solution, and then subjected to electrolytic etching treatment in a 18 g/liter nitric acid bath at a current density of 80 A/dm$^2$ for 15 seconds. Successively, the thus treated aluminum plate was subjected to death mat treatment in a 1 wt. % sodium hydroxide aqueous solution at 50° C. for 5 seconds, neutralized with a 10 wt. % nitric acid aqueous solution at 25° C. for 5 seconds, washed with water, and then anodized in a 30 wt. % sulfuric acid aqueous solution at a current density of 10 A/dm² for 16 seconds. Further, the aluminum plate was washed with water and then dried to produce a hydrophilic substrate. It was confirmed that the amount of anodic oxide film formed on the substrate was 2.1 g/m².

<Preparation of Photosensitive Plate Material Composed of Photopolymerizable Composition>

A sensitizing dye, a radical generator, a high-molecular binder and an ethylenically unsaturated monomer represented by the following chemical formulae were blended with propylene glycol monomethyl ether as a coating solvent at a mixing ratio shown in Table 1, thereby preparing a photosensitive plate material composed of a photopolymerizable composition.

TABLE 1

| Components | | Weight part |
|---|---|---|
| Sensitizing dye | | 5 |
| Radical generator | | 5 |
| High-molecular binder | | 50 |
| Ethylenically | Compound 1 | 15 |
| unsaturated monomer | Compound 2 | 5 |
| | Compound 3 | 15 |
| | Compound 4 | 10 |
| Coating solvent | | 1,000 |

[Sensitizing dye]

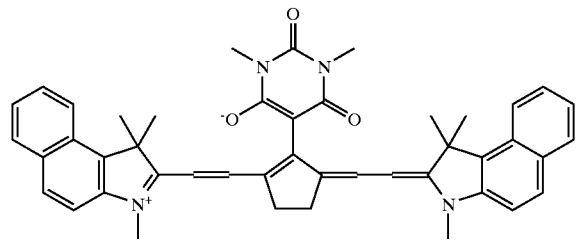

TABLE 1-continued

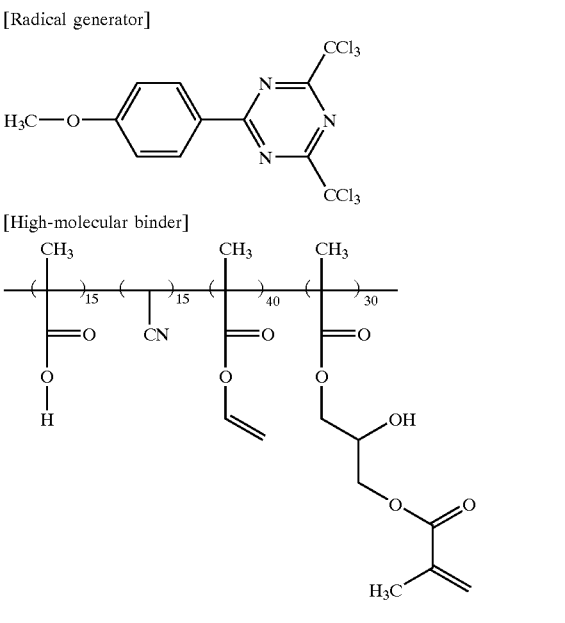

Numerals indicate molar ratios.

Weight-average molecular weight: 200,000

[Ethylenically unsaturated monomer]

Compound 1

Compound 1

CH₂=CH—C(—OCH₂CH₂—)₂—O—⟨⟩—C(CH₃)₂—⟨⟩—O—(CH₂CH₂O)₂—C—CH=CH₂
          ‖                                                    ‖
          O                                                    O

Compound 2

R⁴²OCH₂—C(CH₂OR⁴¹)(CH₂OR⁴³)—CH₂—O—CH₂—C(CH₂OR⁴⁶)(CH₂OR⁴⁴)—CH₂OR⁴⁵

Mixture of compound in which $R^{41}$ to $R^{46}$ are acryloyl group and compound in which $R^{41}$ to $R^{45}$ are acryloyl group and R46 is hydroxyl group.

Compound 3

(CH₂=CHCOOCH₂)₃—CCH₂OCNH—(CH₂)₆—NHCOCH₂C—(CH₂OCOCH=CH₂)₃
                    ‖                    ‖
                    O                    O

Compound 4

$\left( CH_2=C(CH_3)-C(=O)-O-C_2H_4O \right)_n - P(=O)(OH)_{3-n}$

1:1 mixture of compound in which n is 1 and compound in which n is 2.

<On-printing Machine Plate Making, Printing and Regeneration Steps>

The respective steps were conducted using an apparatus of the same type as shown in FIG. 1 which was arranged in a printing chamber. The casing (1) was slid and opened to accommodate a whole part of the plate making apparatus therein. The printing chamber was ventilated as follows. That is, an exhaust duct (12) was fitted to an exhaust port provided near floor so as to discharge air supplied from an air intake port provided near a ceiling portion of the casing and introduced through a dust filter (11) and an opened front wall of the casing (1) into an inside thereof, from the exhaust port to the exhaust duct (12). Then, the respective plate making (steps A to C), printing (step D) and regeneration (step E) were conducted by the following methods.

First, a plate cylinder (21), a blanket cylinder (22) and an impression cylinder (23) were kept apart from each other, and delivery of papers to the impression cylinder (23) was stopped. Thereafter, the photosensitive plate material composed of the photopolymerizable composition was supplied from a plate material-feeding mechanism (4) and coated onto the substrate (3) fixed on the plate cylinder (21), and then dried by blowing thereto hot air at 100° C. for 2 minutes, thereby preparing a photosensitive lithographic plate having thereon a photosensitive layer with a thickness of 1 μm (step A).

Next, by using a semiconductor laser (5) with an emission wavelength of 830 nm as an exposure mechanism (manufactured by Applied Techno Co., Ltd.; 30 mW), the photosensitive lithographic plate was exposed to light of spiral line images. More specifically, while rotating the plate cylinder (21) and moving the semiconductor laser (5) parallel with the axial direction of the plate cylinder (21) while keeping the distance between the plate cylinder (21) and the semiconductor layer (5) constant, laser light focused to beam spot having a spot diameter of 20 μm was irradiated onto the photosensitive lithographic plate at a scanning speed of 40 m/min (step B). Thereafter, a plate-treating agent composed of a 0.5 wt. % sodium carbonate aqueous solution was supplied from a plate-treating agent-feeding mechanism (80) onto the image-exposed photosensitive lithographic plate to swell and dissolve non-exposed portions of the photosensitive layer. The non-exposed portions were washed off with water to form images on the photosensitive lithographic plate (step C). The sodium carbonate aqueous solution and the wash water were supplied by temporarily keeping an inking roller of an inking device (6) and a dampening roller of a dampening device (7) away from the plate cylinder and temporarily using a plate material-dissolving solution-feeding mechanism (81) of the below-mentioned plate material-removing mechanism and a wash water-feeding mechanism (83). Namely, the below-mentioned plate material-dissolving solution-feeding mechanism (81) was temporarily used as an sodium carbonate aqueous solution feeding mechanism.

After completion of the plate making step (steps A to C), the printing ink and the dampening water (10° C.) were supplied onto the surface of images formed on the photosensitive lithographic plate from the inking device (6) and the dampening device (7), respectively. Successively, while rotating the plate cylinder (21), the blanket cylinder (22) and the impression cylinder (23) at 470 revolutions per hour while being kept in contact with each other and delivering printing papers between the blanket cylinder (22) and the impression cylinder (23), 3,000 copies of prints were produced (step D). As the printing ink and the dampening water, there were used "HIGH ECHO KURENAI" produced by Toyo Ink Co., Ltd., and "ASTRON NO. 1 MARK II" produced by Nikken Kagaku Co., Ltd. (concentration: 1% by weight; pH: 5), respectively.

After completion of the printing step (step D), the respective cylinders were kept apart from each other and the delivery of papers to the impression cylinder (23) was stopped again. Then, the image portions formed on the substrate (3) were removed by a pate material removing mechanism according to the following procedure to regenerate the substrate (step E).

First, after disposing an anti-staining tray (86) between the blanket cylinder (22) and the impression cylinder (23), while rotating the plate cylinder (21), a plate material-dissolving solution composed of a negative lithographic plate-developing solution (aqueous solution containing 10% by weight of 2-phenoxyethanol and 3% by weight of diethanolamine) was supplied from the plate material-dissolving solution-feeding mechanism (81) onto the surface of the images formed on the photosensitive lithographic plate fixed on the plate cylinder (21). Then, physical stimulus was applied to the images by a plate material-stripping roller (82) to remove the images from the substrate (3).

Then, the wash water was supplied from the wash water-feeding mechanism (83) onto the surface of the thus regenerated substrate (3). As a result of this procedure, the plate material-dissolving solution remaining on the surface of the substrate (3) was removed. Further, after residual liquid still remaining on the surface of the substrate (3) was removed by a waste solution suction mechanism (84), the surface of the substrate (3) was dried by an air-drying mechanism (85).

After completion of the regeneration step (step E), the process was returned to the above plate making and printing steps (steps A to D), and these steps were repeatedly conducted. As a result, it was confirmed that prints having the same clear spiral line images as those obtained using the printing plate before regeneration were produced.

Example 6

<Production of Substrate>

An aluminum plate having a thickness of 0.2 mm was degreased with a 3 wt. % sodium hydroxide aqueous solution, and then subjected to electrolytic etching treatment in a 18 g/liter hydrochloric acid bath at a temperature of 25° C. and a current density of 80 A/dm$^2$ for 15 seconds. Successively, the thus treated aluminum plate was subjected to death mat treatment in a 1 wt. % sodium hydroxide aqueous solution at 50° C. for 5 seconds, neutralized with a 10 wt. % hydrochloric acid aqueous solution at 25° C. for 5 seconds, washed with water, and then anodized in a 30 wt. % sulfuric acid bath at a temperature of 30° C. and a current density of 10 A/dm$^2$ for 16 seconds. Further, the aluminum plate was washed with water and then dried to produce an aluminum substrate having an anodic oxide film in an amount of 21 mg/dm$^2$.

The thus obtained aluminum substrate was subjected to peel test to measure a peel strength of a gummed tape adhered onto the surface thereof by the following method. As a result, it was conformed that the gummed tape peel strength was 300 g/cm.

Gummed Tape Peel Strength:

After adhering a gummed tape ("SLION TAPE3" produced by SLIONTEC CO., LTD.) onto the surface of the aluminum substrate at 25° C., 5 kg/cm$^2$ and 50 cm/min, the aluminum substrate adhered with the gummed tape was fixed onto a table, and the gummed tape adhered thereonto was peeled off in the 180° direction at a pulling speed of 30 cm/min (180° peel test). The gummed tape peel strength was expressed by a linear tension (g/cm) obtained by dividing a maximum stress measured in the above peel test by a width of the gummed tape.

<Production of Negative-type Photosensitive Lithographic Plate>

Successively, the following ethylenically unsaturated compound (A), sensitizing dye (B), photopolymerization initiator (C), high-molecular binder (D) and other component were mixed in 1,090 parts by weight of cyclohexanone while stirring at room temperature, thereby preparing a coating solution. The thus prepared coating solution was applied onto the surface of the above-obtained aluminum substrate using a bar coater in a dry coating amount of 2 g/m$^2$, and then dried to form a photosensitive layer composed of the photopolymerizable composition thereon. Further, a mixed aqueous solution containing 95% by weight of polyvinyl alcohol and 5% by weight of polyvinyl pyrrolidone was applied onto the photosensitive layer using a bar coater in a dry coating amount of 3 g/m$^2$ to form an oxygen-shielding layer thereon, thereby producing a negative-type photosensitive lithographic plate.

(A) Ethylenically Unsaturated Compound:
   Compound (A-1) shown below: 25 parts by weight
   Compound (A-2) shown below: 5 parts by weight
   Compound (A-3) shown below: 25 parts by weight Other Component:
   Pigment (ethyl violet): 5 parts by weight <Plate Making, Printing and Regeneration Steps>

Next, by using an exposure apparatus having a semiconductor laser light source with an emission wavelength of 830 nm ("Trend Setter 3244T" manufactured by Creo Co., Ltd.), the thus obtained negative-type photosensitive lithographic plate was subjected to scanning exposure with various exposure energies. Then, the photosensitive lithographic plate was immersed in a developing solution composed of 0.8% by weight of sodium carbonate and 3% by weight of an anionic surfactant ("Perex NBL" produced by Kao Co., Ltd.) at 25° C. for 30 seconds, and then washed with water to produce a negative-type lithographic plate on which scanning line images were reproduced. It was confirmed that the sensitivity of the obtained printing plate was 100 mJ/cm$^2$ when calculated from minimum exposure energy for reproducing the scanning line images.

Successively, the negative-type lithographic plate thus exposed to minimum exposure energy of 100 mJ/cm$^2$ and then to the development treatment was detachably fixed onto a plate cylinder of a lithographic printing machine having the same structure as shown in FIG. 1 ("DIA F-2" manufactured by Mitsubishi Heavy Industries, Co., Ltd.). Then, a dampening water ("ASTRON NO. 1 MARK II" produced by Nikken Kagaku Co., Ltd.) and a printing ink ("HIGH

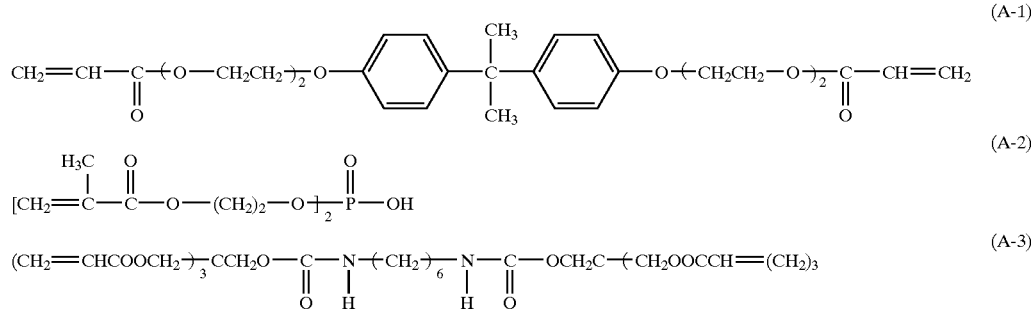

(B) Sensitizer:
   Compound (B-1) shown below: 2 parts by weight

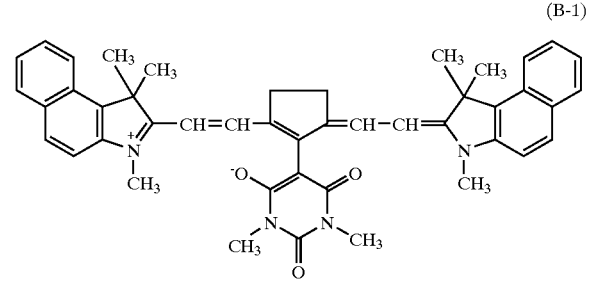

(C) Photopolymerization Initiator:
   2-(p-methoxyphenyl)-4,6-bis(trichloromethyl)-s-triazine (C-1): 5 parts by weight (D) High-molecular Binder:
   Reaction product obtained by reacting a copolymer of methacrylate (80 mol %) and methacrylic acid (20 mol %) with 3,4-epoxycyclohexylmethylacrylate (60 mol % of carboxyl groups of the methacrylic acid components was reacted; acid number: 60; weight-average molecular weight: 75,000) (D-1): 45 parts by weight ECHO MAGENTA" produced by Toyo Ink Co., Ltd.) were supplied onto the surface of the negative-type lithographic plate from a dampening water feeding mechanism and an ink feeding mechanism, respectively, whereby 10,000 copies of prints were produced.

After completion of the printing, the printing ink remaining on the lithographic plate was washed off while keeping the lithographic plate fixed on the plate cylinder of the lithographic printing machine. Then, an image removing agent composed of a negative-type lithographic plate-developing solution (aqueous solution containing 10% by weight of 2-phenoxyethanol and 3% by weight of diethanolamine) and 10% by weight of aluminum hydroxide particles dispersed therein was applied onto the surface of the lithographic plate by a roller of an image removing mechanism, and the surface of images formed on the lithographic plate was brushed and then wiped off with gauze to remove the images therefrom. Further, the lithographic plate was washed with water to regenerate the aluminum substrate (step E). Thereafter, the coating solution composed of the same photopolymerizable composition as used above was coated again on the thus regenerated aluminum substrate by a roller of a photopolymerizable composition solution coating mechanism, and then heat-dried to form a photosensitive layer thereon, thereby producing a negative-type photosensitive lithographic plate (step A). Successively, using the exposure mechanism, the photosensitive layer was subjected to scanning exposure with a laser source by the same method as in Example 2 (step B), and the same developing solution as used above was supplied on the photosensitive layer by a roller of a developing mechanism (plate-treating agent-feeding mechanism) to subject the photosensitive layer to development treatment, thereby producing a negative-type lithographic plate having negative images thereon (step C).

As a result, it was confirmed that the sensitivity of the negative-type lithographic plate was the same as that before regeneration, i.e., 100 mJ/cm$^2$ when calculated as minimum exposure energy for reproducing the scanning line images. Further, the positive-type lithographic plate thus subjected to exposure energy of 100 mJ/cm$^2$ and then the development treatment was used to produce 10,000 copies of prints by the same method as above, thereby obtaining high-quality prints (step D).

Meanwhile, the degree of residual line images remaining on the regenerated aluminum substrate was visually observed, and evaluated according to the following ranks. As a result, it was confirmed that the degree of residual line images on the regenerated aluminum substrate was the rank A.

A: line image residual rate of less than 1%
B: line image residual rate of from 1% to less than 10%
C: line image residual rate of from 10% to less than 70%
D: line image residual rate of not more than 70%

Also, when the thus obtained negative-type photosensitive lithographic plate produced using the regenerated aluminum substrate was allowed to stand for 10 minutes under the condition of irradiating with light having a light intensity of 400 lux from a white fluorescent lamp (36W white fluorescent lamp "NEOLUMISUPER FLR40S-W/M/36" manufactured by Mitsubishi Electric Co., Ltd.), and then subjected to the same development treatment as above, it was confirmed that the photosensitive layer was completely dissolved and, therefore, the photosensitive lithographic plate showed a good safe light property under the white fluorescent lamp.

Example 7

An aluminum substrate was produced by the same method as defined in Example 6 except that the electrolytic etching was conducted using nitric acid instead of hydrochloric acid, and after anodization, the aluminum plate was immersed in a 50 ppm carboxymethyl cellulose aqueous solution for 5 seconds and then dried to form a hydrophilic polymer thin layer having a thickness of 0.01 μm on the surface thereof. Further, using the thus produced aluminum substrate, the same procedure as defined in Example 6 was conducted except that a coating solution prepared by mixing the following components (A) to (D) as well as the following other component in a mixture of 1,090 parts by weight of cyclohexanone and 100 parts by weight of methyl cellosolve while stirring at room temperature was applied onto the aluminum substrate without forming the oxygen-shielding layer thereon to produce a negative-type photosensitive lithographic plate, and the thus produced negative-type photosensitive lithographic plate was subjected to laser scanning exposure, and fixed on the plate cylinder of the lithographic printing machine to produce 100 copies of prints.

(A) Ethylenically Unsaturated Compound:

Dipentaerythritol hexaacrylate (A-4): 50 parts by weight

Acrylate urethane oligomer ("Ebecryl 8301" produced by Radcure Co., Ltd.) (A-5): 10 parts by weight (B) Sensitizer:

Compound (B-2) shown below: 2 parts by weight

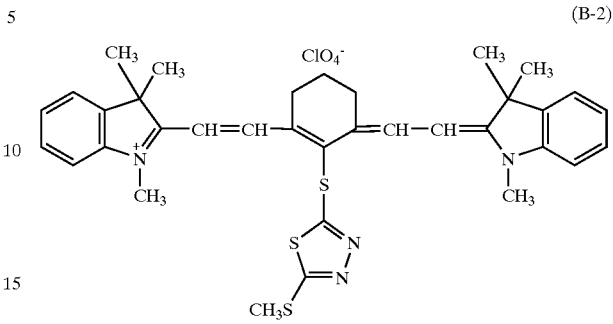

(C) Photopolymerization Initiator:

Organoboric acid salt of n-butyl-tris(m-fluorophenyl) boron anion and tetramethyl ammonium cation (C-2): 5 parts by weight (D) High-molecular Binder:

Polymethylmethacrylate (weight-average molecular weight: 30,000) (D-2): 40 parts by weight Other component:

Pigment (ethyl violet): 5 parts by weight

It was confirmed that the gummed tape peel strength from the surface of the aluminum substrate was 300 g/cm, and the sensitivity of the negative-type photosensitive lithographic plate was 150 mJ/cm$^2$. Also, it was confirmed that the degree of residual line images on the aluminum substrate regenerated after printing was the rank A, and the sensitivity of the negative-type lithographic plate produced using the regenerated aluminum substrate was the same as that before the regeneration, i.e., 150 mJ/cm$^2$. Then, the negative-type lithographic plate exposed to the exposure energy of 150 mJ/cm$^2$ and subjected to the printing development was used to produce 10,000 copies of prints. As a result, it was confirmed that the obtained prints had a high quality. In addition, it was confirmed that the negative-type photosensitive lithographic plate produced using the regenerated aluminum substrate also exhibited a good safe light property under a white fluorescent lamp.

Example 8

An aluminum substrate was produced by the same method as defined in Example 6 except that after anodization, the aluminum plate was immersed in a 50 ppm carboxymethyl cellulose aqueous solution for 5 seconds and then dried to form a hydrophilic polymer thin layer having a thickness of 0.01 μm on the surface thereof. Further, using the thus produced aluminum substrate, the same procedure as defined in Example 6 was conducted except that a coating solution prepared by mixing the following components (A) to (D) as well as the following other component in 1,090 parts by weight of cyclohexanone while stirring at room temperature was applied onto the aluminum substrate without forming an oxygen-shielding layer thereon.

(A) Ethylenically unsaturated compound:
 Compound (A-6) shown below: 11 parts by weight
 Compound (A-7) shown below: 24 parts by weight
 (A-6)
 1:1 mixture of:

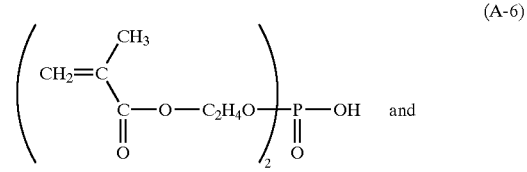
(A-6)

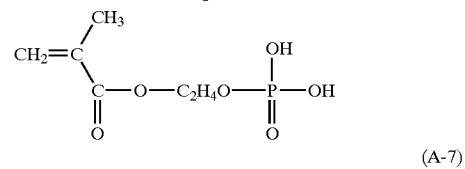
(A-7)

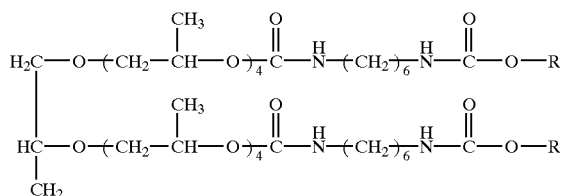

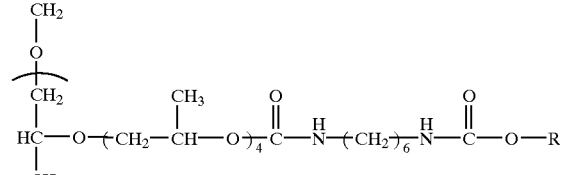

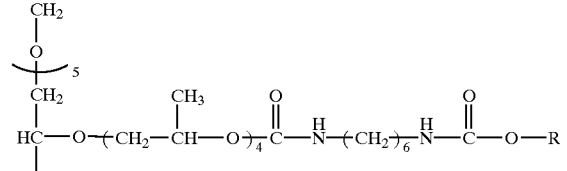

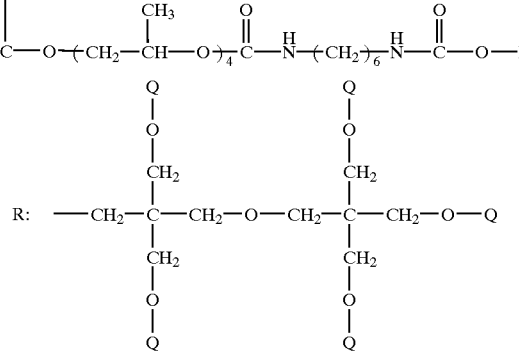

(B) Sensitizer:
 Compound (B-1) shown above: 2 parts by weight
(C) Photopolymerization Initiator:
 Compound (C-1) shown above: 5 parts by weight
(D) High-molecular Binder:
 Copolymer of vinyl methacrylate (40 mol %), methacrylic acid (15 mol %), acrylonitrile (15 mol %) and 3-allyoxy-2-hydroxypropyl methacrylate (30 mol %) (weight-average molecular weight: 200,000) (D-3): 45 parts by weight
(F) Amine Compound
 Tribenzylamine (F-1): 5 parts by weight Other component:
 Pigment (ethyl violet): 5 parts by weight It was confirmed that the gummed tape peel strength from the surface of the aluminum substrate was 300 g/cm, and the sensitivity of the negative-type photosensitive lithographic plate was 150 mJ/cm$^2$. Also, it was confirmed that the degree of residual line images on the aluminum substrate regenerated after printing was the rank A, and the sensitivity of the negative-type lithographic plate produced using the regenerated aluminum substrate was the same as that before the regeneration, i.e., 150 mJ/cm$^2$. Then, the negative-type lithographic plate exposed to the exposure energy of 150 mJ/cm$^2$ and subjected to the development treatment was used to produce 10,000 copies of prints. As a result, it was confirmed that the obtained prints had a high quality. In addition, it was confirmed that the negative-type photosensitive lithographic plate produced using the regenerated aluminum substrate also exhibited a good safe light property under a white fluorescent lamp.

Example 9

The same procedure as defined in Example 7 was conducted except that the following reaction products were used as the high-molecular binder (D).
(D) High-molecular Binder:
 Reaction product obtained by reacting a copolymer of methyl methacrylate (50 mol %), isobutyl methacrylate (30 mol %) and methacrylic acid (20 mol %) with 3,4-epoxycyclohexylmethyl methacrylate (50 mol % of carboxyl groups of the methacrylic acid components was reacted) (D-4): 25 parts by weight
 Reaction product obtained by reacting a copolymer of styrene (63 mol %) and acrylic acid (37 mol %) with 3,4-epoxycyclohexylmethyl methacrylate (50 mol % of carboxyl groups of the acrylic acid components was reacted) (D-5): 25 parts by weight It was confirmed that the sensitivity of the negative-type photosensitive lithographic plate was 100 mJ/cm$^2$, the degree of residual line images on the aluminum substrate regenerated after printing was the rank A, and the sensitivity of the negative-type lithographic plate produced using the regenerated aluminum substrate was the same as that before the regeneration, i.e., 100 mJ/cm$^2$. Then, the negative-type lithographic plate exposed to the exposure energy of 100 mJ/cm$^2$ and subjected to the development treatment was used to produce 10,000 copies of prints. As a result, it was confirmed that the obtained prints had a high quality. In addition, it was confirmed that the negative-type photosensitive lithographic plate produced using the regenerated aluminum substrate also exhibited a good safe light property under a white fluorescent lamp.

Example 10

The same procedure as defined in Example 8 was conducted except that the high-molecular binder (D) was replaced with that used in Example 9. It was confirmed that the sensitivity of the negative-type photosensitive lithographic plate was 120 mJ/cm$^2$, the degree of residual line images on the aluminum substrate regenerated after printing was the rank A, and the sensitivity of the negative-type lithographic plate produced using the regenerated aluminum substrate was the same as that before the regeneration, i.e., 120 mJ/cm$^2$. Then, the negative-type lithographic plate exposed to the exposure energy of 120 mJ/cm$^2$ and subjected to the development treatment was used to produce 10,000 copies of prints. As a result, it was confirmed that the obtained prints had a high quality. In addition, it was confirmed that the negative-type photosensitive lithographic plate produced using the regenerated aluminum substrate also exhibited a good safe light property under a white fluorescent lamp.

Example 11

The same procedure as defined in Example 6 was conducted except that the aluminum substrate was anodized using phosphoric acid instead of hydrochloric acid, and was formed thereon with an oxide film in an amount of 18 mg/dm$^2$. It was confirmed that the gummed tape peel strength from the surface of the aluminum substrate was 1,000 g/cm, the sensitivity of the negative-type photosensitive lithographic plate was 100 mJ/cm$^2$, and the degree of residual line images on the aluminum substrate regenerated after printing was the rank C.

Example 12

<Production of substrate>

The same procedure as defined in Example 6 was conducted to produce a negative-type photosensitive lithographic plate except that the coating solution was prepared by mixing the following components (A) to (D) as well as the following other component in a mixture of 400 parts by weight of propylene glycol monomethyl ether acetate and 740 parts by weight of cyclohexanone while stirring at room temperature.

(A) Ethylenically Unsaturated Compound:
 Compound (A-l) shown above: 22 parts by weight
 Compound (A-6) shown above: 11 parts by weight
 Compound (A-7) shown above: 22 parts by weight (B) Sensitizer:
 4,4'-bis(diethylamino)benzophenone (B-3): 9 parts by weight (C) Photopolymerization Initiator:
 2,2'-bis(o-chlorophenyl)-4,4',5,5'-tetraphenylbiimidazole (C-3): 15 parts by weight (D) High-molecular Binder:
 Reaction product obtained by reacting a copolymer of methyl methacrylate (80 mol %) and methacrylic acid (20 mol %) with 3,4-epoxycyclohexylmethylacrylate (50 mol % of carboxyl groups of the methacrylic acid components was reacted; acid number: 53; weight-average molecular weight: 70,000) (D-6): 45 parts by weight (E) Hydrogen-donating Compound:
 2-mercaptobenzothiazole (E-1): 5 parts by weight
 N-phenylglycine benzylester (E-2): 5 parts by weight (F) Amine Compound:
 Tribenzylamine (F-1): 3 parts by weight Other Component:
 Pigment (copper phthalocyanine): 4 parts by weight
 Dispersant ("Disper BYK 161" produced by BYK Chemie Co., Ltd.): 2 parts by weight
 Surfactant ("Emalgen 104P" manufactured by Kao Co., Ltd.): 2 parts by weight
 Surfactant ("S-381" manufactured by Asahi Glass Co., Ltd.): 0.3 part by weight Next, by using a violet laser exposure apparatus with an emission wavelength of 410 nm ("Cobalt 8" manufactured by Escher-Grad Co., Ltd.), the thus obtained negative-type photosensitive lithographic plate was subjected to scanning exposure with various exposure energies. Then, the photosensitive lithographic plate was immersed in a developing solution composed of an aqueous solution containing 0.7% by weight of sodium carbonate and 0.5% by weight of an anionic surfactant ("Perex NBL" produced by Kao Co., Ltd.) at 280C for 30 seconds, and then washed with water to produce a negative-type lithographic plate on which scanning line images were reproduced. It was confirmed that the sensitivity of the obtained negative-type lithographic plate was 20 μJ/cm$^2$ when calculated from minimum exposure energy for reproducing the scanning line images.

Then, the subsequent procedure was conducted by the same method as defined in Example 6 except that the negative-type lithographic plate exposed to exposure energy of 20 μJ/cm$^2$ and then subjected to the development treatment was used therein. As a result, it was confirmed that the degree of residual line images remaining on the aluminum substrate regenerated after printing was the rank A, and the sensitivity of the negative-type lithographic plate produced using the regenerated aluminum substrate was the same as that before the regeneration, i.e., 20 μJ/cm$^2$. Then, the negative-type lithographic plate exposed to the exposure energy of 20 μJ/cm$^2$ and subjected to the development treatment was used to produce 10,000 copies of prints. As a result, it was confirmed that the obtained prints had a high quality.

Meanwhile, after the thus obtained negative-type photosensitive lithographic plate produced using the regenerated aluminum substrate was allowed to stand for 30 minutes under the condition of irradiating with light having a light intensity of 470 lux from a 40W yellow fluorescent lamp (40W yellow fluorescent lamp "NEOLUMISUPER FLR40S-Y/M" manufactured by Mitsubishi Denki Co., Ltd.), and then subjected to the same development treatment as above, it was confirmed that the photosensitive layer was completely dissolved and, therefore, the photosensitive lithographic plate exhibited a good safe light property under the yellow fluorescent lamp.

Example 13

The aluminum substrate produced by the same method as in Example 4 was detachably fixed onto a plate cylinder of a lithographic printing machine having the substantially same structure as that shown in FIG. 1. Then, the alkali-soluble resin (N-1), ethylenically unsaturated compound (N-2), sensitizer (N-3), photopolymerization initiator (N-4) and other component mentioned below were mixed in 1,090 parts by weight of cyclohexanone while stirring at room temperature to prepare a coating solution. The thus prepared coating solution was coated onto the surface of the aluminum substrate using a wire bar in a dry coating amount of 2 g/m2, and then dried at 80° C. for 2 minutes by hot air to form a photosensitive layer composed of a photopolymerizable photosensitive composition thereon. Further, a mixed aqueous solution containing 95% by weight of polyvinyl alcohol and 5% by weight of polyvinyl pyrrolidone was applied onto the photosensitive layer using a wire bar in a dry coating amount of 3 g/m2, and then dried at 80° C. for 2 minutes by hot air to form an oxygen-shielding layer thereon, thereby producing a negative-type photosensitive lithographic plate (step A).

(N-1) Alkali-soluble Resin:
 Reaction product obtained by reacting a copolymer of methyl methacrylate (80 mol %) and methacrylic acid (20 mol %) with 3,4-epoxycyclohexylmethylacrylate (60 mol % of carboxyl groups of the methacrylic acid components was reacted; acid number: 60; weight-average molecular weight: 75,000): 45 parts by weight (N-2) Ethylenically Unsaturated Compound:
 Compound (1) shown below: 25 parts by weight
 Compound (2) shown below: 5 parts by weight
 Compound (3) shown below: 25 parts by weight (N-3) Sensitizer:
  Compound (4) shown below: 2 parts by weight

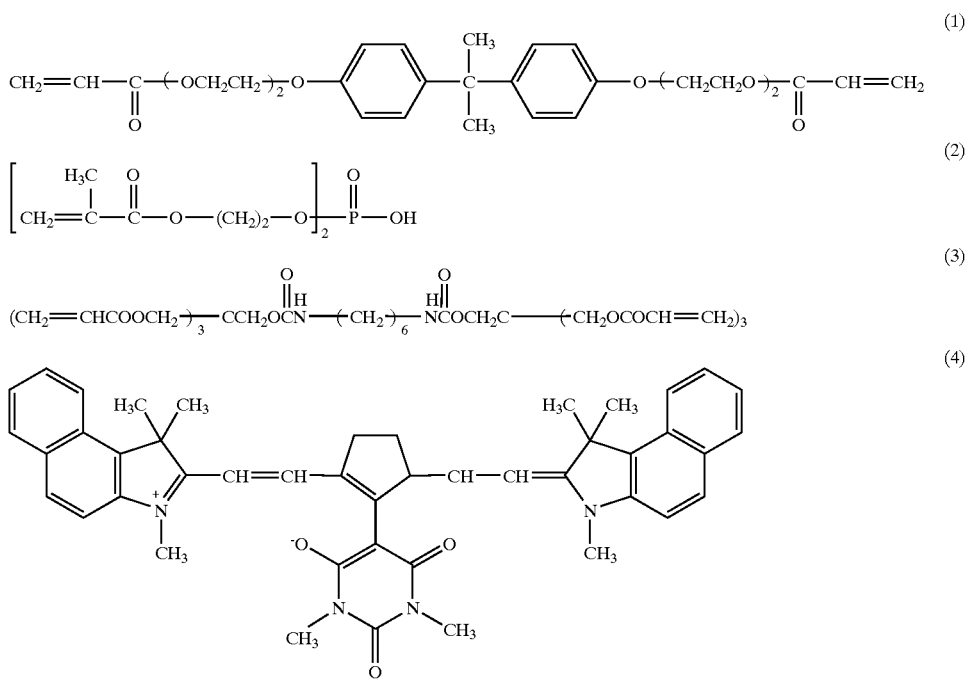

(N-4) Photopolymerization Initiator:
  2-(p-methoxyphenyl)-4,6-bis(trichloromethyl)-s-triazine (C-1): 5 parts by weight
Other Component:
  Pigment (ethyl violet): 5 parts by weight The thus obtained negative-type photosensitive lithographic plate was subjected to scanning line image exposure with various exposure energies by the same method as in Example 4 (step B). Then, the negative-type photosensitive lithographic plate was immersed in a developing solution composed of an aqueous solution containing 0.8% by weight of sodium carbonate and 3% by weight of an anionic surfactant ("Perex NBL" produced by Kao Co., Ltd.) which was supplied from a plate-treating agent-feeding mechanism, at 25° C. for 30 seconds, and then washed with water to produce a negative-type lithographic plate on which the line images were reproduced (step C). It was confirmed that the sensitivity of the obtained negative-type lithographic plate was 100 mJ/cm$^2$ when calculated from minimum exposure energy for reproducing the line images.

Next, 10,000 copies of prints were produced by the same method as in Example 4 (step D). After completion of the printing, the printing ink remaining on the lithographic plate was washed off while keeping the lithographic plate fixed on the plate cylinder of the lithographic printing machine. Then, propylene glycol monomethyl ether as an image removing agent was applied onto the surface of the lithographic plate by a roller of an image removing mechanism, and the surface of images formed on the lithographic plate was brushed and wiped off with gauze to remove the images therefrom. Further, the lithographic plate was washed with water to regenerate the aluminum substrate (step E). Thereafter, the coating solution composed of the same photopolymerizable photosensitive composition as used above was coated again on the thus regenerated aluminum substrate by a roller of a photosensitive composition solution coating mechanism, and then heat-dried to form a photosensitive layer thereon, thereby producing a negative-type photosensitive lithographic plate (step A). Successively, using the exposure mechanism, the photosensitive layer was subjected to scanning line image exposure by a laser source (step B), and the same alkali developing solution as used above was supplied onto the photosensitive layer by a roller of a development mechanism to subject the photosensitive layer to development treatment, thereby producing a negative-type lithographic plate having negative images thereon.

Next, the thus obtained negative-type lithographic plate was used to produce 10,000 copies of prints by the same method as above. When the negative-type lithographic plate was visually observed to examine the adhesion of ink onto non-image portions thereof due to line afterimages of the previous photosensitive layer, it was confirmed that no ink adhesion was caused on the non-image portions.

As described above, in accordance with the present invention, the following effects and advantages can be attained. Namely, according to the present invention, there is provided a regenerative plate making and printing process and plate making and printing apparatus which can further improve the conventional on-printing machine plate making methods, can show a considerably excellent working efficiency, can prevent the occurrence of stains upon printing, and can stably produce high-quality images.

Further, according to the present invention, there is provided a regenerative on-printing machine plate making and printing apparatus which is improved such that mists are prevented from being generated in the respective plate making, printing and regeneration steps, and inappropriate illuminating light is blocked therefrom, thereby enabling various photosensitive plate materials to be applicable thereto. Therefore, such a regenerative on-printing machine plate making and printing apparatus can considerably contribute to enhancement of the working efficiency.

Industrial Applicability

As discussed above, the regenerative plate making and printing process and plate making and printing apparatus of the present invention can considerably improve the working efficiency of a printing system requiring a separate developing step independent of a printing step and, therefore, is useful to produce much higher-quality prints and suitable for regenerative on-printing machine plate making and printing procedures.

What is claimed is:

1. A regenerative off-press plate making and printing process using a laser plate making and regenerating apparatus (I) including a plate fixing drum, a plate material-feeding mechanism, an exposure mechanism, a plate-treating agent-feeding mechanism and a plate material-removing mechanism, and a printing machine (II), the process comprising the steps of:

(A) supplying a photosensitive plate material onto a substrate fixed on the plate fixing drum from the plate material-feeding mechanism to prepare a photosensitive lithographic plate;

(B) exposing the thus prepared photosensitive lithographic plate to image light by the exposure mechanism;

(C) supplying an alkali development solution onto the thus image-exposed photosensitive lithographic plate from the plate-treating-agent-feeding mechanism, followed by, if required, applying physical stimulus thereto, to obtain a lithographic plate having images thereon wherein conditions of the images formed on the photosensitive layer of the photosensitive lithographic plate are detected to control developing conditions on the basis of detected data, the data detected and used for controlling the developing conditions being those satisfying such a condition that a value obtained by dividing a reflection absorbance A by a reflection absorbance B is not less than 0.5, wherein A represents a reflection absorbance obtained by subtracting a reflection absorbance of the substrate from the reflection absorbance of the image portions; and B represents a reflection absorbance obtained by subtracting the reflection absorbance of the substrate from the reflection absorbance of the non-image portions;

(D) after removing the lithographic plate from the plate fixing drum, fitting the lithographic plate on the printing machine to conduct printing; and (E) after removing the lithographic plate used for printing from the printing machine and then fitting the lithographic printing plate on the plate fixing drum again, removing image portions formed on the lithographic plate by the plate material-removing mechanism using an aqueous alkali solution as a release agent, to regenerate the substrate.

2. A process according to claim 1, wherein in the photosensitive layer-coating step (A), the photosensitive plate material supplied and coated onto the substrate is heat-dried by irradiating near-infrared light having a light intensity density of not more than 100 Wcm-2 thereto for a period of not less than 0.1 second.

3. A process according to claim 1, wherein in the exposure step (B), the light exposure is conducted using a laser beam at a scanning speed of not less than 0.1 m/in.

4. A process according to claim 1, wherein in step (c) the alkali development solution contains a surfactant.

5. A process according to claim 1, wherein the release agent contains a water-soluble organic solvent.

6. A process according to claim 1, wherein the release agent contains a surfactant.

7. A process according to claim 1, wherein the photosensitive plate material is a positive-type photosensitive composition containing:

(P-1) a light-heat converting material capable of converting light absorbed from a light source for image exposure into heat; and (P-2) an alkali-soluble resin.

8. A process according to claim 7, wherein the light-heat converting material (P-1) is a light-absorbing dye having an absorption band for a part or whole of a wavelength region of 600 to 1,300 nm.

9. A process according to claim 7, wherein the light-absorbing dye as the light-heat converting material (P-1) is a cyanine-based dye having heterocyclic rings bonded to each other through a polymethine chain.

10. A process according to claim 7, wherein the alkali-soluble resin (P-2) is a resin having a phenolic hydroxyl group.

11. A process according to claim 7, wherein the laser source is a light source capable of emitting light having a wavelength of 600 to 1,300 nm.

12. A process according to claim 1, wherein the photosensitive plate material is a photopolymerizable composition containing:

(N-1) a high-molecular binder;

(N-2) an ethylenically unsaturated compound;

(N-3) a sensitizer; and (N-4) a photopolymerizable initiator, wherein negative images are produced at a photosensitive layer formed from the photopolymerizable composition when being subjected to scanning exposure using a laser-source-emitting light having a wavelength of 400 to 1,300 nm and then development treatment.

13. A process according to claim 12, wherein said substrate is an aluminum substrate having a peel strength of not more than 500 g/cm, in case of bonding the gummed tape to the surface of the substrate.

14. A process according to claim 13, wherein the aluminum substrate has on a surface thereof, a thin film layer composed of a hydrophilic polymer.

15. A process according to claim 12, wherein the sensitizer (N-3) is a light-absorbing dye having an absorption maximum at a blue-ultraviolet region of 400 to 420 nm, and the laser source is a light source capable of emitting light having a wavelength of 400 to 420 nm.

16. A process according to claim 12, wherein the sensitizer (N-3) is a light-absorbing dye having an absorption maximum at a near-infrared region of 600 to 1,300 nm, and the laser source is a light source capable of emitting light having a wavelength of 600 to 1,300 nm.

* * * * *